United States Patent
Yamashita

(10) Patent No.: US 12,302,019 B2
(45) Date of Patent: May 13, 2025

(54) IMAGING DEVICE

(71) Applicant: SONY SEMICONDUCTOR SOLUTIONS CORPORATION, Kanagawa (JP)

(72) Inventor: Hirofumi Yamashita, Kanagawa (JP)

(73) Assignee: Sony Semiconductor Solutions Corporation, Kanagawa (JP)

( * ) Notice: Subject to any disclaimer, the term of this patent is extended or adjusted under 35 U.S.C. 154(b) by 373 days.

(21) Appl. No.: 17/291,470

(22) PCT Filed: Nov. 11, 2019

(86) PCT No.: PCT/JP2019/044120
§ 371 (c)(1),
(2) Date: May 5, 2021

(87) PCT Pub. No.: WO2020/100806
PCT Pub. Date: May 22, 2020

(65) Prior Publication Data
US 2022/0006968 A1    Jan. 6, 2022

(30) Foreign Application Priority Data

Nov. 16, 2018 (JP) .................. 2018-215381
Sep. 19, 2019 (JP) .................. 2019-170593

(51) Int. Cl.
*H04N 25/75*   (2023.01)
*H01L 27/146*  (2006.01)
*H04N 25/77*   (2023.01)

(52) U.S. Cl.
CPC ....... *H04N 25/75* (2023.01); *H01L 27/14612* (2013.01); *H01L 27/14636* (2013.01); *H01L 27/14643* (2013.01); *H04N 25/77* (2023.01)

(58) Field of Classification Search
None
See application file for complete search history.

(56) References Cited

U.S. PATENT DOCUMENTS 6,635,857 B1 * 10/2003 Kindt .................. H04N 25/616
                                                           348/E3.019
9,961,292 B1 *  5/2018 Deng .................. H03F 1/0261
(Continued)

FOREIGN PATENT DOCUMENTS

CN    102124566 A    7/2011
CN    103137640 A    6/2013
(Continued)

OTHER PUBLICATIONS

International Search Report and Written Opinion prepared by the European Patent Office on Jan. 28, 2020, for International Application No. PCT/JP2019/044120.

*Primary Examiner* — Quan Pham
(74) *Attorney, Agent, or Firm* — SHERIDAN ROSS P.C.

(57) ABSTRACT

An imaging device includes a first section including a first semiconductor substrate, at least one first photoelectric conversion region, a first floating diffusion, a first bonding portion, a first wiring electrically connected between the first floating diffusion and the first bonding portion, at least one second photoelectric conversion region, a second floating diffusion coupled to the at least one second photoelectric conversion region, a second bonding portion, a second wiring electrically connected between the second floating diffusion and the second bonding portion, a first region coupled to a node that receives a reference voltage, and a third wiring coupled to the first region at a location that is between the first wiring and the second wiring. The imaging device includes a second section bonded to the first section via the first and second bonding portions and including readout circuitry coupled to the first bonding portion and the second bonding portion.

20 Claims, 36 Drawing Sheets

(56) References Cited

U.S. PATENT DOCUMENTS

| | | | |
|---|---|---|---|
| 2010/0060764 A1 | 3/2010 | McCarten et al. | |
| 2013/0107091 A1* | 5/2013 | Teshima | H04N 25/75 348/300 |
| 2014/0042298 A1* | 2/2014 | Wan | H01L 27/1469 257/E31.127 |
| 2015/0115389 A1* | 4/2015 | Chuang | H01L 27/1464 257/774 |
| 2015/0194457 A1* | 7/2015 | Soda | H01L 27/14634 716/102 |
| 2016/0020235 A1 | 1/2016 | Yamashita | |
| 2017/0040371 A1* | 2/2017 | Izuhara | H01L 27/14618 |
| 2018/0097030 A1 | 4/2018 | Mmanabe et al. | |
| 2018/0308895 A1* | 10/2018 | Kim | H01L 27/14806 |
| 2018/0376093 A1 | 12/2018 | Tskuda et al. | |

FOREIGN PATENT DOCUMENTS

| | | | |
|---|---|---|---|
| CN | 103579263 A | 2/2014 | |
| CN | 105940493 A | 9/2016 | |
| CN | 107895731 A | 4/2018 | |
| CN | 108370426 A | 8/2018 | |
| EP | 330666 | 4/2018 | |
| JP | 2004172228 A | 6/2004 | |
| JP | 2008252695 A | 10/2008 | |
| JP | 2010-219339 | 9/2010 | |
| JP | 2011071958 A | 4/2011 | |
| JP | 2012015400 A | 1/2012 | |
| JP | 2012216585 A | 11/2012 | |
| JP | 2013232647 A | 11/2013 | |
| JP | 2014-022561 | 2/2014 | |
| JP | 2015135938 A | 7/2015 | |
| JP | 2016171455 A | 9/2016 | |
| JP | 2017-117828 | 6/2017 | |
| KR | 20110050670 A | 5/2011 | |
| KR | 20130121647 A | 11/2013 | |
| KR | 20180097522 A | 8/2018 | |
| TW | 201834229 A | 9/2018 | |
| WO | WO 2017/110482 | 6/2017 | |
| WO | WO-2018186194 A1 * | 10/2018 | H01L 21/02 |
| WO | WO-2018186197 A1 | 10/2018 | |

* cited by examiner

[Fig. 1]
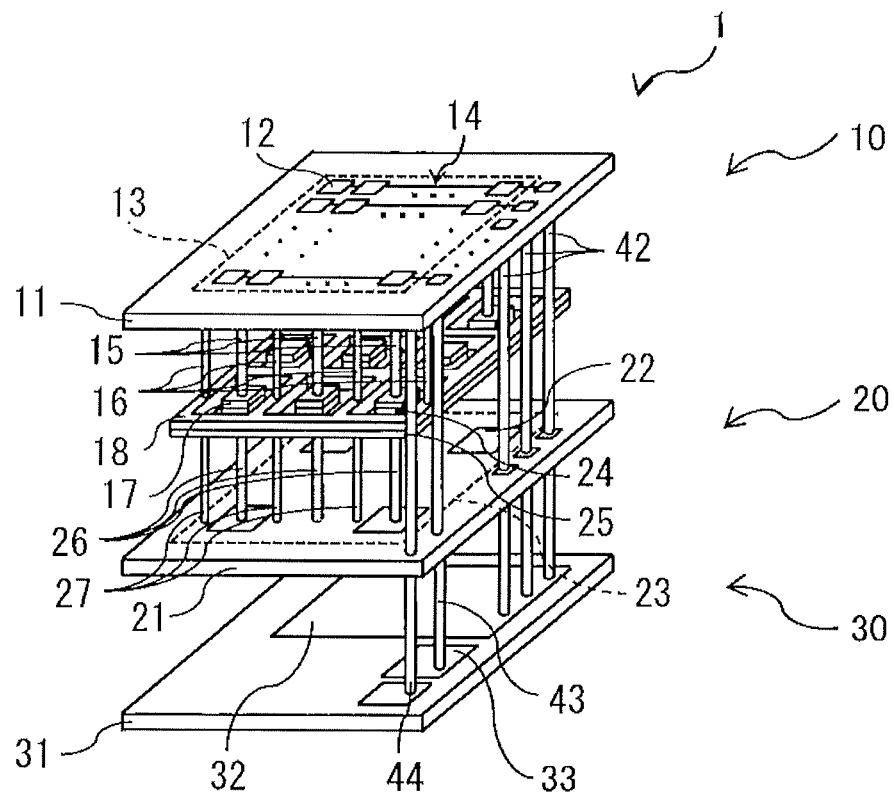
[Fig. 2]
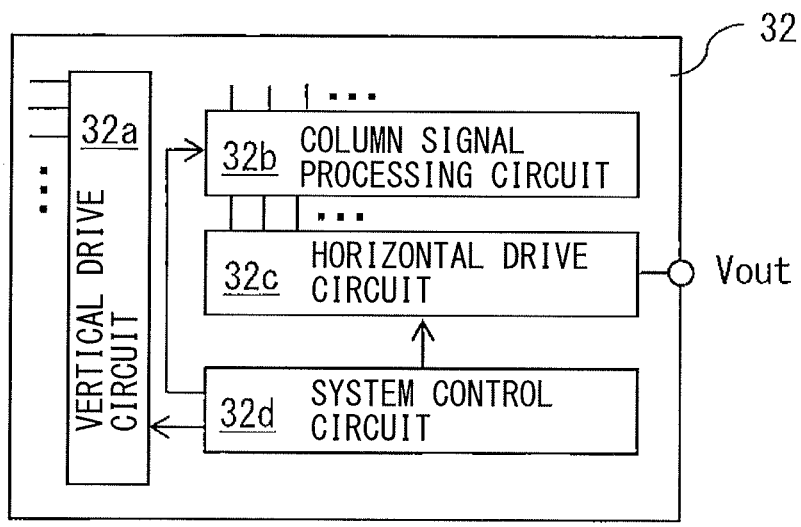

[Fig. 3]
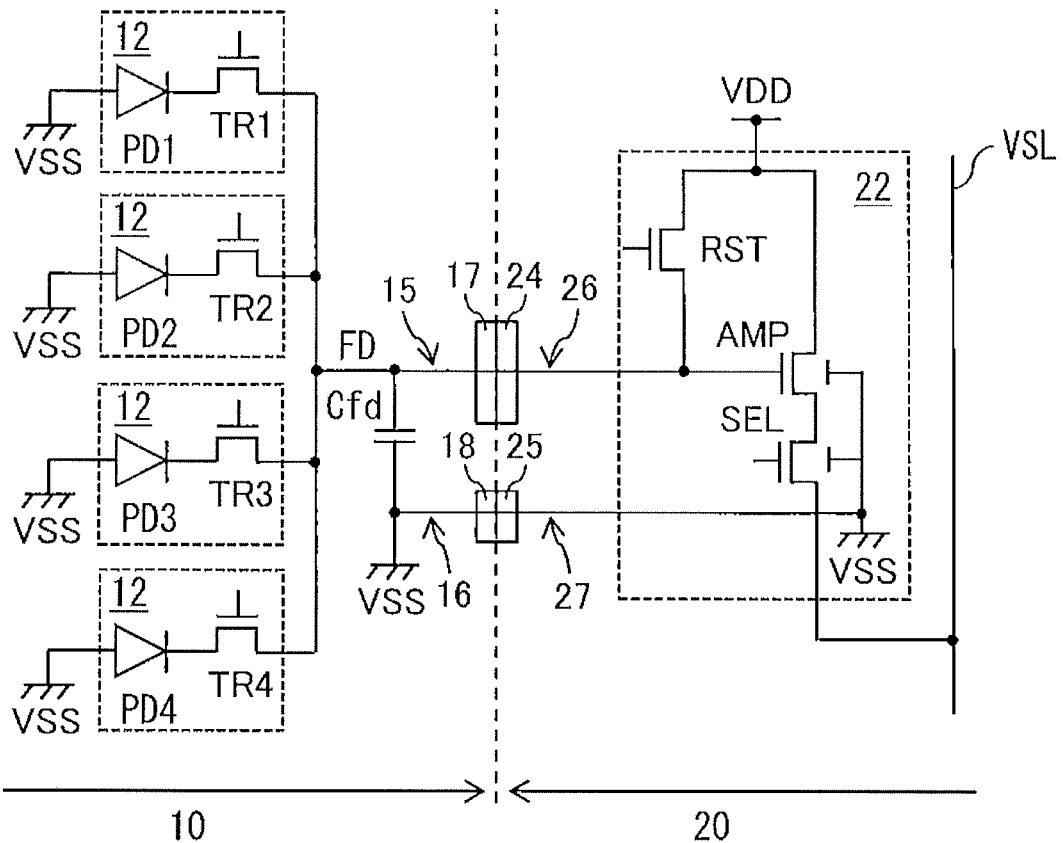
[Fig. 4]
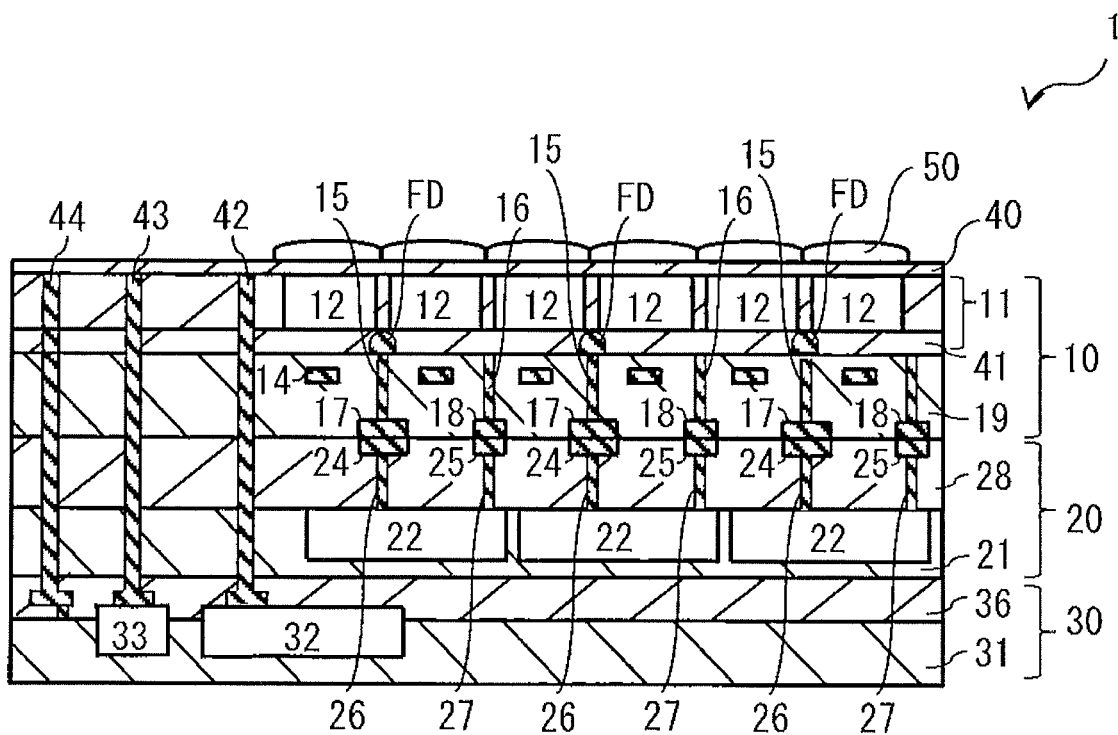

[Fig. 5]
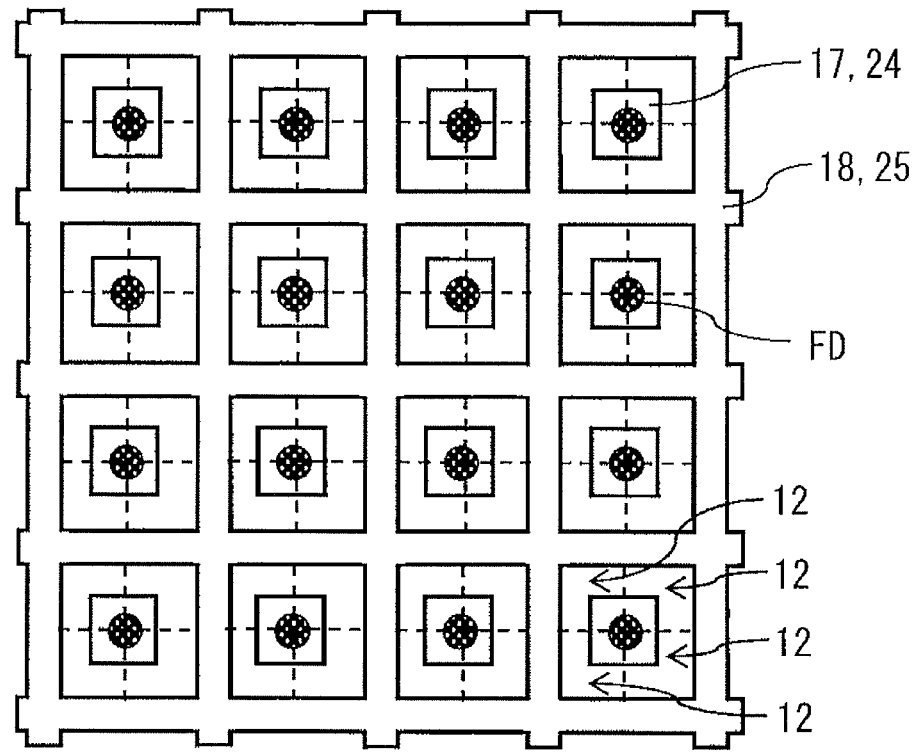
[Fig. 6A]
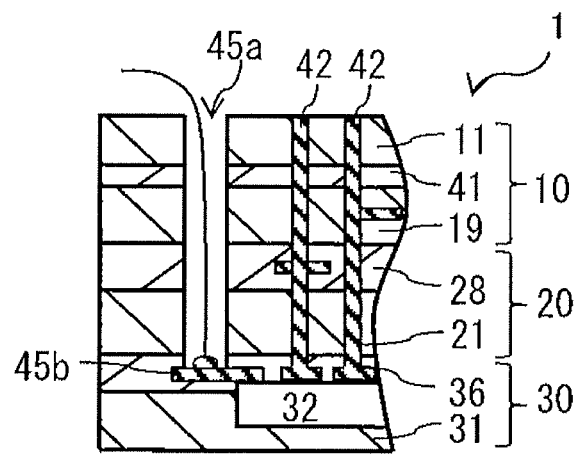

[Fig. 6B]
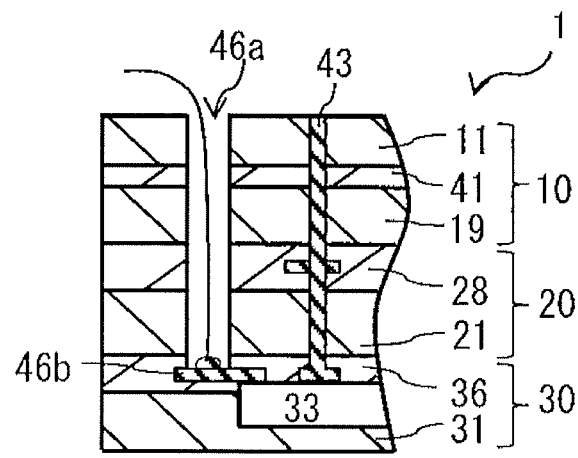
[Fig. 6C]
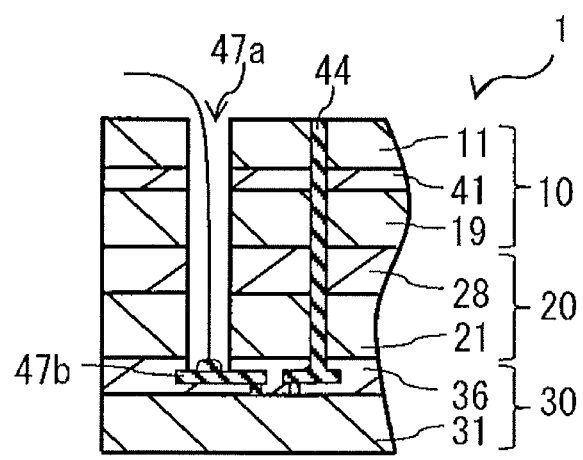
[Fig. 7A]
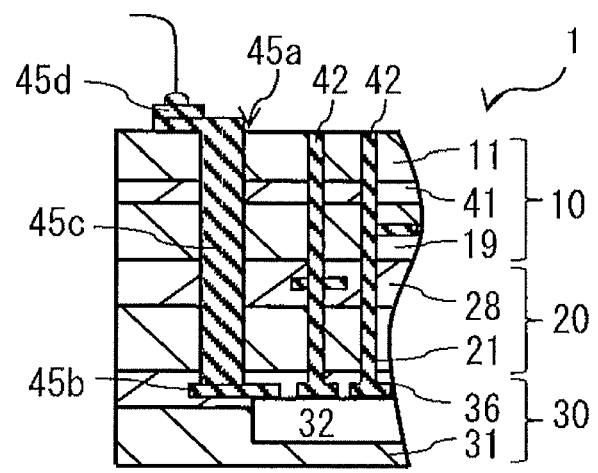

[Fig. 7B]
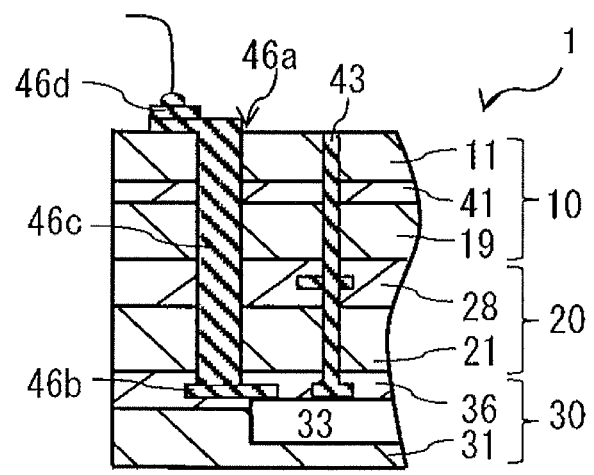
[Fig. 7C]
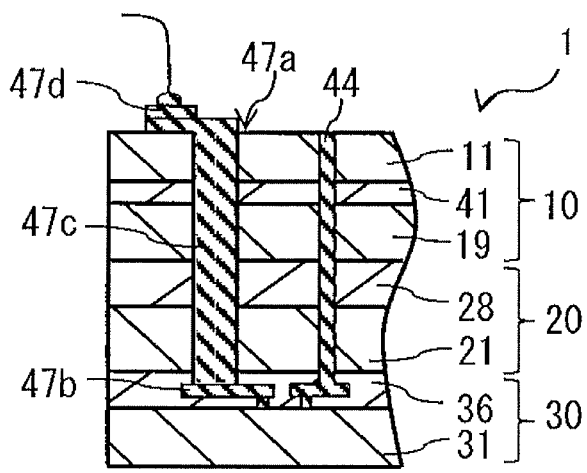

[Fig. 8]
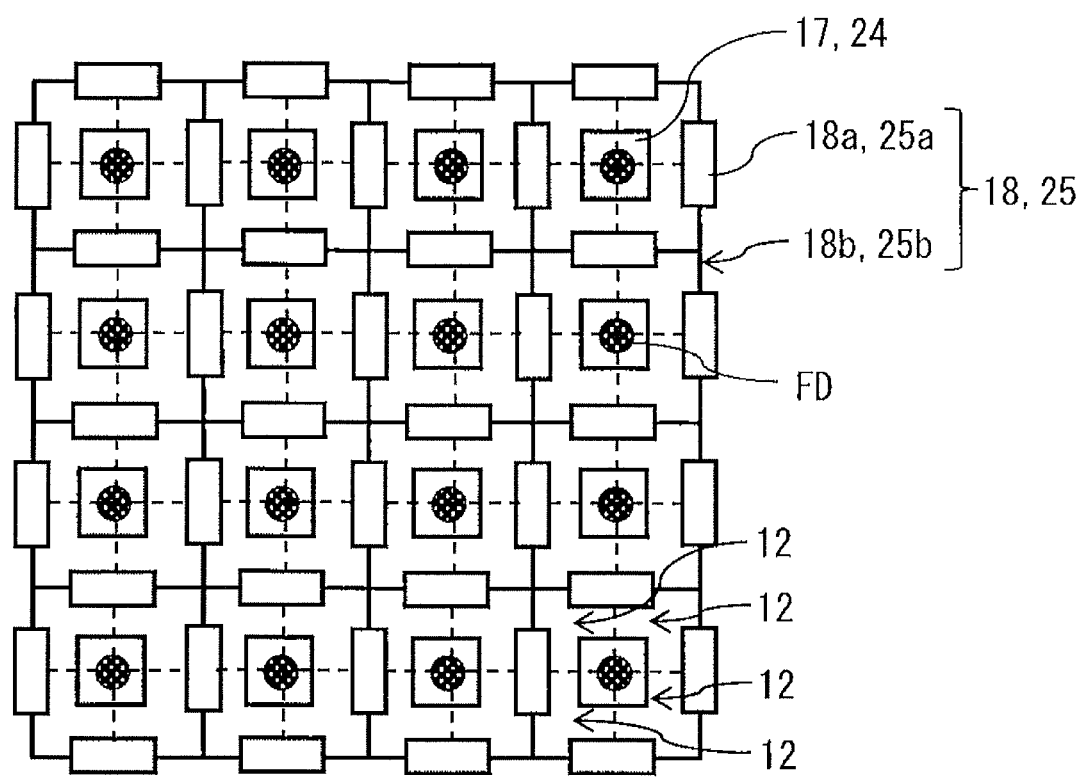

[Fig. 9]
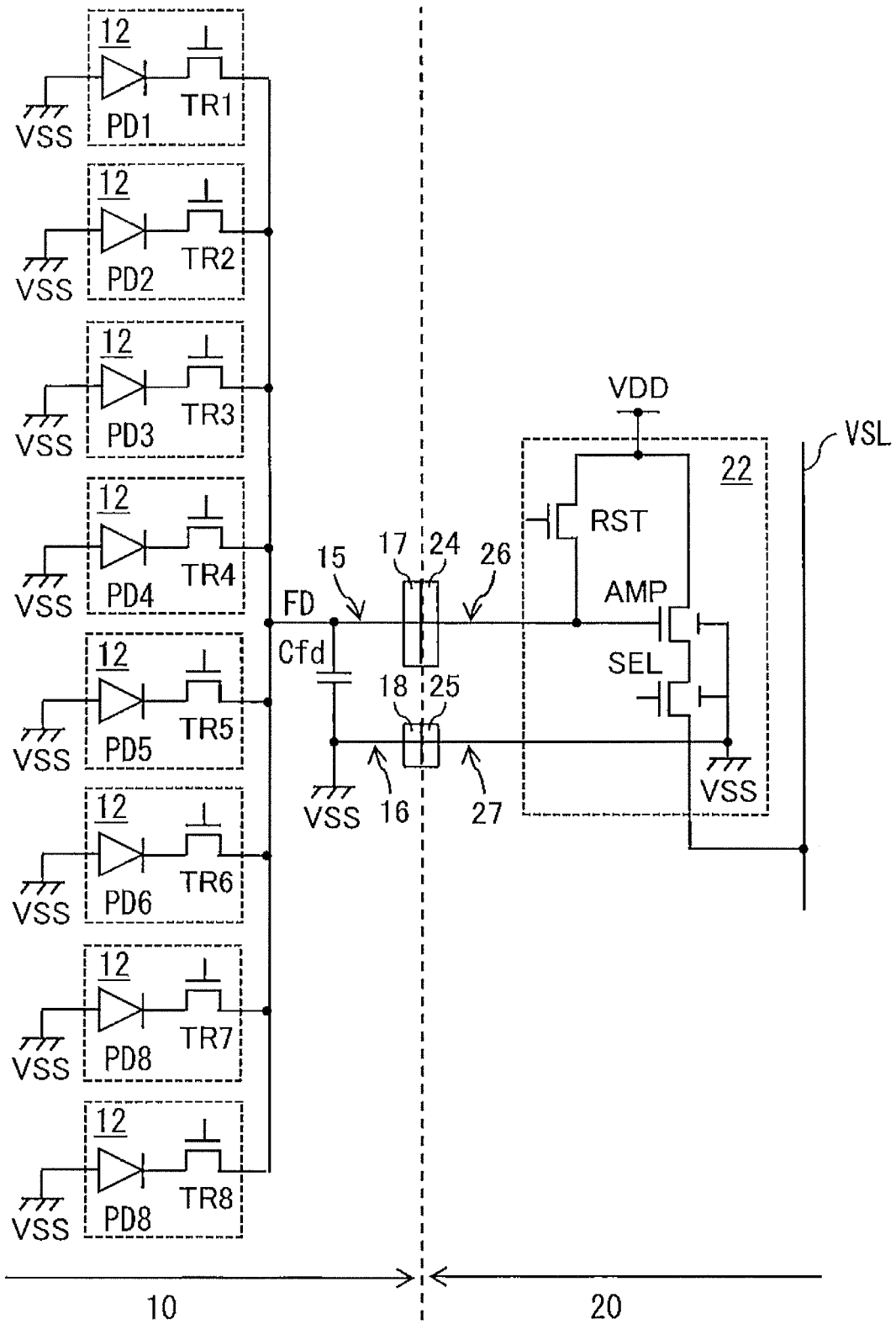

[Fig. 10]
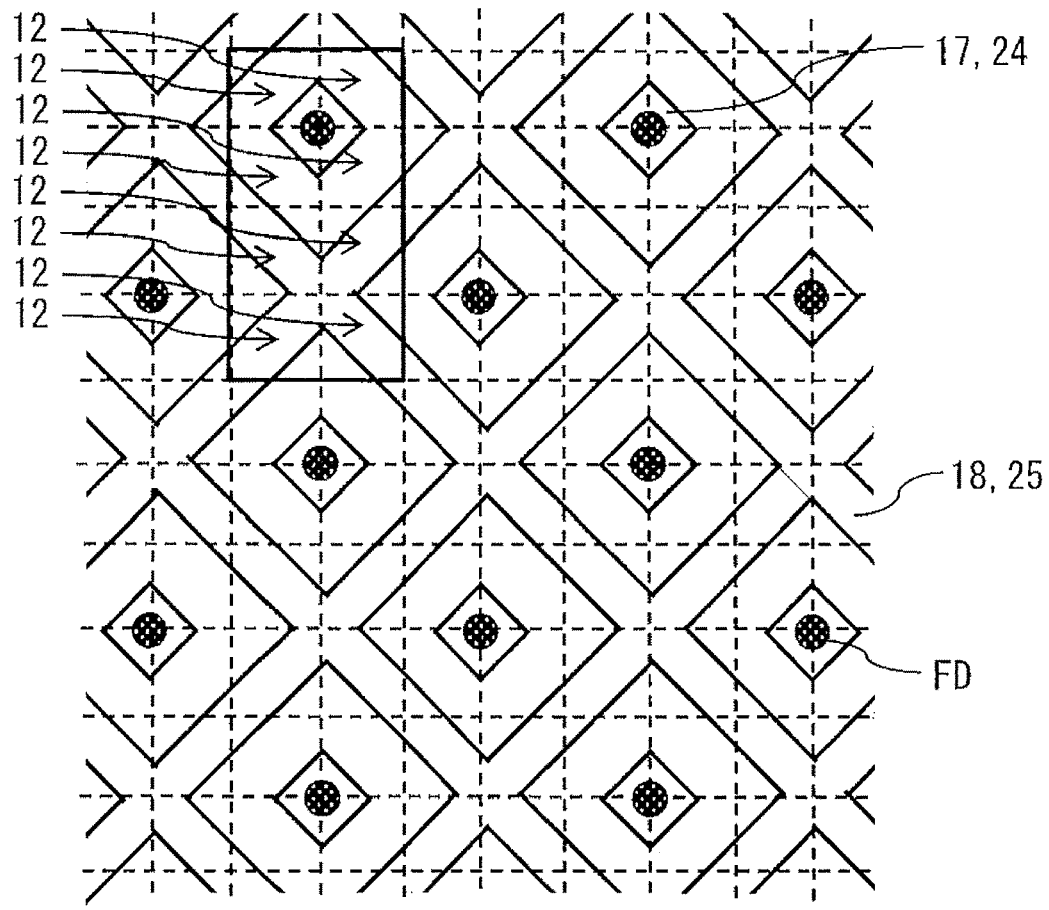
[Fig. 11]
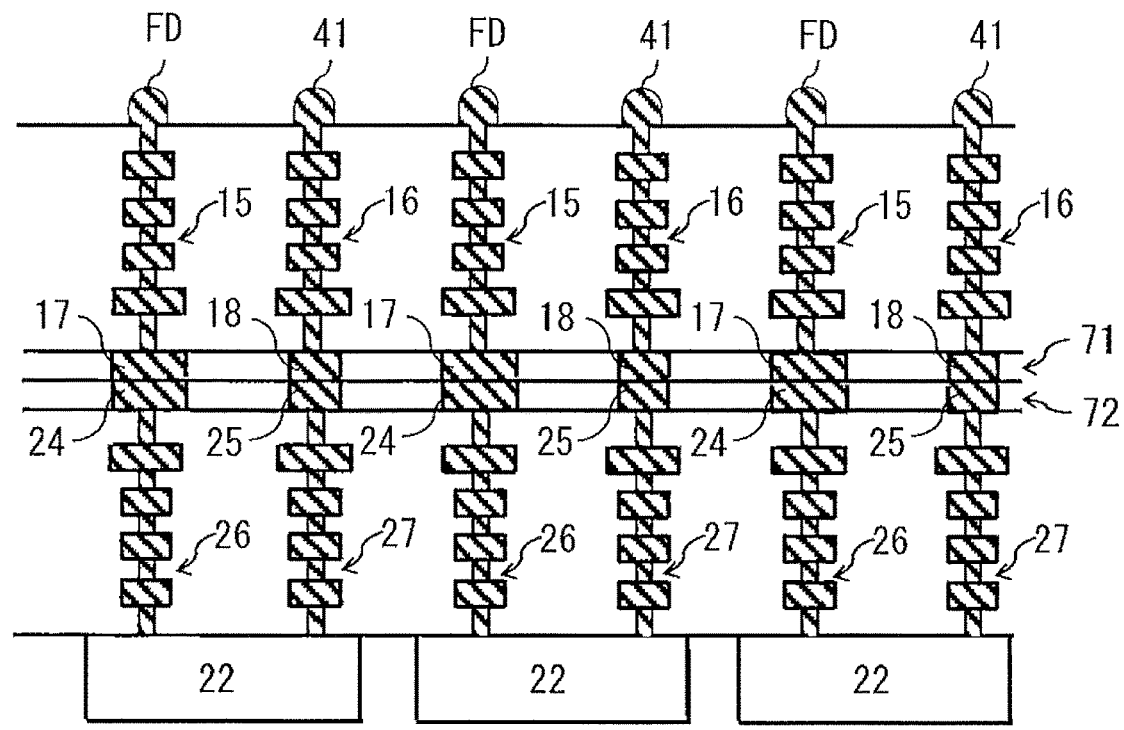

[Fig. 12]
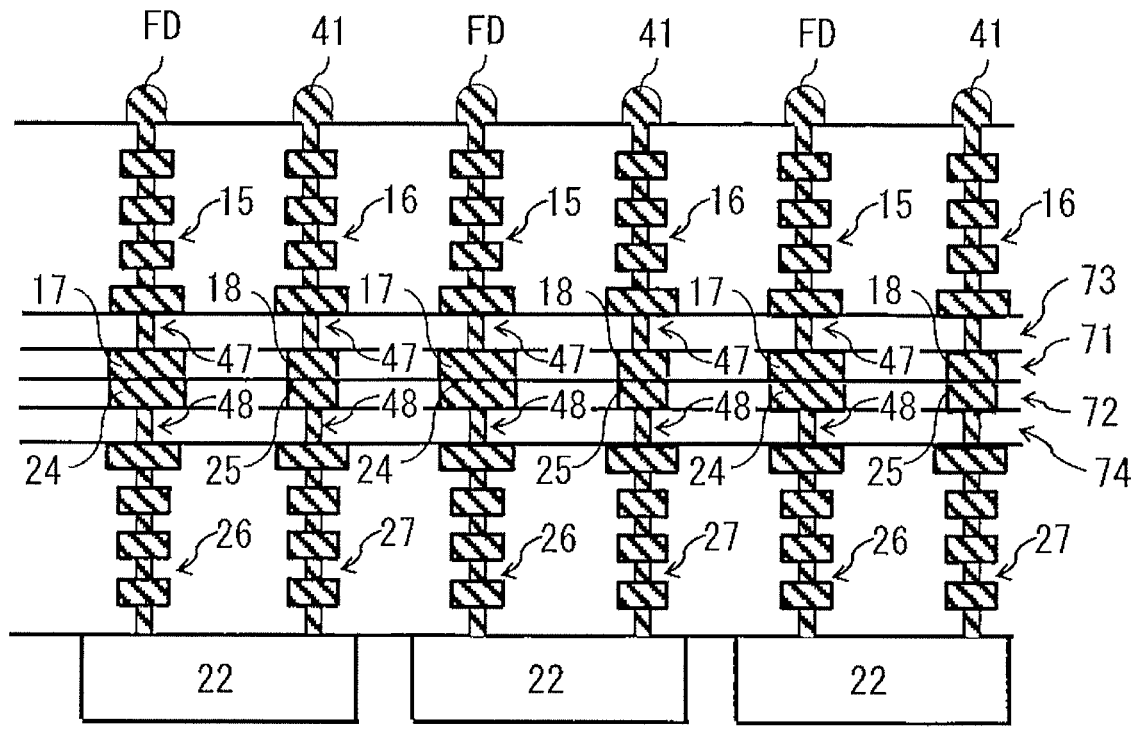
[Fig. 13]
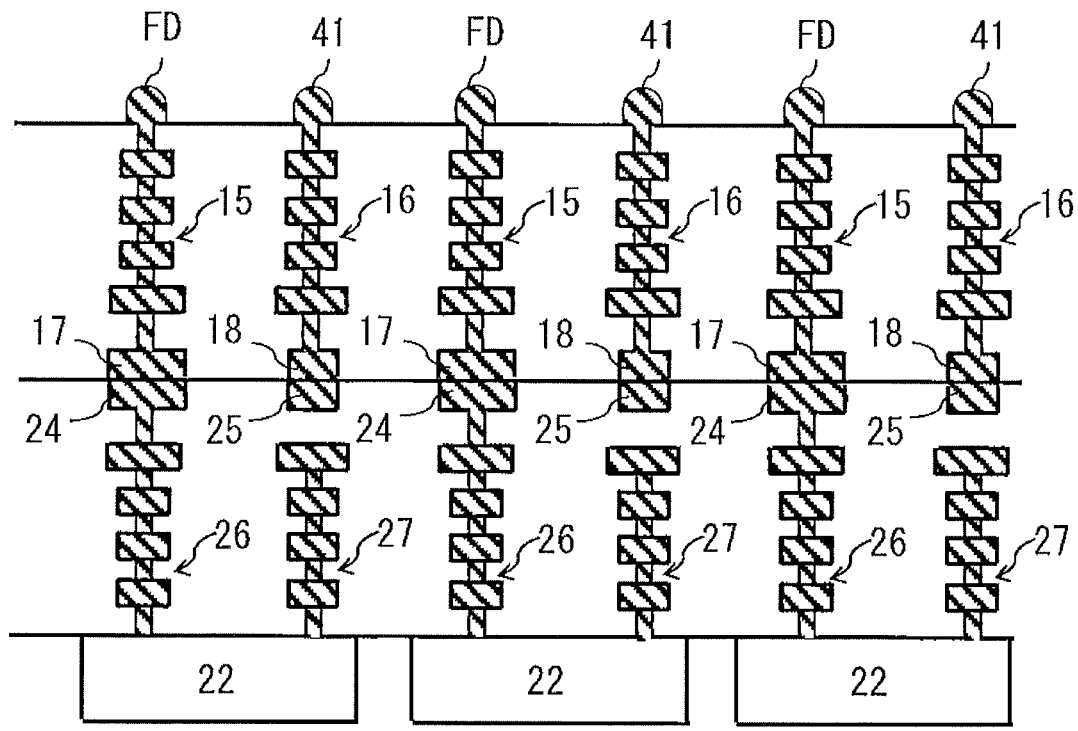

[Fig. 14]
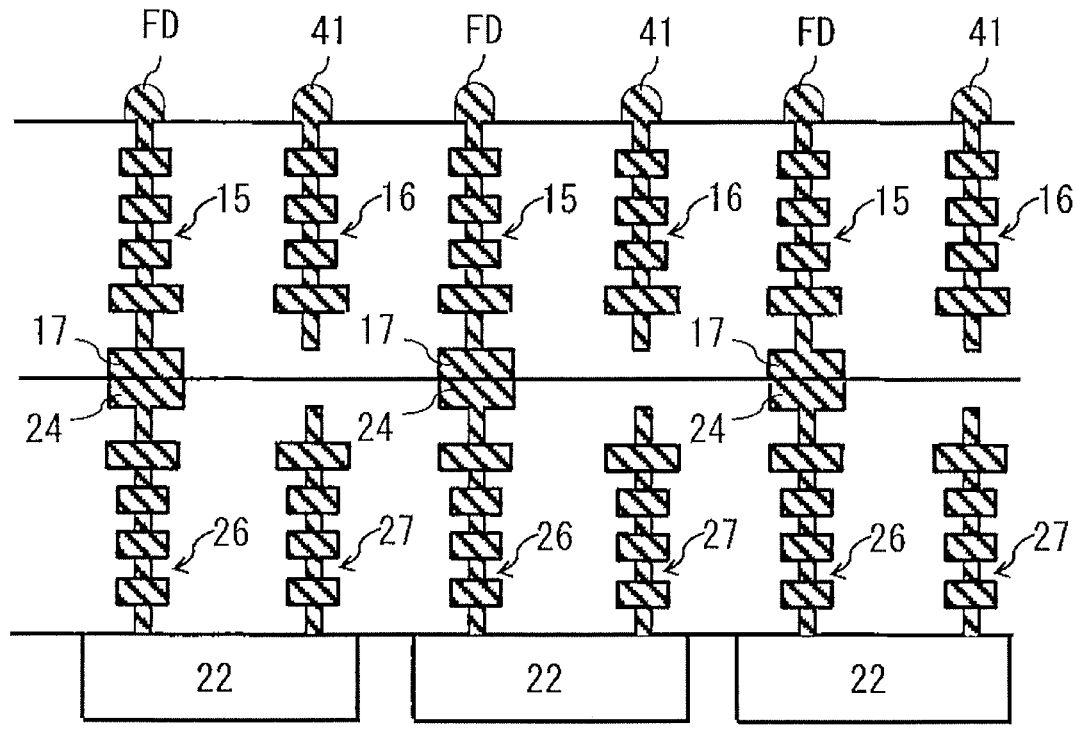
[Fig. 15]
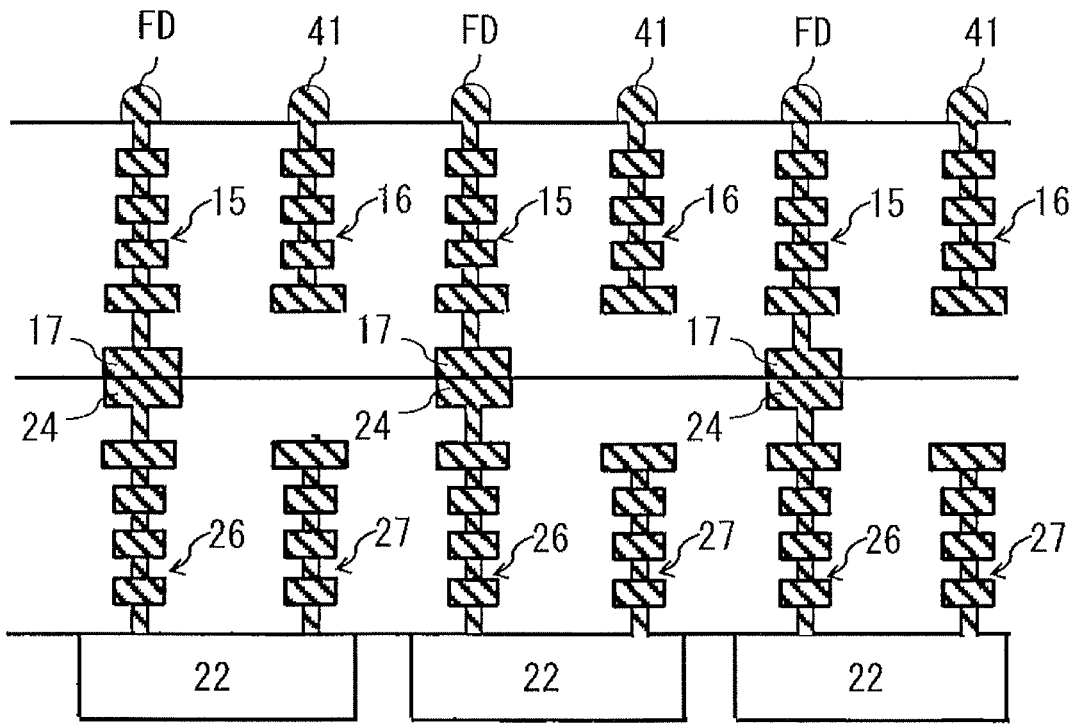

[Fig. 16]
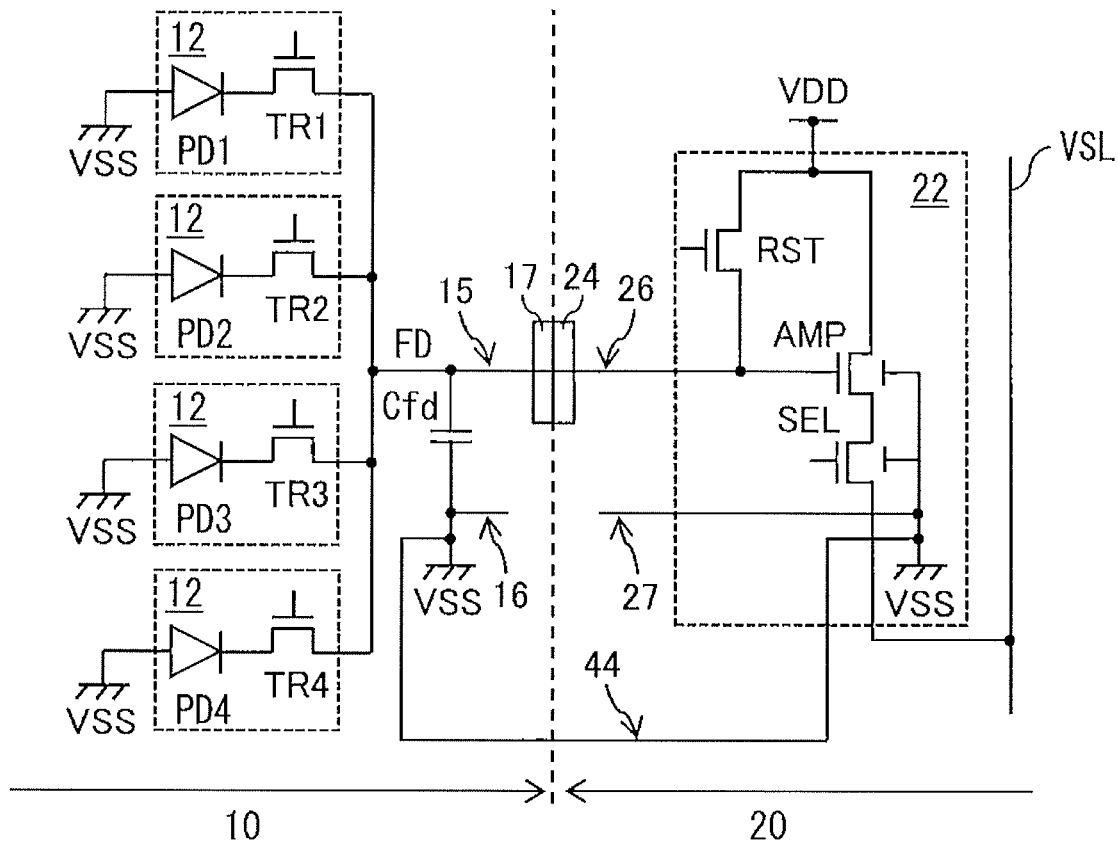
[Fig. 17]
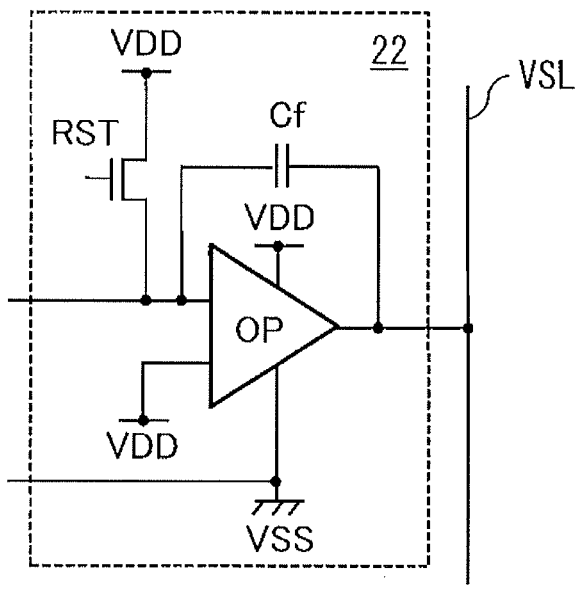

[Fig. 18]
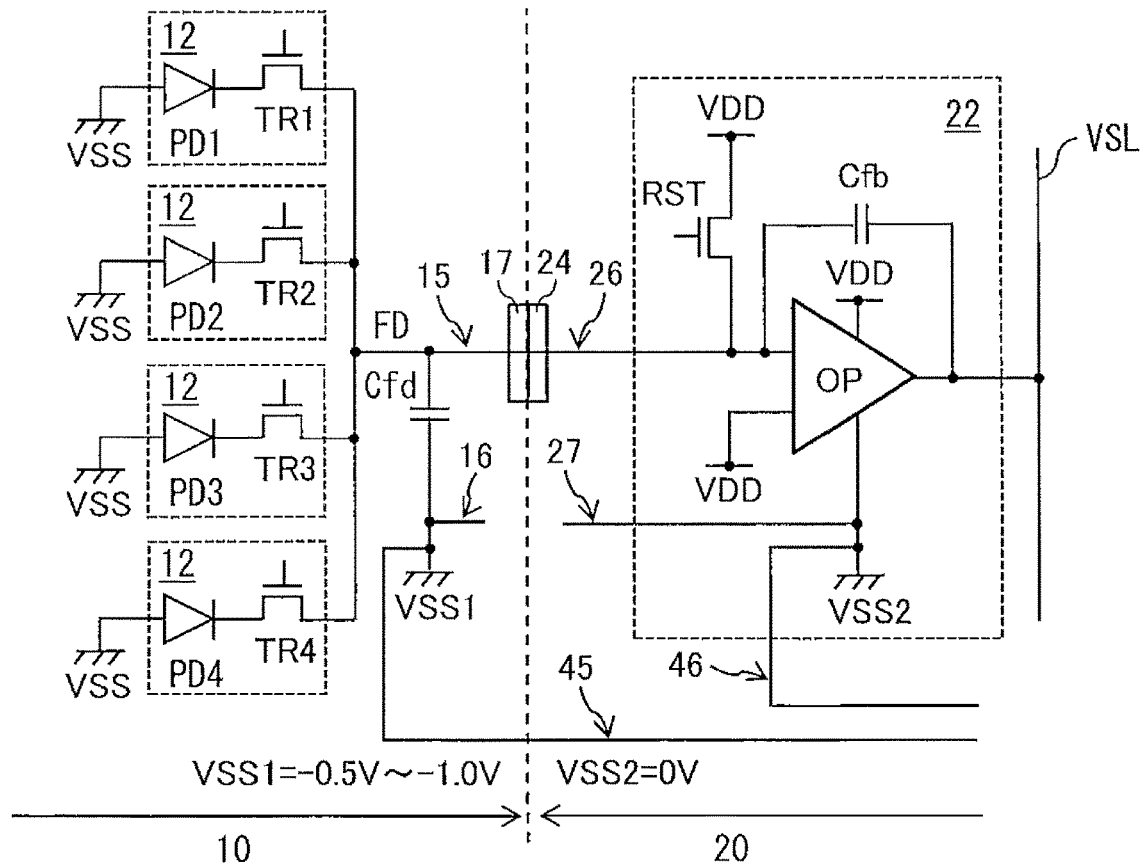
[Fig. 19]
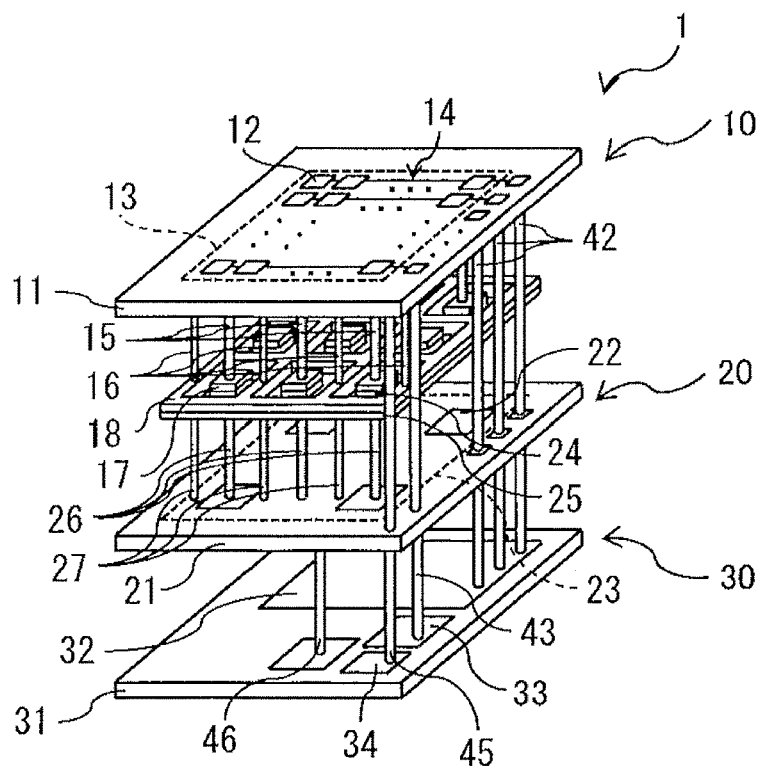

[Fig. 20]
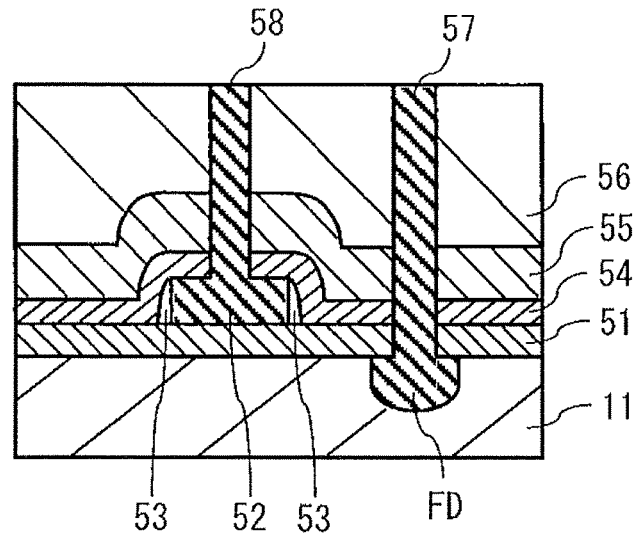
[Fig. 21]
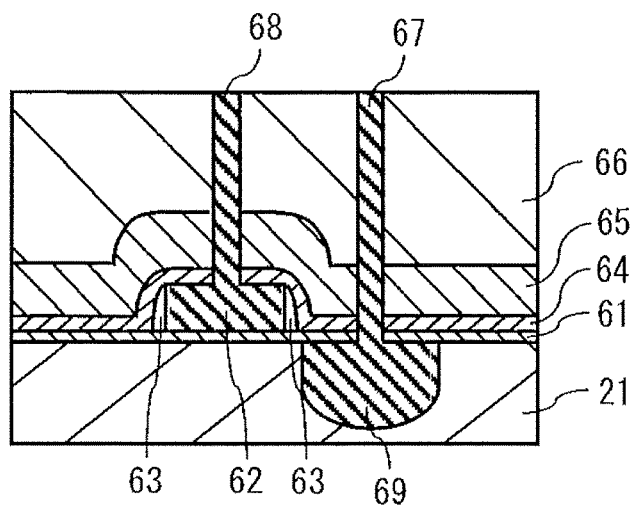
[Fig. 22]
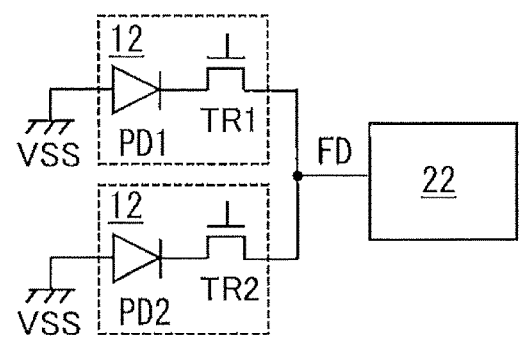

[Fig. 23]
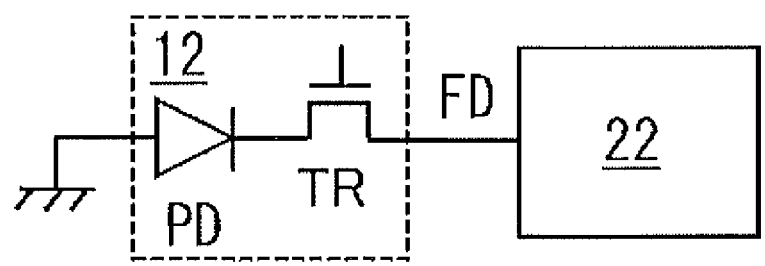
[Fig. 24]
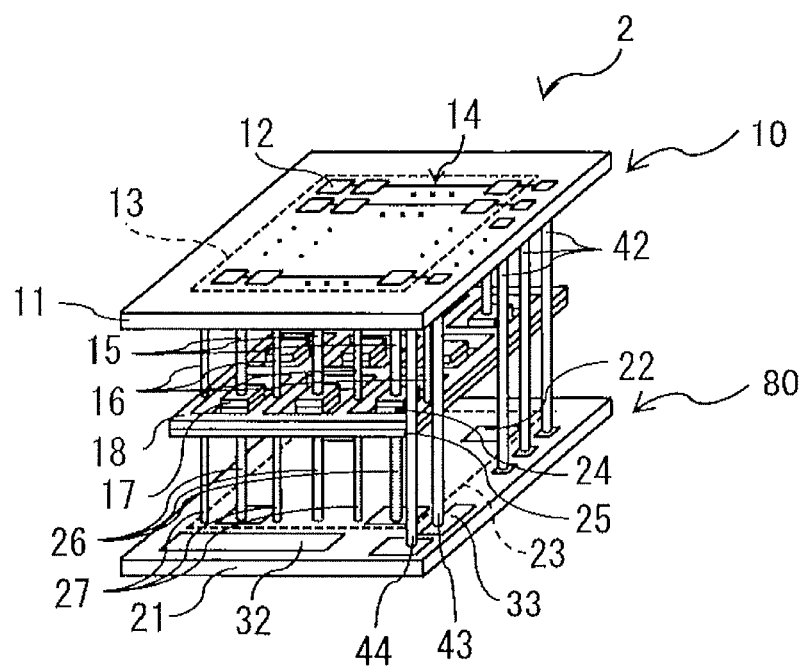

[Fig. 25]
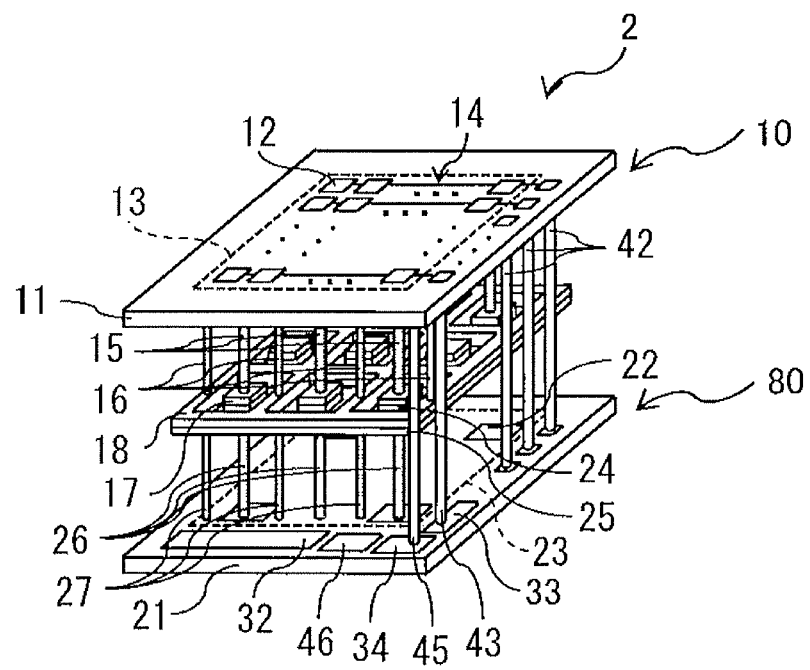

[Fig. 26]
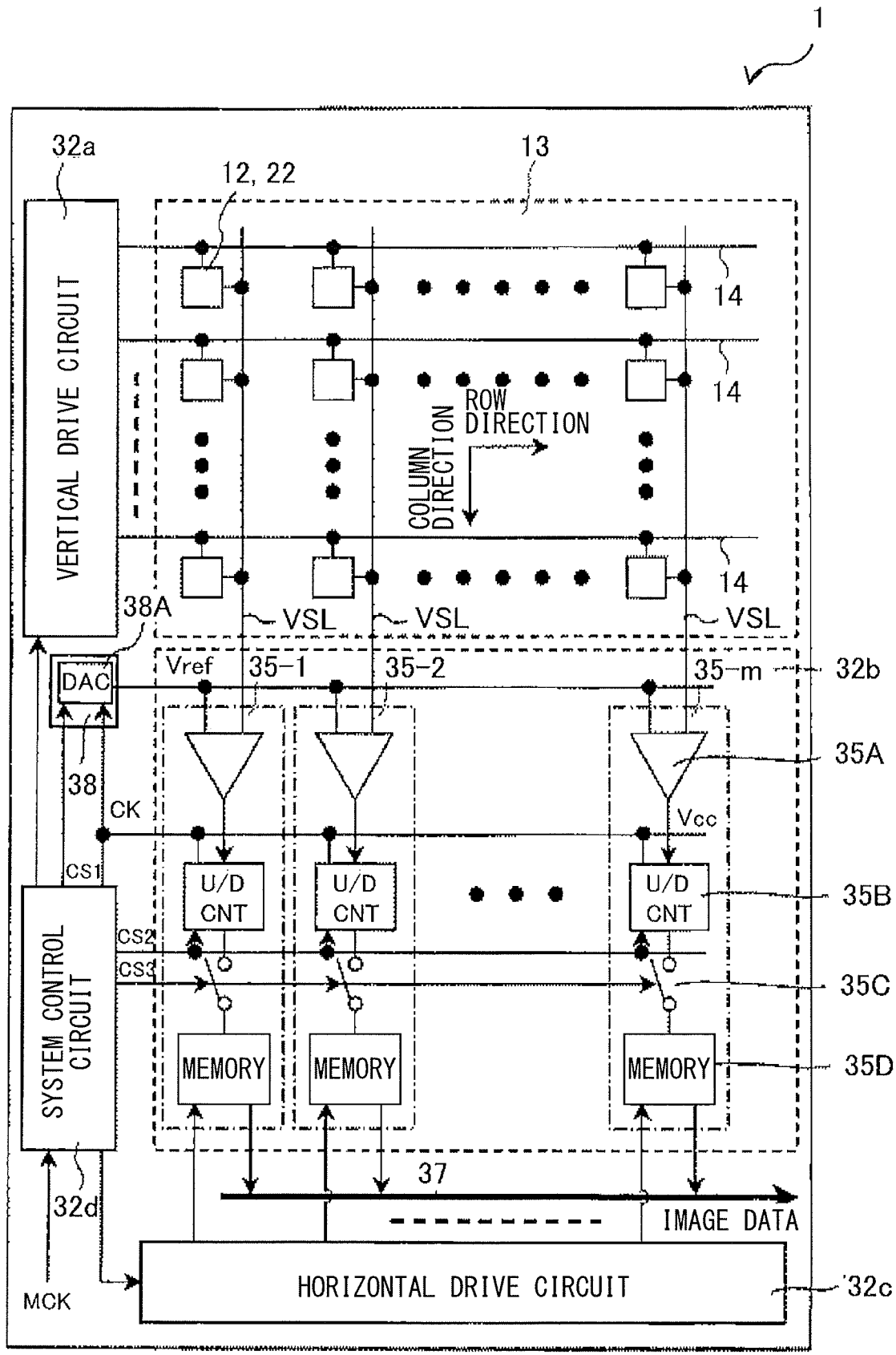

[Fig. 27]
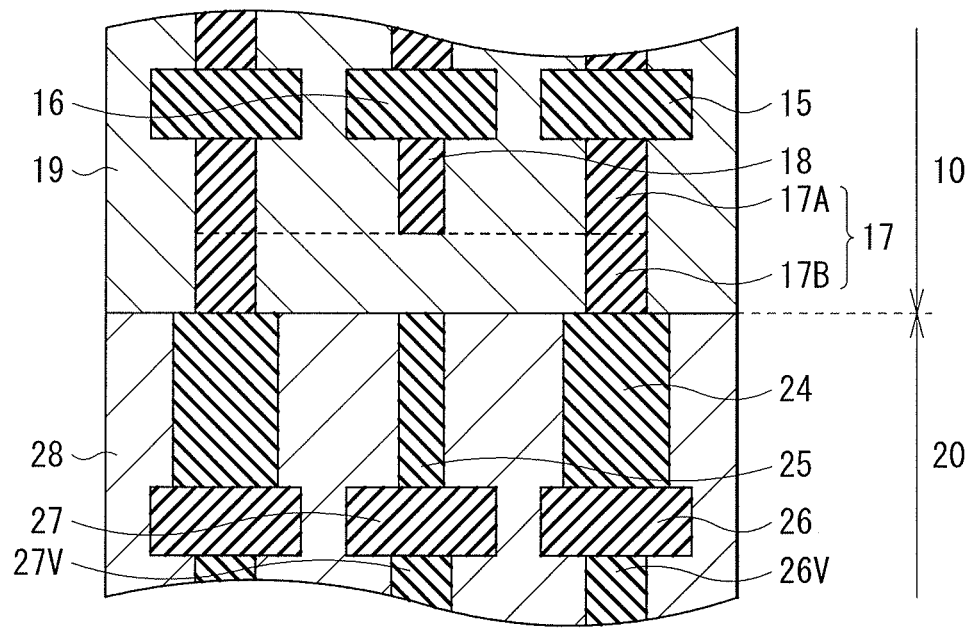
[Fig. 28]
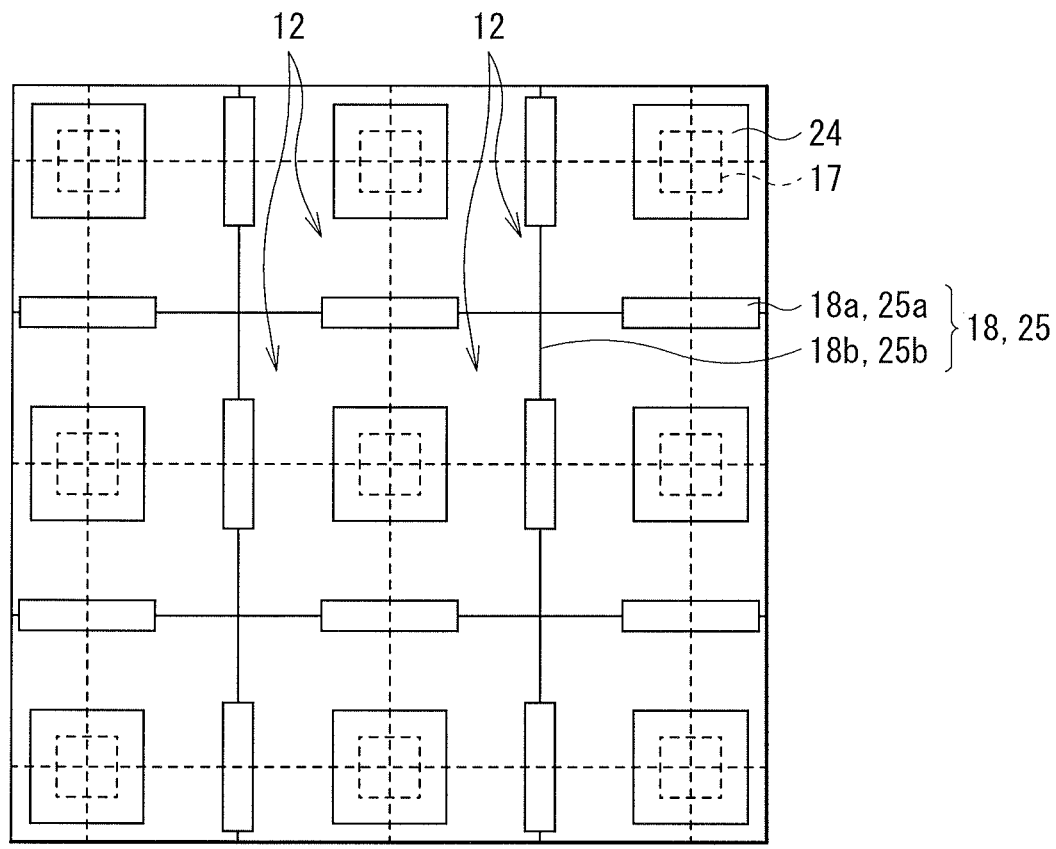

[Fig. 29]
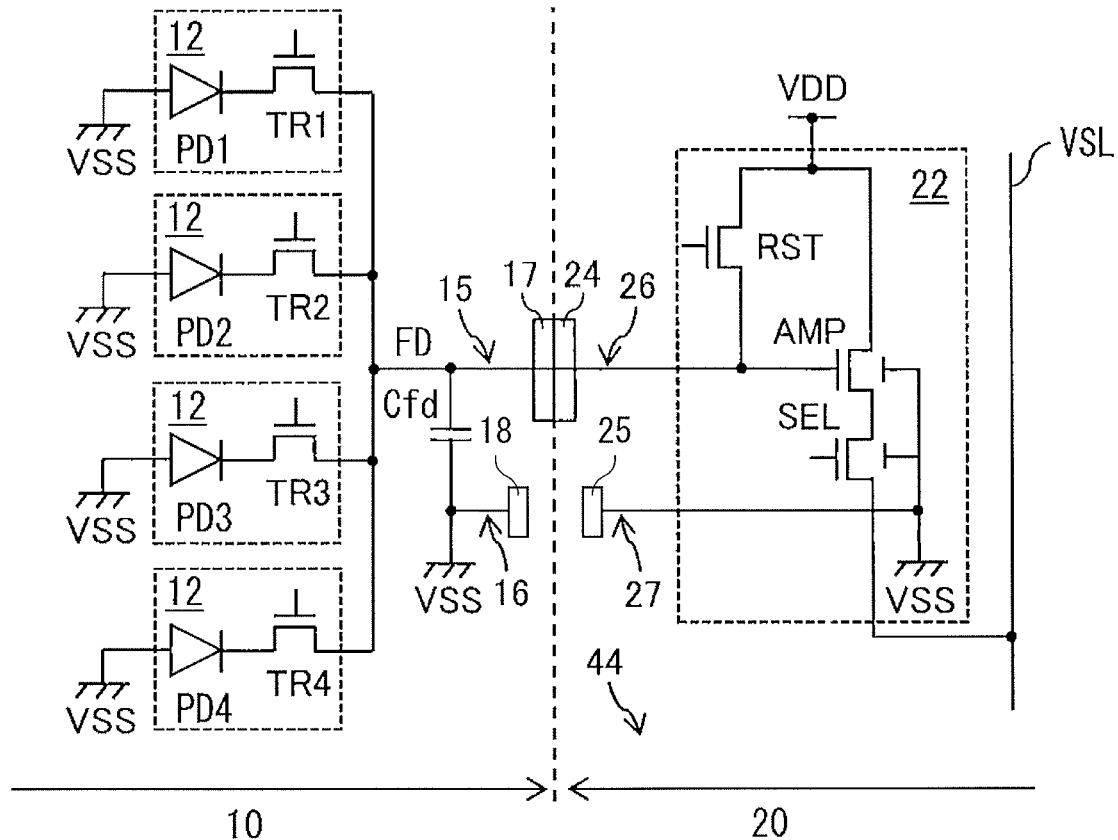
[Fig. 30A]
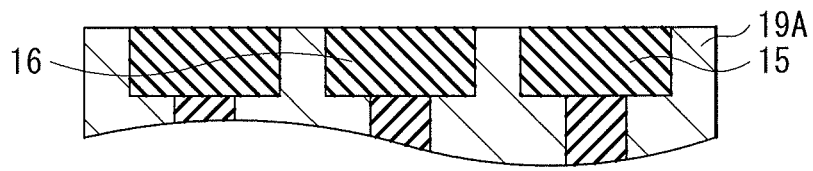
[Fig. 30B]
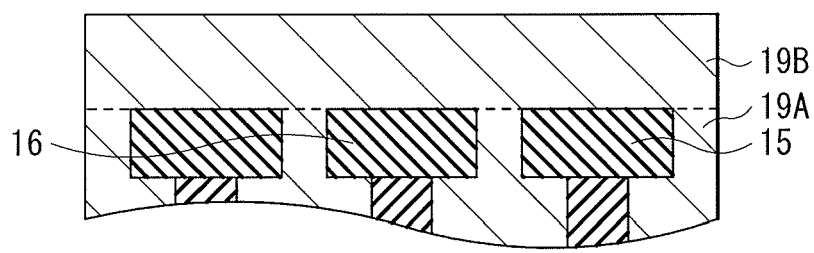

[Fig. 30C]
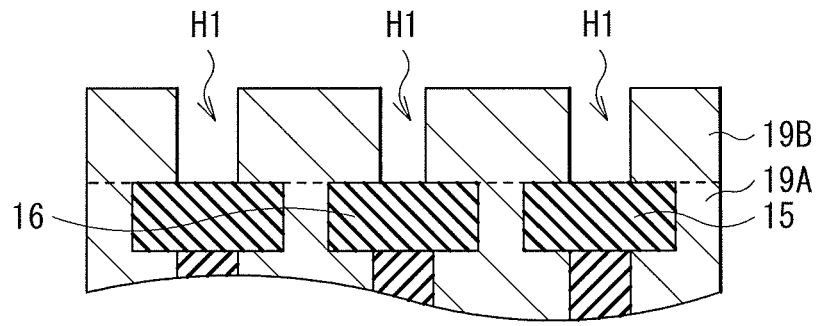
[Fig. 30D]
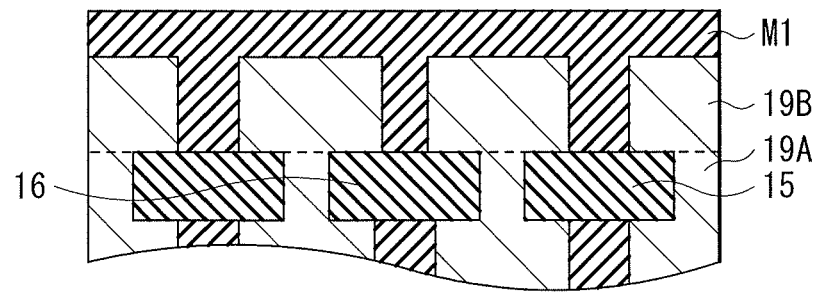
[Fig. 30E]
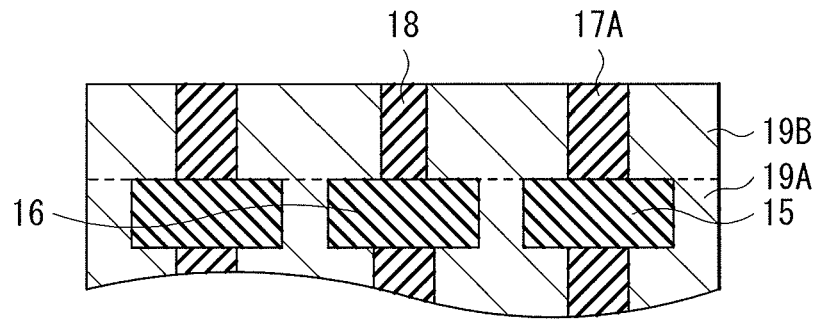
[Fig. 30F]
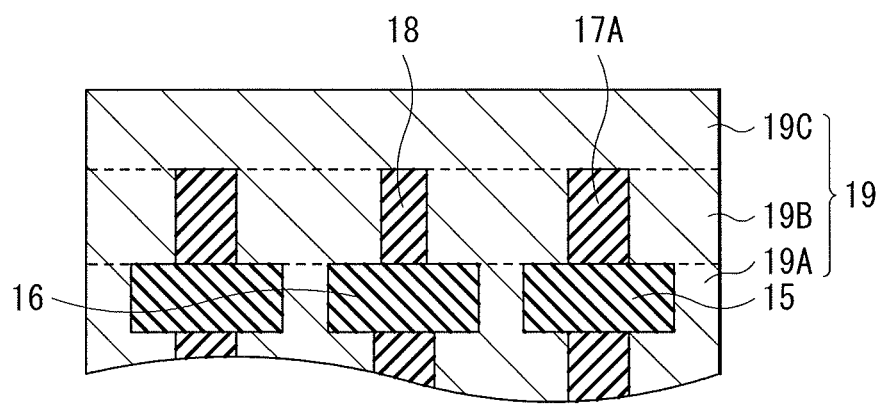

[Fig. 30G]
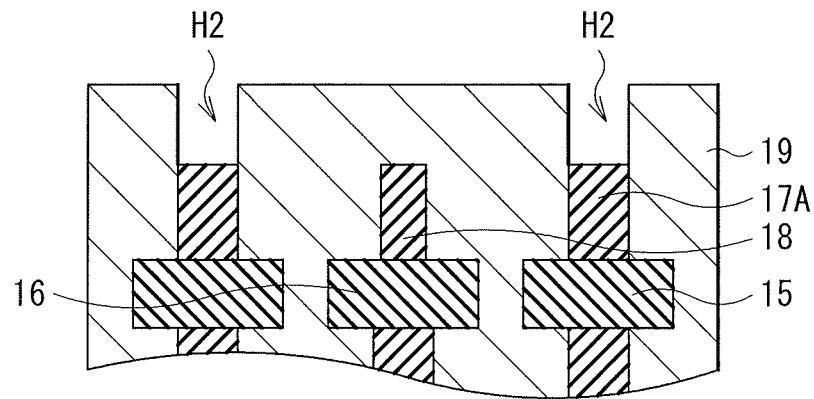
[Fig. 30H]
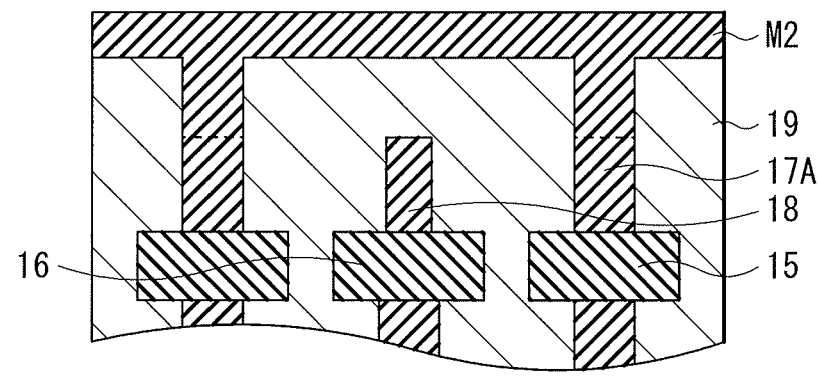
[Fig. 30I]
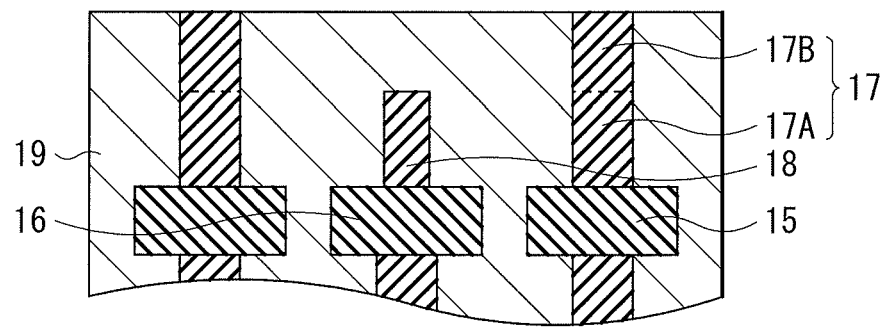

[Fig. 31]
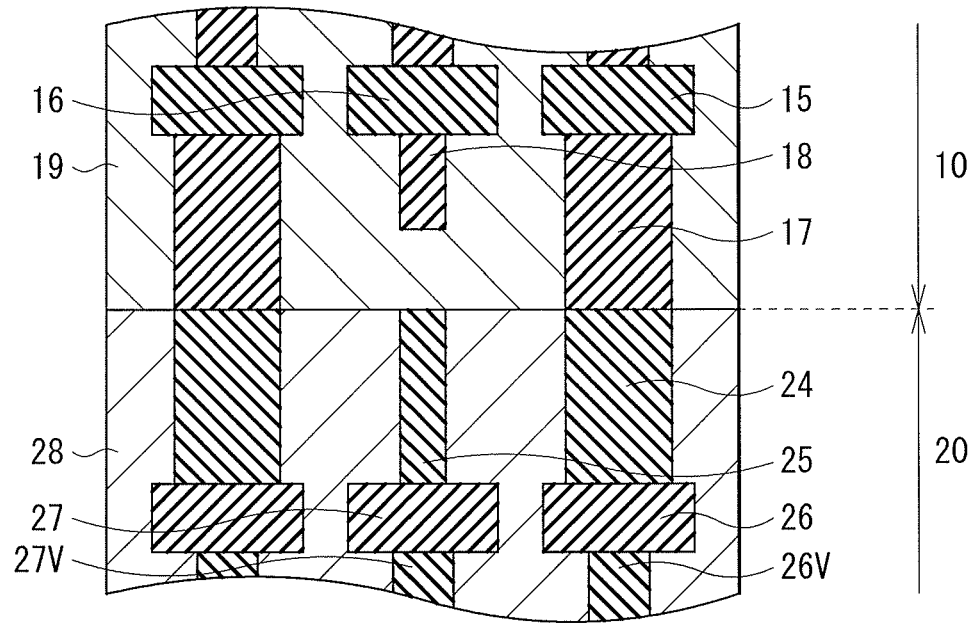
[Fig. 32]
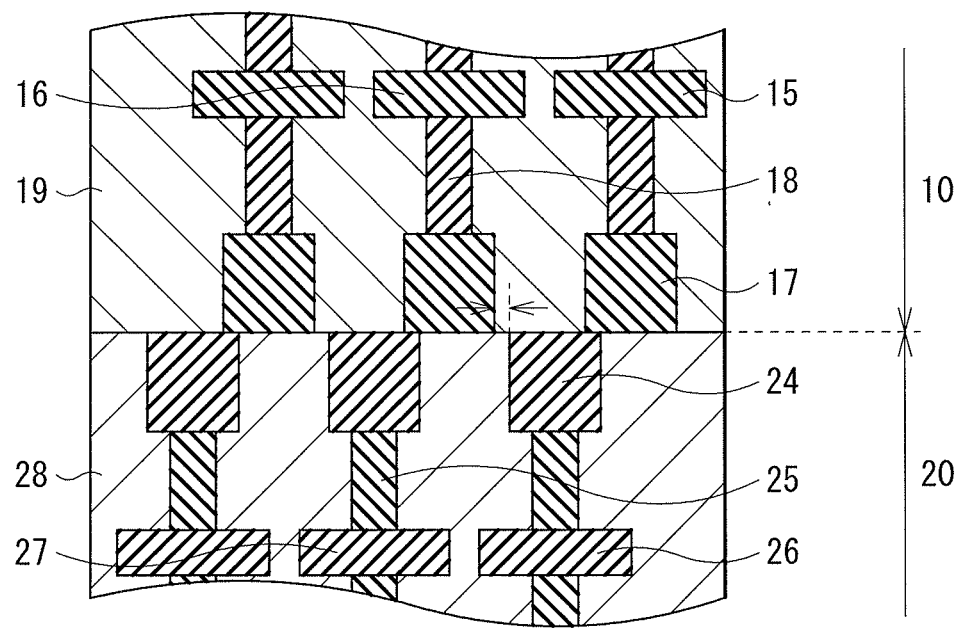

[Fig. 33]
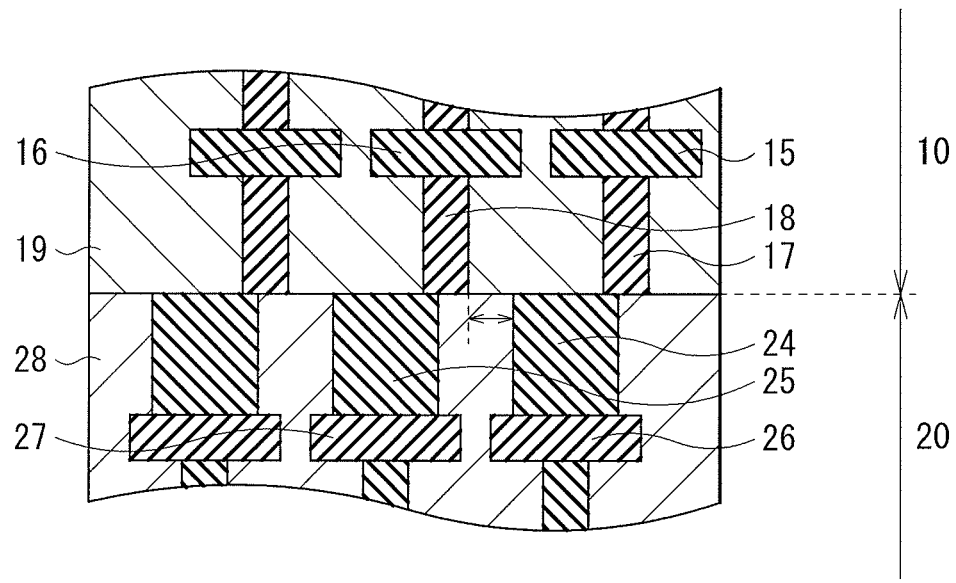
[Fig. 34]
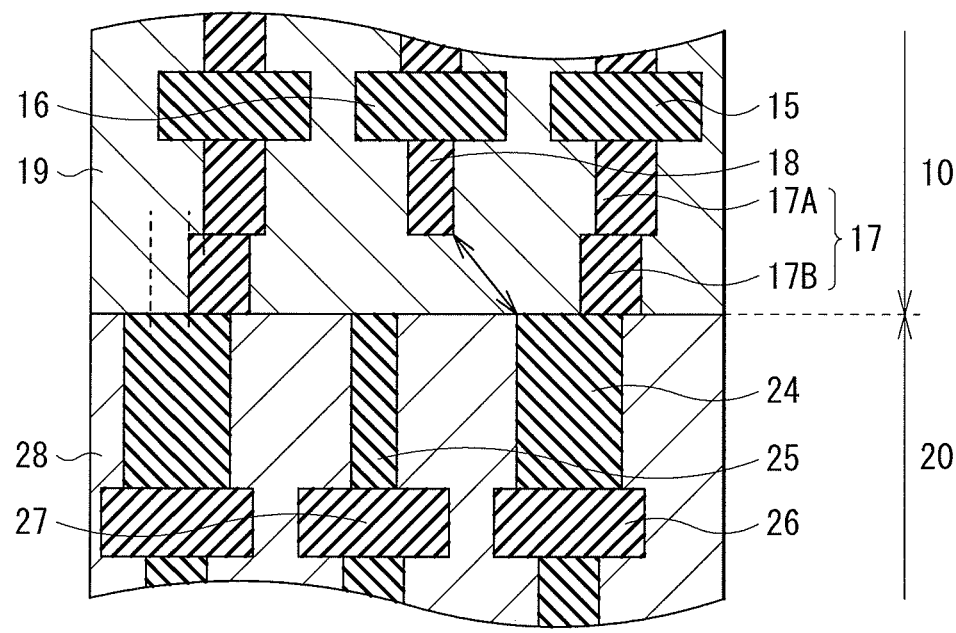

[Fig. 35]
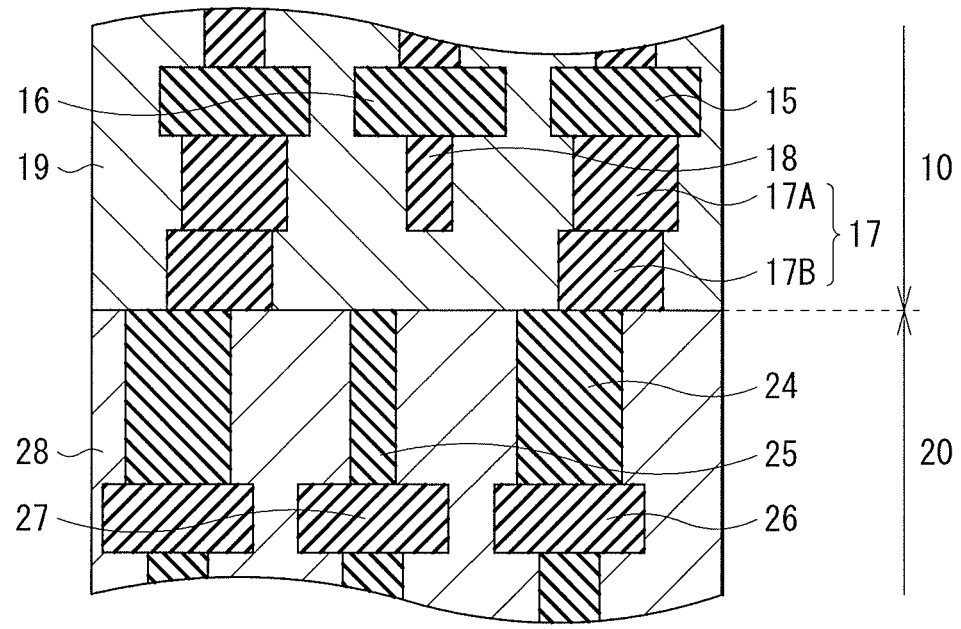
[Fig. 36]
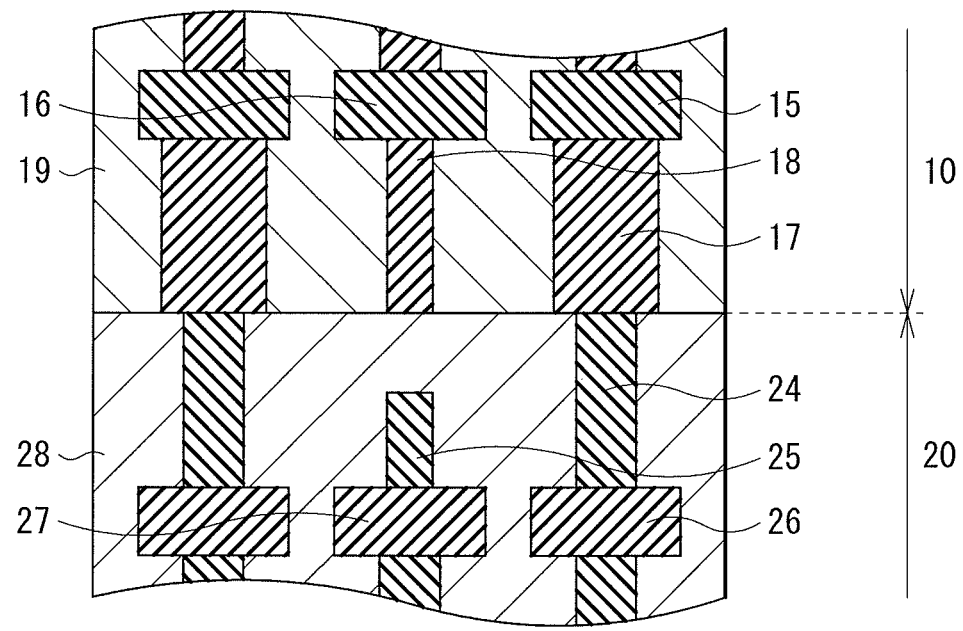

[Fig. 37]
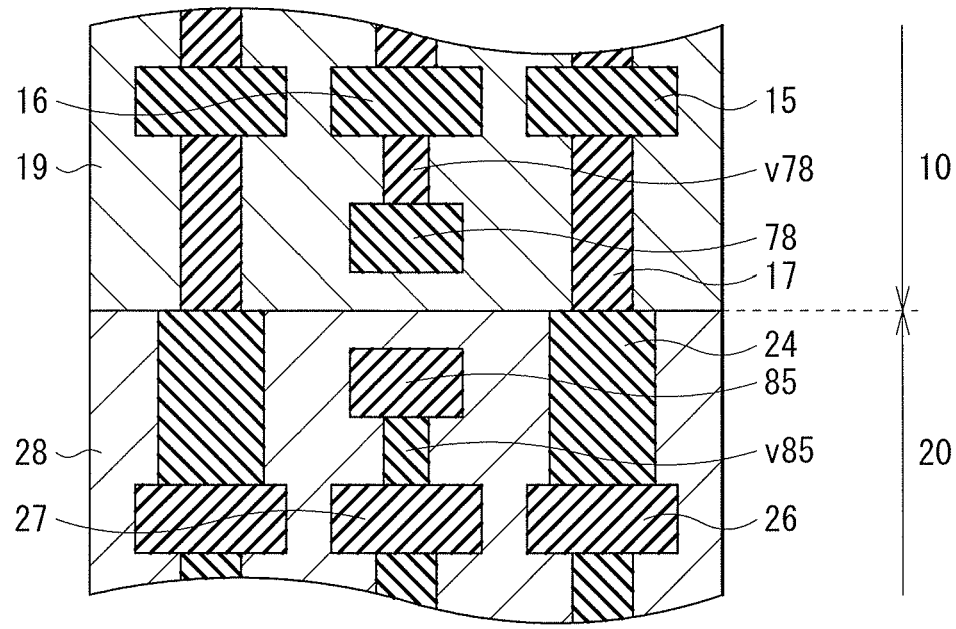
[Fig. 38]
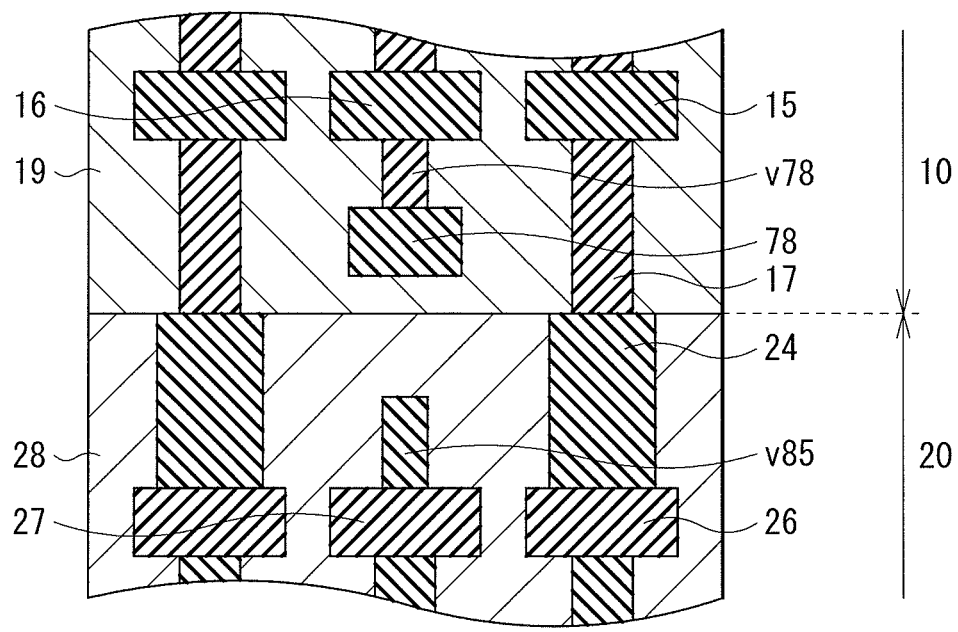

[Fig. 39]
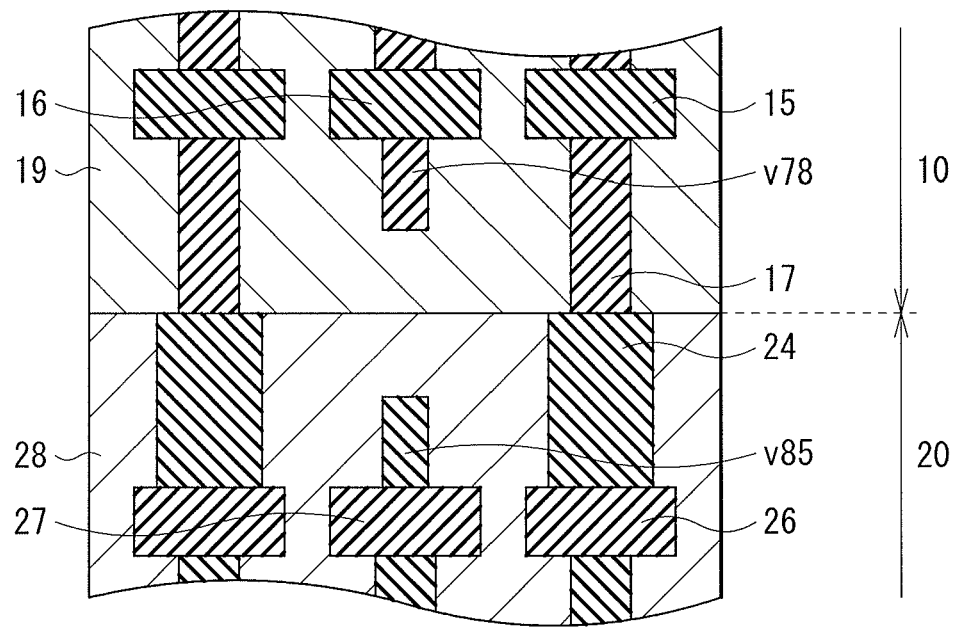
[Fig. 40]
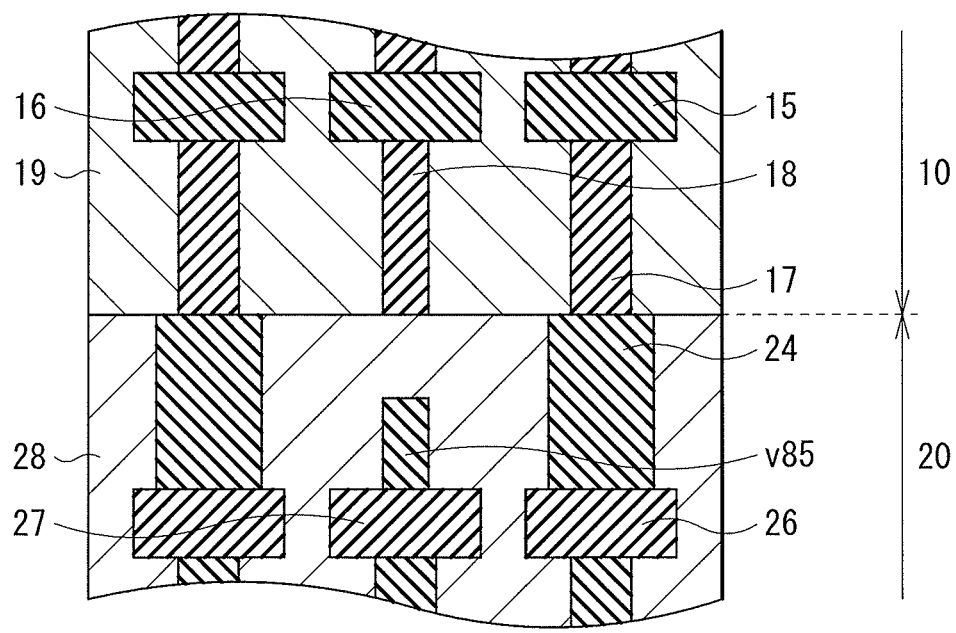

[Fig. 41]
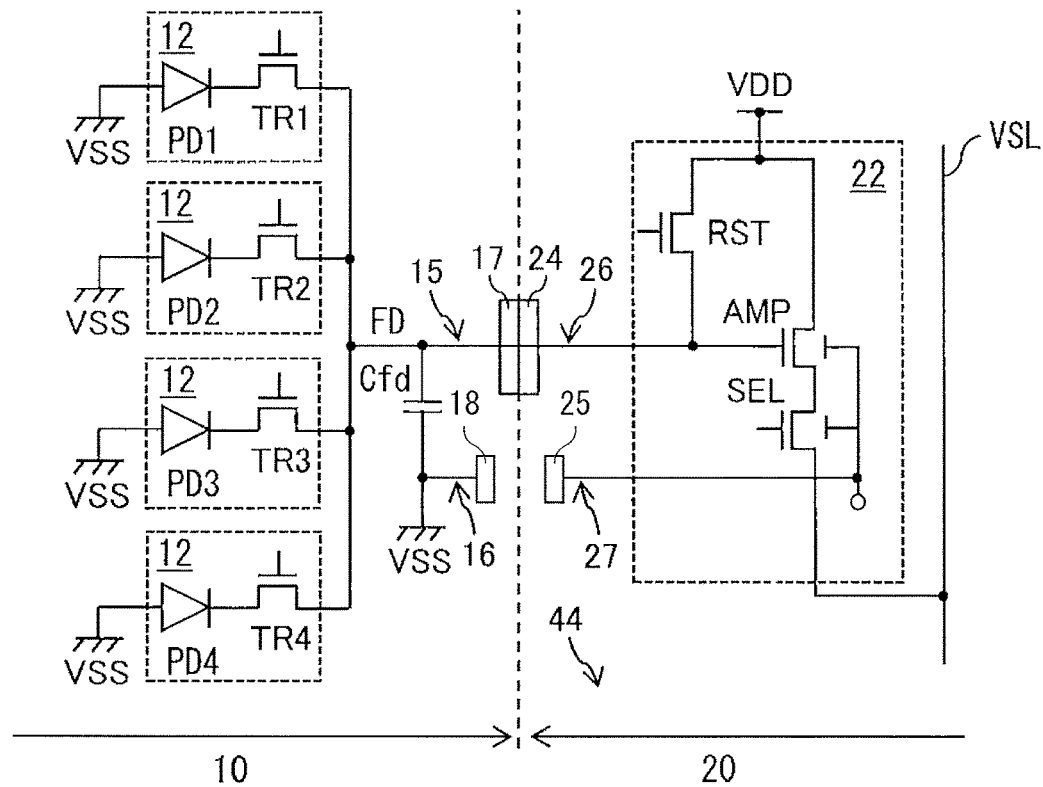
[Fig. 42]
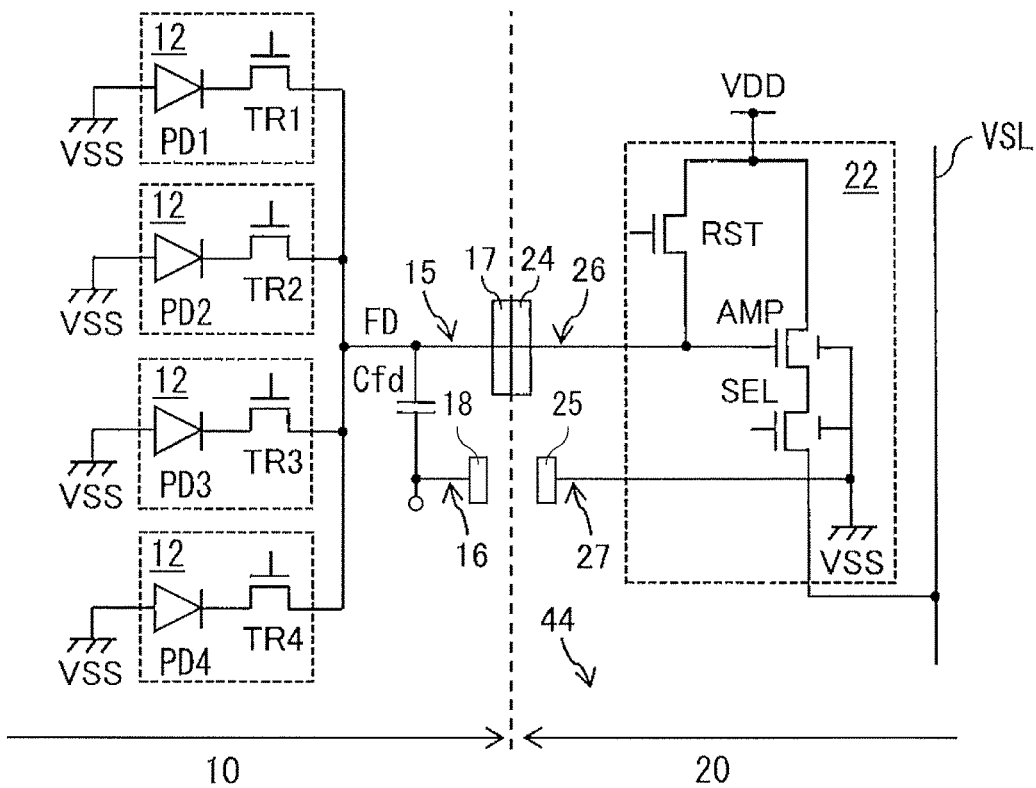

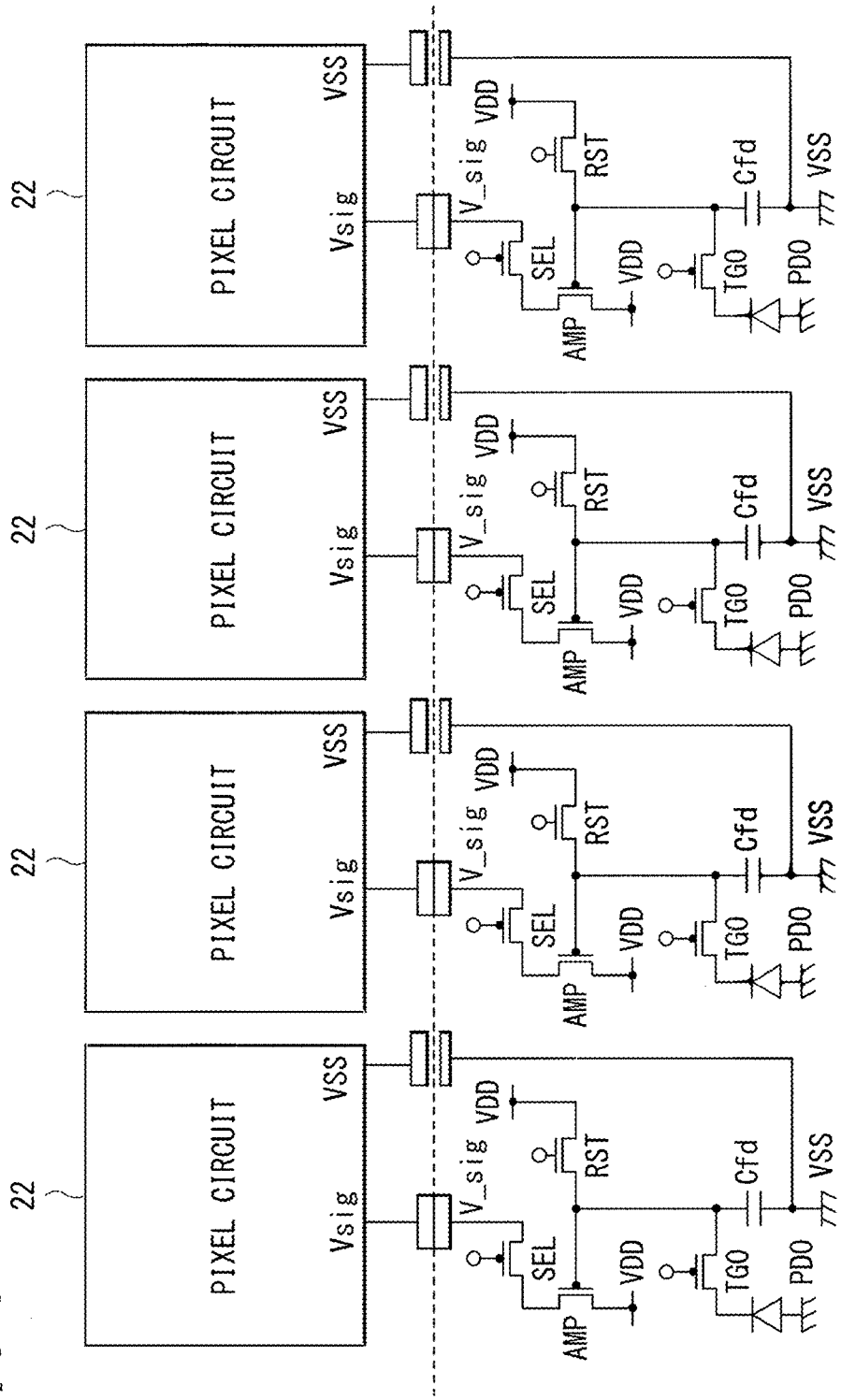
[Fig. 43]

[Fig. 44]
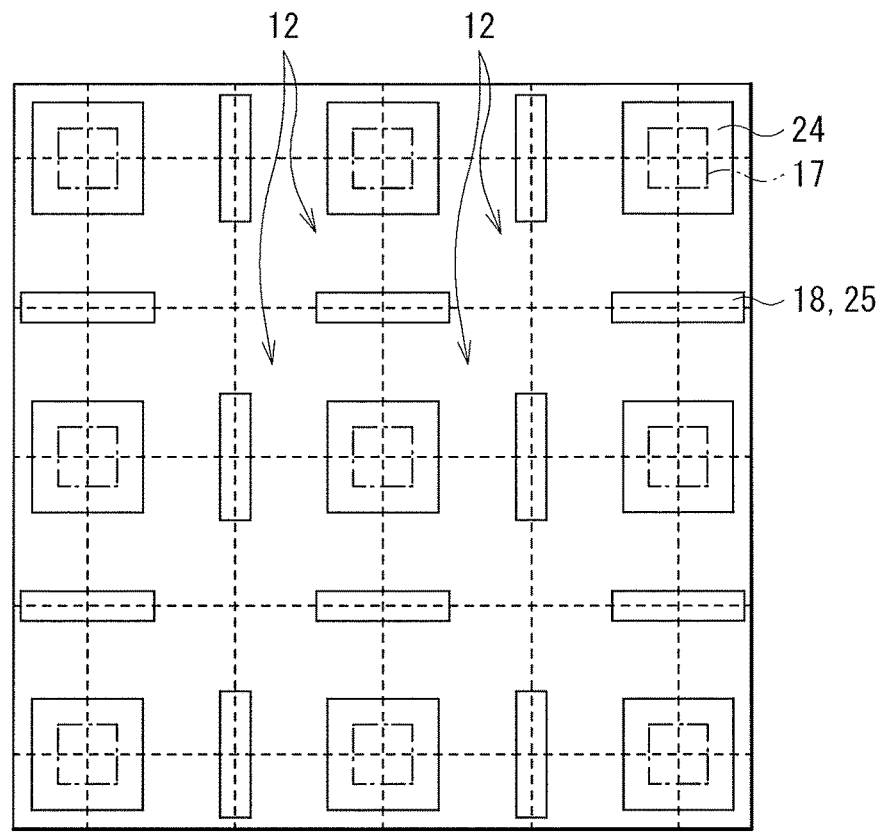
[Fig. 45]
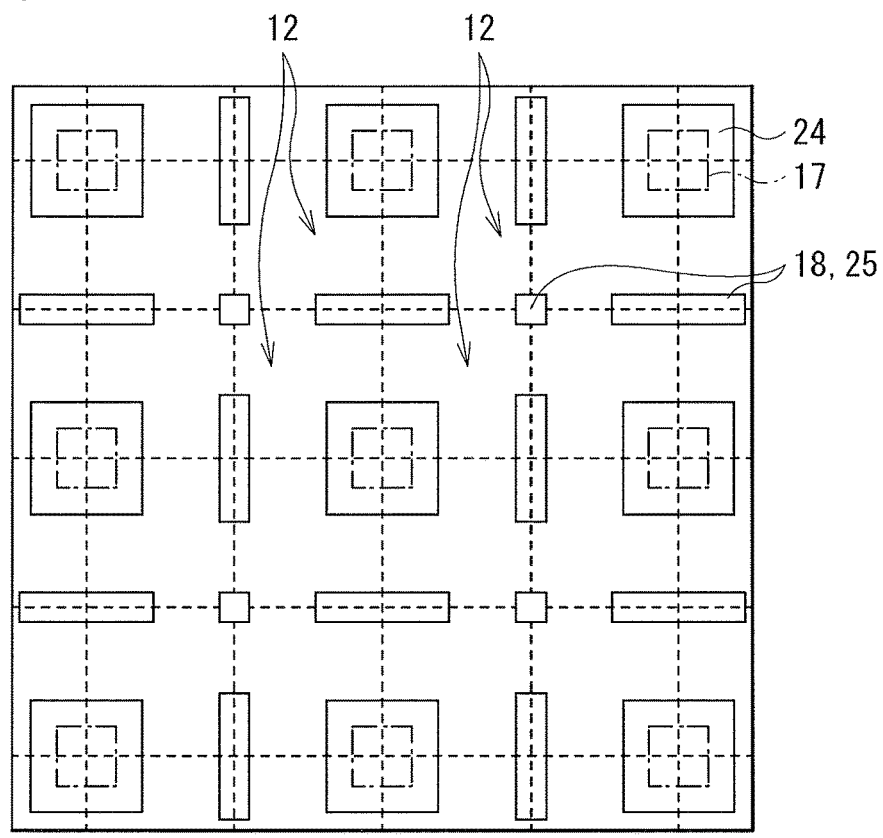

[Fig. 46]
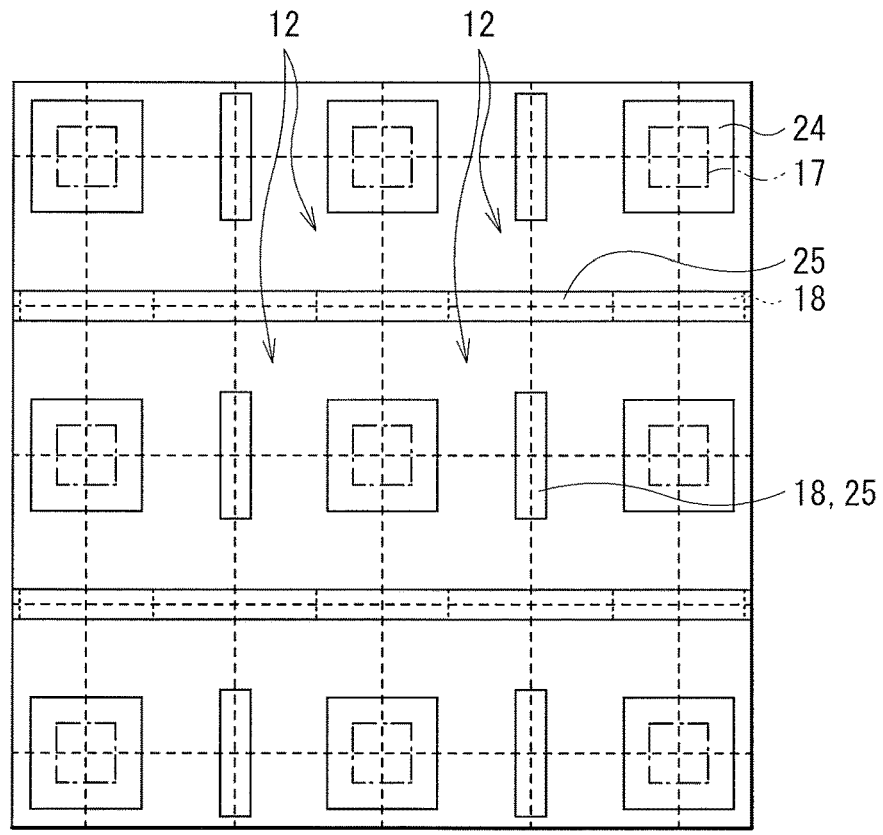
[Fig. 47]
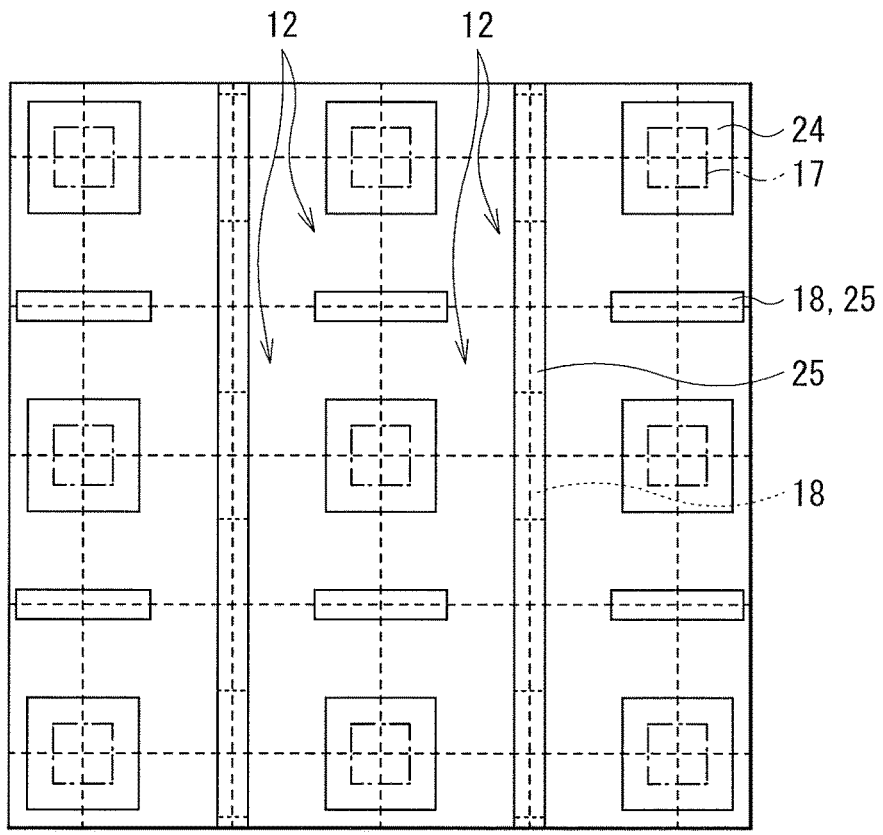

[Fig. 48]
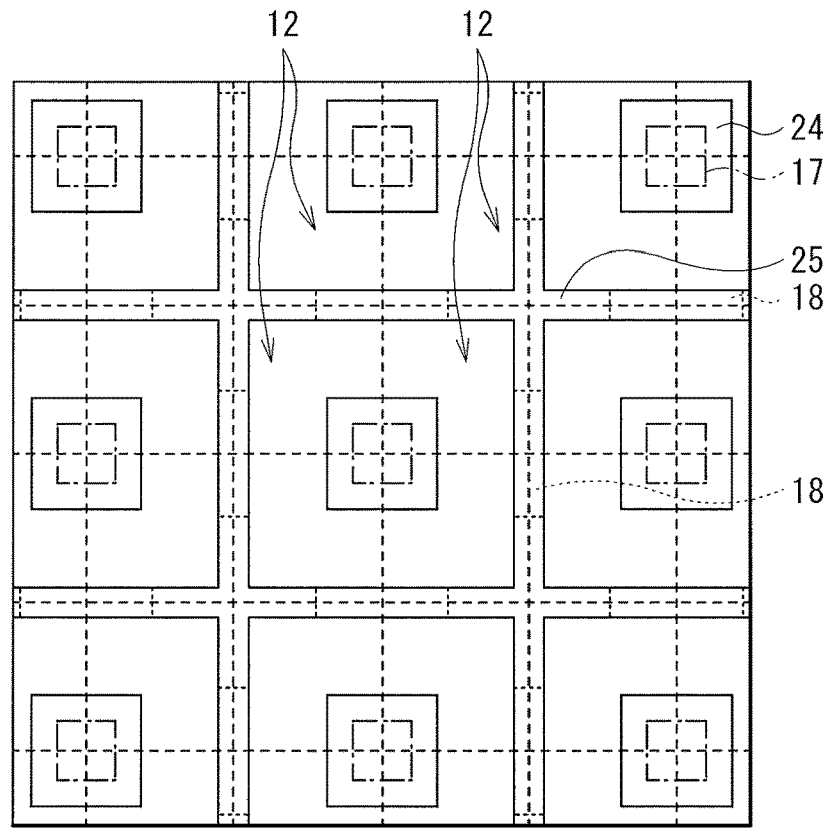
[Fig. 49]
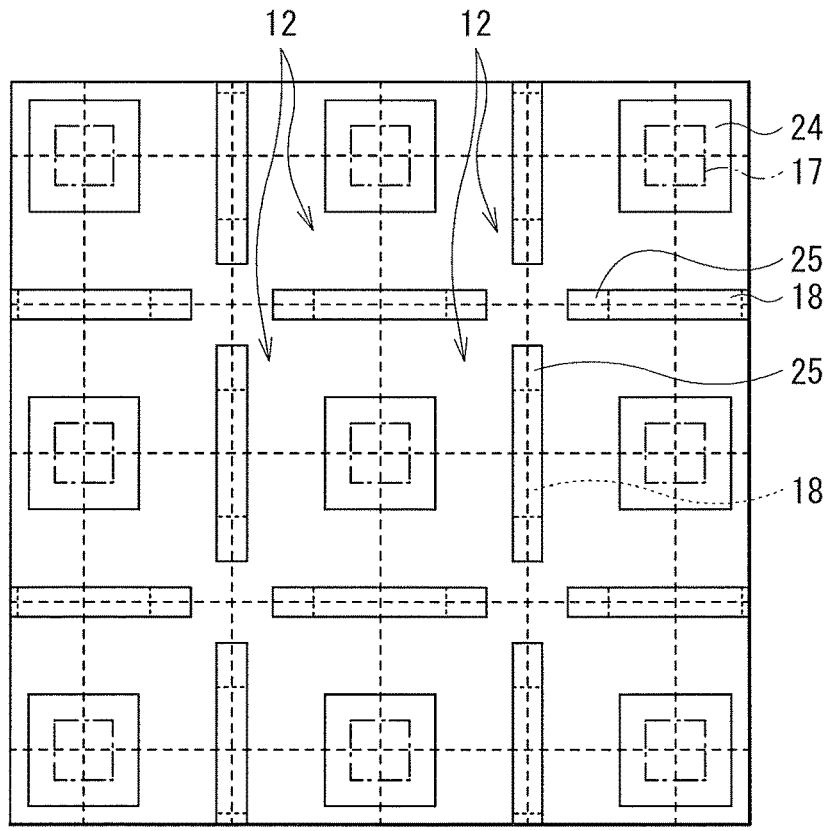

[Fig. 50]
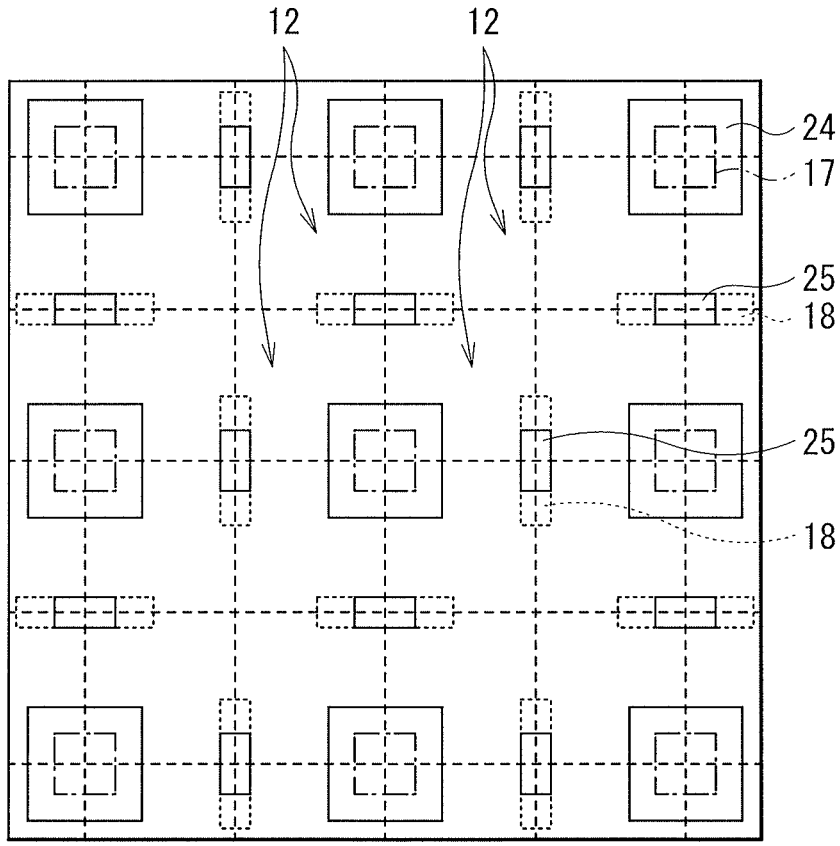
[Fig. 51]
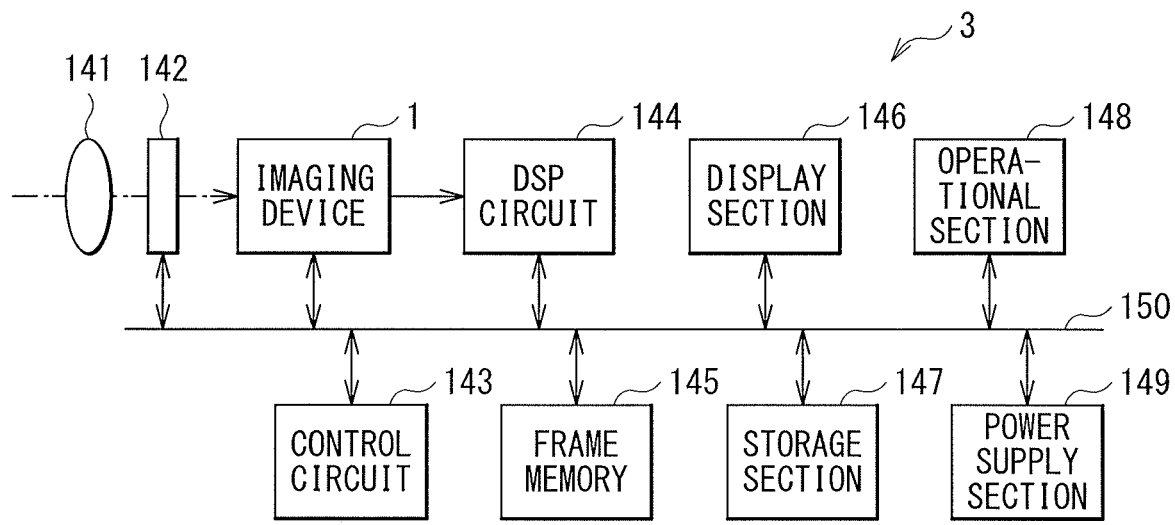

[Fig. 52]
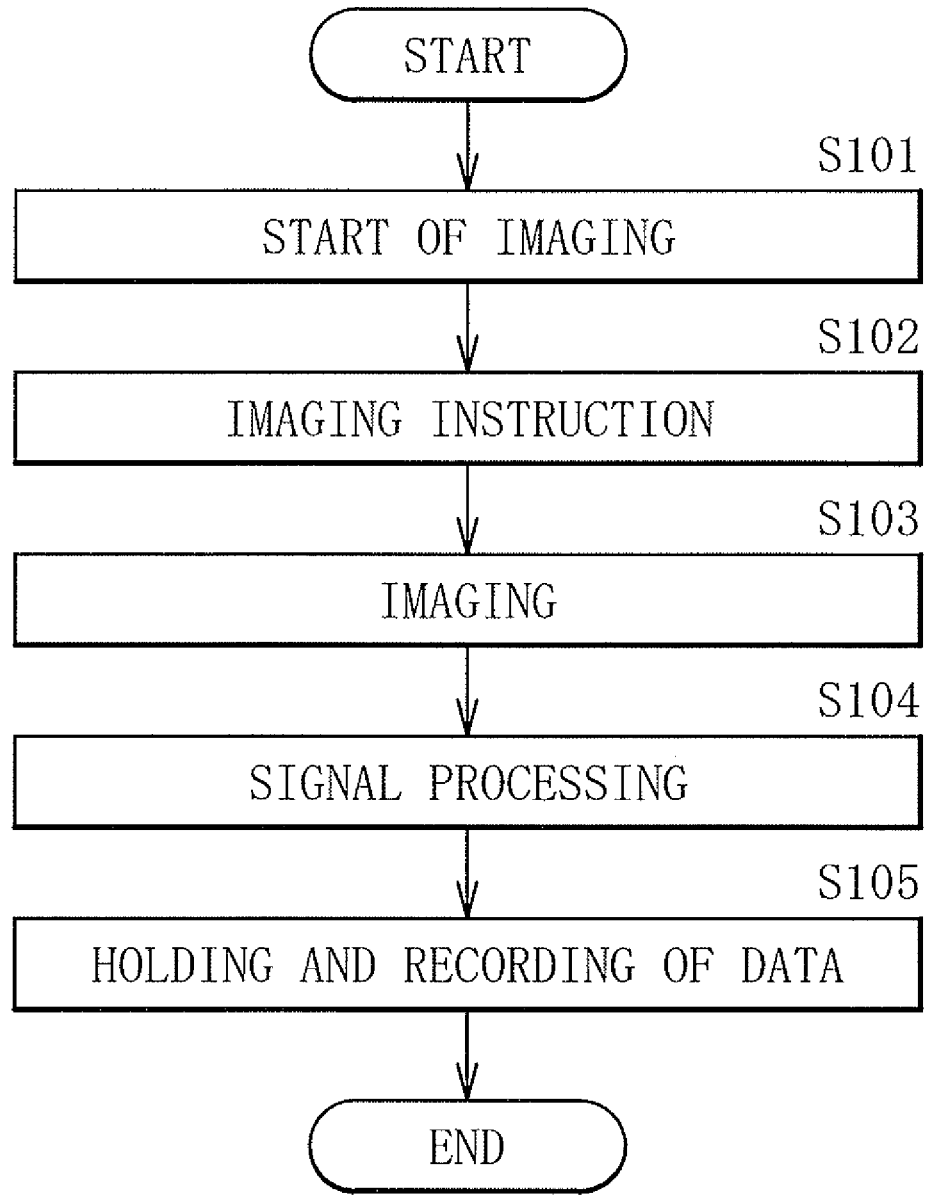

[Fig. 53]
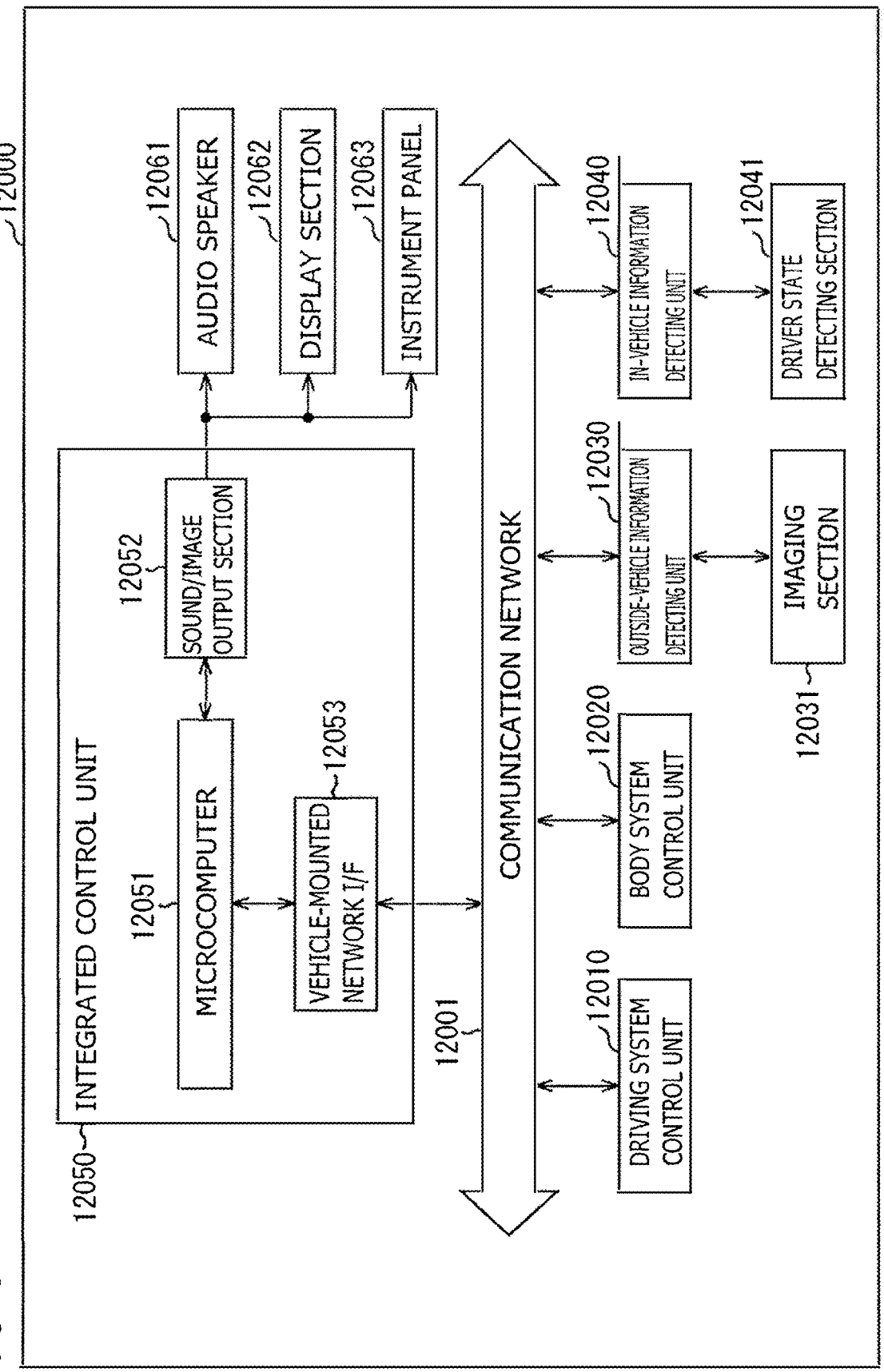

[Fig. 54]
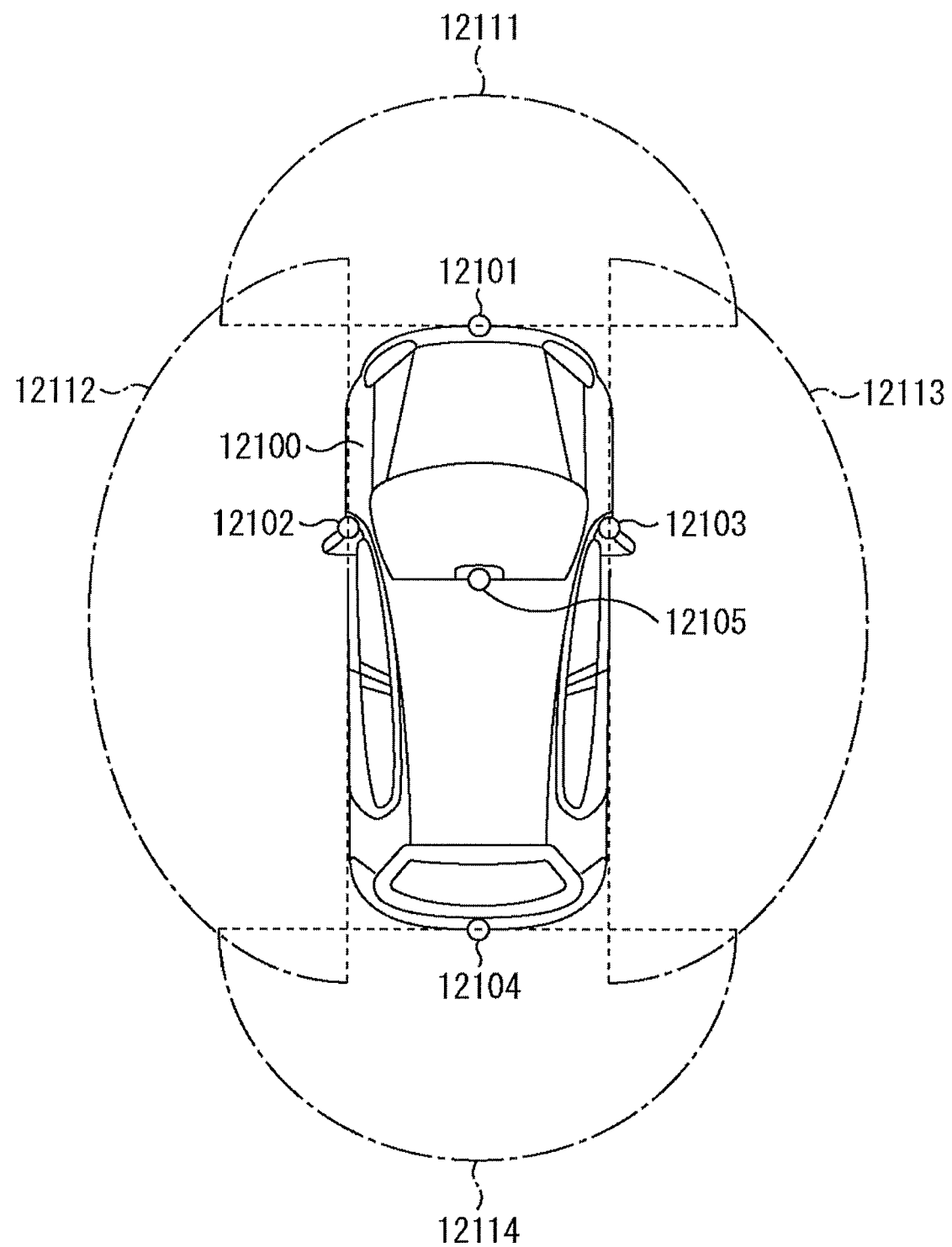

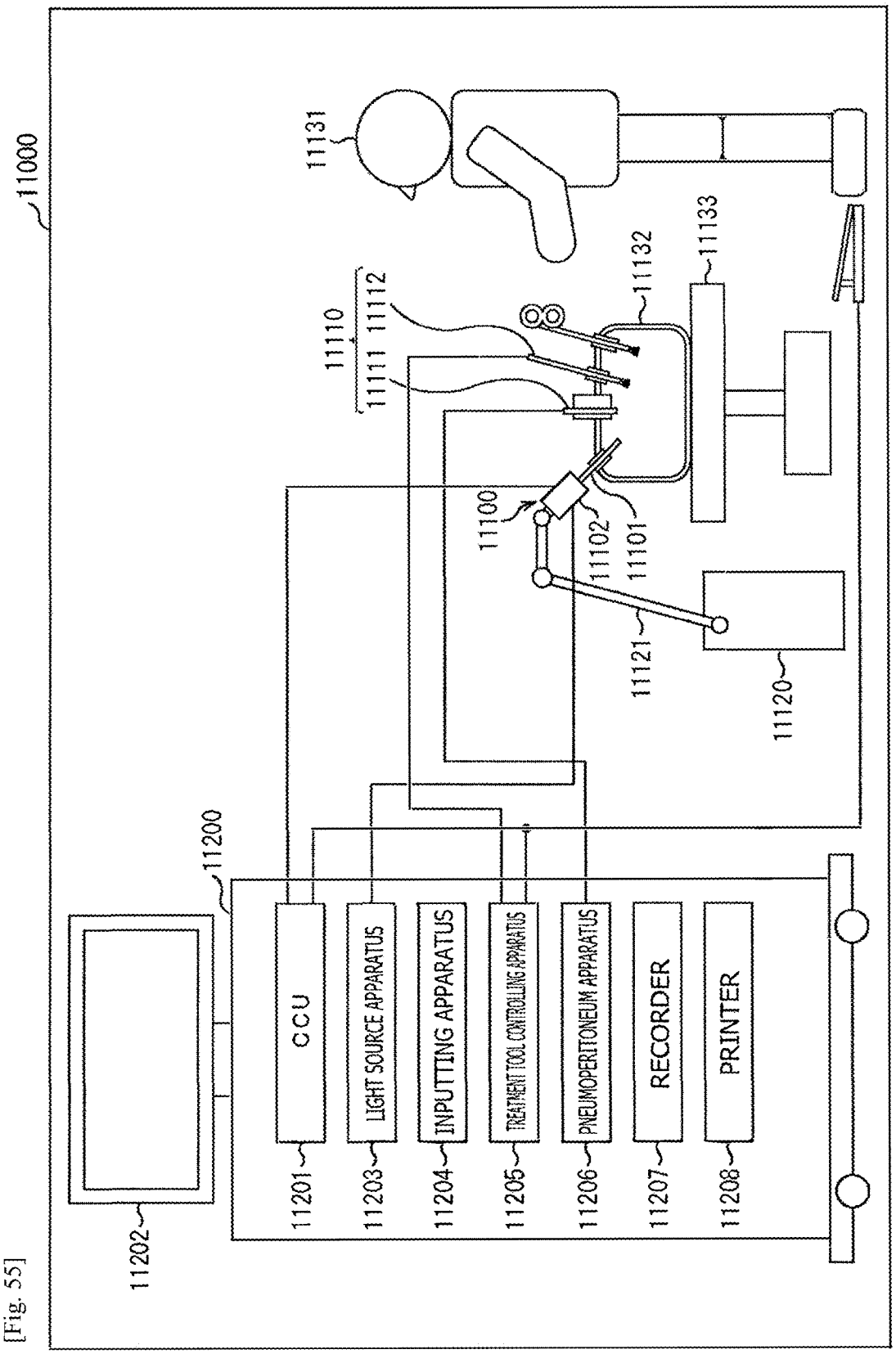
[Fig. 55]

[Fig. 56]
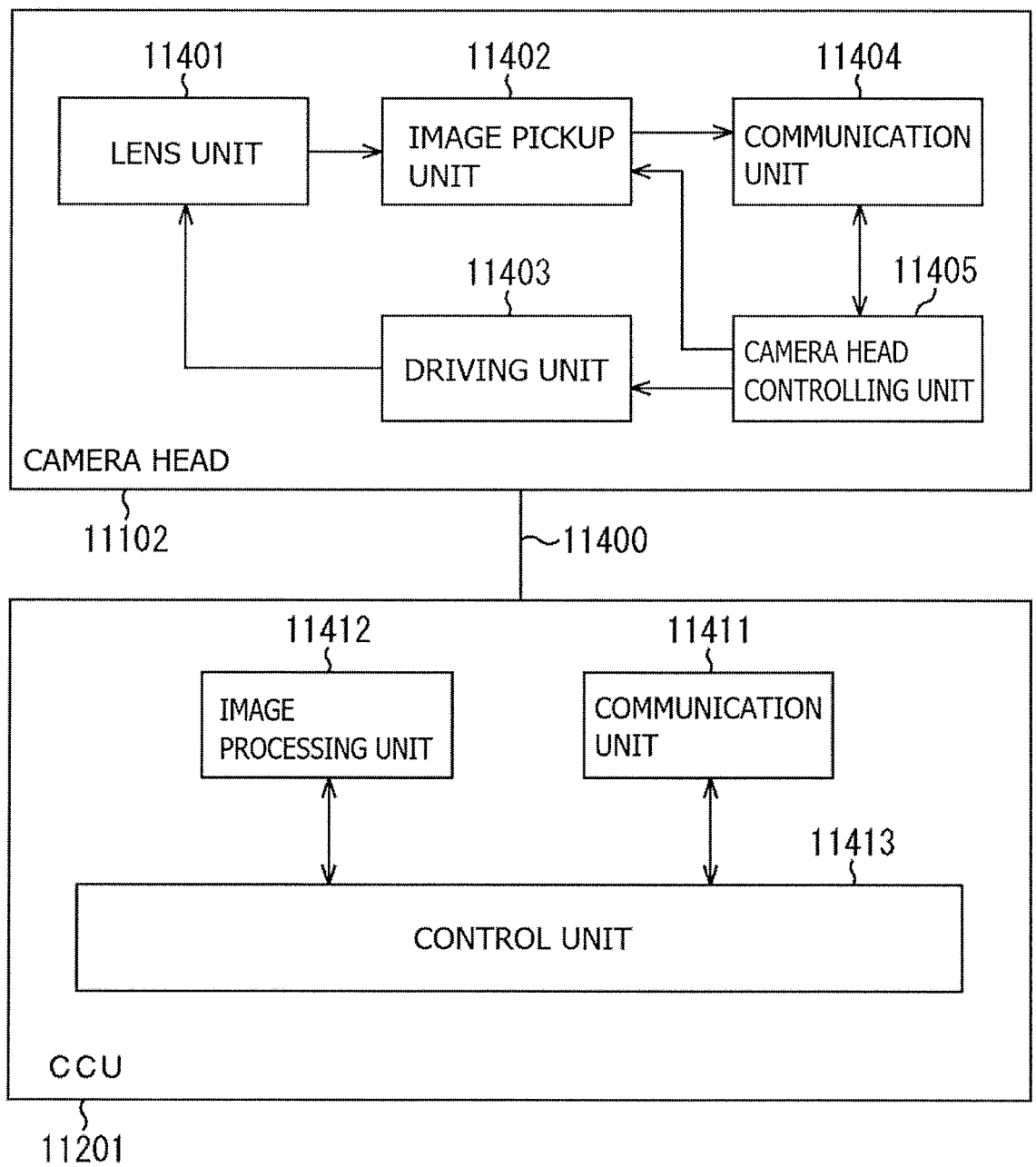

IMAGING DEVICE

CROSS REFERENCE TO RELATED APPLICATIONS

This application is a national stage application under 35 U.S.C. 371 and claims the benefit of PCT Application No. PCT/JP2019/044120, having an international filing date of 11 Nov. 2019, which designated the United States, which PCT application claimed the benefit of Japanese Patent Application Nos. 2018-215381, filed 16 Nov. 2018, and 2019-170593, filed 19 Sep. 2019, the entire disclosures of each of which are incorporated herein by reference.

Technical Field

The present disclosure relates to an imaging device.

Background Art

Heretofore, miniaturization of area per pixel in an imaging device of a two-dimensional structure has been achieved through adoption of microfabrication processes and improvement of the mounting density. In recent years, to achieve further miniaturization of an imaging device, the imaging device of a three-dimensional structure has been developed. In the imaging device of such a three-dimensional structure, for example, as described in PTLs 1 to 3, a photodiode, a circuit serving to read out an electrical charge obtained by the photodiode (a readout circuit), a circuit serving to control readout of the electrical charge from the photodiode (a control circuit), etc. are disposed on two laminated semiconductor substrates.

CITATION LIST

Patent Literature

[PTL 1] Japanese Unexamined Patent Application Publication No. 2014-22561
[PTL 2] Japanese Unexamined Patent Application Publication No. 2010-219339
[PTL 3] Japanese Unexamined Patent Application Publication No. 2017-117828

SUMMARY

Technical Problem

Incidentally, in an imaging device of a three-dimensional structure, further enhancement of a dynamic range and further noise reduction are desired. It is therefore desirable to provide an imaging device that allows for further enhancement of the dynamic range and further noise reduction.

Solution to Problem

An imaging device according to a first aspect of the present disclosure is configured to laminate a first substrate, a second substrate, and a third substrate in this order. The first substrate has a pixel region including a plurality of sensor pixels that perform photoelectric conversion. The second substrate has a plurality of readout circuits that are provided one by one for each of the single sensor pixel or the plurality of sensor pixels to output a pixel signal based on an electrical charge outputted from the sensor pixels. The third substrate has a control circuit that controls the sensor pixels and the readout circuits. A laminate including the first substrate and the second substrate has an interlayer insulating film, and a plurality of junction electrodes provided in a region that is located in the interlayer insulating film and is opposed to the pixel region. The sensor pixels and the readout circuits are coupled electrically with respect to one another through junction of the junction electrodes.

In the imaging device according to the first aspect of the present disclosure, the plurality of sensor pixels are disposed on the first substrate; the plurality of readout circuits are disposed on the second substrate; and the control circuit is disposed on the third substrate. This allows each of the sensor pixels to be configured in a sufficiently large size, ensuring that reproduced images of a wide dynamic range are obtained. Further, this makes it possible to take the sufficiently large size for the readout circuit, which avoids an increase in a dark-time noise such as RTS (Random Telegraph Signal) noise, for example. Additionally, in the imaging device according to an embodiment of the present disclosure, the sensor pixels and the readout circuits are electrically coupled with respect to one another through junction of the junction electrodes that are provided in a region that is opposed to the pixel region. This makes it possible to reduce a unit pixel size as compared with a case where electrical coupling of the sensor pixels and the readout circuits is performed in a single pixel on a common substrate.

An imaging device according to a second aspect of the present disclosure is configured to laminate a first substrate and a second substrate with each other. The first substrate has a pixel region including a plurality of sensor pixels that perform photo-electric conversion. The second substrate has a plurality of readout circuits that are provided one by one for each of the single sensor pixel or the plurality of sensor pixels to output a pixel signal based on an electrical charge outputted from the sensor pixels, and a control circuit that controls the sensor pixels and the readout circuits. A laminate including the first substrate and the second substrate has an interlayer insulating film, and a plurality of junction electrodes provided in a region that is located in the interlayer insulating film and is opposed to the pixel region. The sensor pixels and the readout circuits are coupled electrically with respect to one another through junction of the junction electrodes.

In the imaging device according to the second aspect of the present disclosure, the plurality of sensor pixels are disposed on the first substrate, and the plurality of readout circuits and the control circuit are disposed on the second substrate. This allows each of the sensor pixels to be configured in a sufficiently large size, ensuring that reproduced images of a wide dynamic range are obtained. Further, this makes it possible to take the sufficiently large size for the readout circuit, which avoids an increase in a dark-time noise such as the RTS noise, for example.

An imaging device according to an aspect of the present technology includes a first section including a first semiconductor substrate, at least one first photoelectric conversion region disposed in the first semiconductor substrate, a first floating diffusion coupled to the at least one first photoelectric conversion region, a first bonding portion, a first wiring electrically connected between the first floating diffusion and the first bonding portion, at least one second photoelectric conversion region disposed in the first semiconductor substrate, a second floating diffusion coupled to the at least one second photoelectric conversion region, a second bonding portion, a second wiring electrically connected between the second floating diffusion and the second bonding portion, a first region coupled to a node that receives a reference voltage, and a third wiring coupled to the first region and that extends in a same direction as the first and second wirings at a location that is between the first wiring and the second wiring. The imaging device includes a second section bonded to the first section via the first and second bonding portions and including readout circuitry coupled to the first bonding portion and the second bonding portion. The first section further includes a first transfer transistor to transfer charge from the first photo-electric conversion region to the first floating diffusion, and a second transfer transistor to transfer charge from the second photoelectric conversion region to the second floating diffusion. The readout circuitry includes a first reset transistor, a first amplification transistor, and a first selection transistor electrically connected to the first bonding portion. The readout circuitry includes a second reset transistor, a second amplification transistor, and a second selection transistor electrically connected to the second bonding portion. The readout circuitry includes a first reset transistor and a first negative feedback circuit electrically connected to the first bonding portion, and a second reset transistor and a second negative feedback circuit electrically connected to the second bonding portion. The first and second negative feedback circuits each include an operational amplifier and a feedback capacitance. The first section further includes at least one insulating layer on the first semiconductor substrate, where the at least one insulating layer includes the first, second, and third wirings. The at least one insulating layer includes a first insulating layer and a second insulating layer, where the second insulating layer is closer to the second section than the first insulating layer and having a lower dielectric constant than the first insulating layer. The first section further comprises a third bonding portion, where the third wiring electrically connects the first region to the third bonding portion, and where the first section and the second section are bonded via the first, second, and third bonding portions. The at least one insulating layer includes a third insulating layer on the second insulating layer and having a lower dielectric constant than the first insulating layer. The second section further comprises a third bonding portion bonded to the first bonding portion, and a fourth bonding portion bonded to the second bonding portion. The second section further comprises a fourth wiring that electrically connects the third bonding portion to the readout circuitry, and a fifth wiring that electrically connects the fourth bonding portion to the readout circuitry. The second section further comprises a sixth wiring electrically connected to the readout circuitry located between the fourth wiring and the fifth wiring. The sixth wiring is aligned with the first wiring. The first section further comprises a fifth bonding portion and the second section further comprises a sixth bonding portion bonded to the fifth bonding portion. The second section further comprises a second semiconductor substrate that includes the readout circuitry, and an insulating layer on the second semiconductor substrate that includes the fourth, fifth, and sixth wirings. The imaging device includes a third section bonded to the second section and including processing circuitry that processes signals from the readout circuitry. According to an aspect of the present technology, an imaging device includes a first section including a first semiconductor substrate. The first semiconductor substrate includes at least one first photoelectric conversion region, a first floating diffusion coupled to the at least one first photoelectric conversion region, and a first transfer transistor to transfer charges from the at least one first photoelectric conversion region to the first floating diffusion. The imaging device includes at least one second photoelectric conversion region disposed in the first semiconductor substrate, a second floating diffusion coupled to the at least one second photoelectric conversion region, a second transfer transistor to transfer charges from the at least one second photoelectric conversion region to the second floating diffusion. The imaging device includes a well region, and at least one first insulating layer on the first semi-conductor substrate. The at least one first insulating layer includes a first bonding portion, a first wiring electrically connected between the first floating diffusion and the first bonding portion, a second bonding portion, a second wiring electrically connected between the second floating diffusion and the second bonding portion, and a third wiring electrically connected to the well region and that provides a shield between the first wiring and the second wiring. The imaging device includes a second section bonded to the first section via the first and second bonding portions and including readout circuitry coupled to the first bonding portion and the second bonding portion. The imaging device includes a third section bonded to the second section and including processing circuitry that processes signals from the readout circuitry. According to an aspect of the present technology, an imaging device includes a first section including first photoelectric conversion regions that share a first floating diffusion, a first bonding portion, first wiring that electrically connects the first floating diffusion to the first bonding portion, second photoelectric conversion regions that share a second floating diffusion, a second bonding portion, second wiring that electrically connects the second floating diffusion to the second bonding portion, a well region of a desired conductivity type, third wiring electrically connected to the well region and that provides a signal shield between the first wiring and the second wiring, and a second section bonded to the first section via the first and second bonding portions and including readout circuitry electrically connected to the first bonding portion and the second bonding portion. The imaging device includes a third section bonded to the second section and including processing circuitry to process signals from the readout circuitry.

BRIEF DESCRIPTION OF DRAWINGS

The accompanying drawings are included to provide a further understanding of the technology, and are incorporated in and constitute a part of this specification. The drawings illustrate embodiments and, together with the specification, serve to explain the principles of the technology.

FIG. 1 illustrates an exploded perspective configuration example of an imaging device according to an embodiment of the present disclosure.

FIG. 2 illustrates an example of a functional block of a logic circuit illustrated in FIG. 1.

FIG. 3 illustrates an example of sensor pixels and a readout circuit illustrated in FIG. 1.

FIG. 4 illustrates a cross-sectional configuration example in a vertical direction of the imaging device illustrated in FIG. 1.

FIG. 5 illustrates a cross-sectional configuration example in a horizontal direction of the imaging device illustrated in FIG. 1.

FIG. 6A illustrates a cross-sectional configuration example in the vicinity of through-wiring lines in FIG. 4.

FIG. 6B illustrates a cross-sectional configuration example in the vicinity of the through-wiring lines in FIG. 4.

FIG. 6C illustrates a cross-sectional configuration example in the vicinity of the through-wiring lines in FIG. 4.

FIG. 7A illustrates a cross-sectional configuration example in the vicinity of the through-wiring lines in FIG. 4.

FIG. 7B illustrates a cross-sectional configuration example in the vicinity of the through-wiring lines in FIG. 4.

FIG. 7C illustrates a cross-sectional configuration example in the vicinity of the through-wiring lines in FIG. 4.

FIG. 8 illustrates a modification example of a cross-sectional configuration in the horizontal direction of the imaging device illustrated in FIG. 1.

FIG. 9 illustrates a modification example of the sensor pixels and the readout circuit illustrated in FIG. 1.

FIG. 10 illustrates a modification example of a cross-sectional configuration in the horizontal direction of the imaging device illustrated in FIG. 1.

FIG. 11 illustrates a modification example of a cross-sectional configuration in the vertical direction of the imaging device illustrated in FIG. 1.

FIG. 12 illustrates a modification example of a cross-sectional configuration in the vertical direction of the imaging device illustrated in FIG. 1.

FIG. 13 illustrates a modification example of a cross-sectional configuration in the vertical direction of the imaging device illustrated in FIG. 1.

FIG. 14 illustrates a modification example of a cross-sectional configuration in the vertical direction of the imaging device illustrated in FIG. 1.

FIG. 15 illustrates a modification example of a cross-sectional configuration in the vertical direction of the imaging device illustrated in FIG. 1.

FIG. 16 illustrates a modification example of the sensor pixels and the readout circuit illustrated in FIG. 1.

FIG. 17 illustrates a modification example of the readout circuit illustrated in FIG. 1.

FIG. 18 illustrates a modification example of the sensor pixels and the readout circuit illustrated in FIG. 1.

FIG. 19 illustrates a modification example of an exploded perspective configuration of the imaging device illustrated in FIG. 1.

FIG. 20 illustrates an example of a cross-sectional configuration of a transistor in a first substrate illustrated in FIG. 1.

FIG. 21 illustrates an example of a cross-sectional configuration of a transistor in a second substrate illustrated in FIG. 1.

FIG. 22 illustrates a modification example of sharing of the sensor pixels by the readout circuit in FIG. 1.

FIG. 23 illustrates a modification example of sharing of the sensor pixels by the readout circuit in FIG. 1.

FIG. 24 illustrates a modification example of an exploded perspective configuration of the imaging device illustrated in FIG. 1.

FIG. 25 illustrates a modification example of an exploded perspective configuration of an imaging device illustrated in FIG. 19.

FIG. 26 illustrates a modification example of a circuit configuration of the imaging device illustrated in FIG. 1.

FIG. 27 illustrates a modification example of a cross-sectional configuration in the vertical direction of the imaging device illustrated in FIG. 1.

FIG. 28 illustrates an example of a cross-sectional configuration in the horizontal direction of an imaging device having the cross-sectional configuration illustrated in FIG. 27.

FIG. 29 illustrates an example of sensor pixels and a readout circuit of the imaging device having the cross-sectional configuration illustrated in FIG. 27.

FIG. 30A is a schematic cross-sectional view in the vertical direction illustrating an example of a method of manufacturing a wiring structure illustrated in FIG. 27.

FIG. 30B is a schematic cross-sectional view illustrating a step following that illustrated in FIG. 30A.

FIG. 30C is a schematic cross-sectional view illustrating a step following that illustrated in FIG. 30B.

FIG. 30D is a schematic cross-sectional view illustrating a step following that illustrated in FIG. 30C.

FIG. 30E is a schematic cross-sectional view illustrating a step following that illustrated in FIG. 30D.

FIG. 30F is a schematic cross-sectional view illustrating a step following that illustrated in FIG. 30E.

FIG. 30G is a schematic cross-sectional view illustrating a step following that illustrated in FIG. 30F.

FIG. 30H is a schematic cross-sectional view illustrating a step following that illustrated in FIG. 30G.

FIG. 30I is a schematic cross-sectional view illustrating a step following that illustrated in FIG. 30H.

FIG. 31 illustrates a modification example of a wiring structure on a junction surface and in its vicinity in the imaging device illustrated in FIG. 27.

FIG. 32 illustrates a cross-sectional configuration, in the vertical direction, of a wiring structure on a junction surface and in its vicinity in an imaging device according to Comparative example 1.

FIG. 33 illustrates a cross-sectional configuration, in the vertical direction, of a wiring structure on a junction surface and its vicinity in an imaging device according to Comparative example 2.

FIG. 34 is a schematic cross-sectional view explaining misalignment in the imaging device illustrated in FIG. 27.

FIG. 35 is a schematic cross-sectional view explaining misalignment in the imaging device illustrated in FIG. 30.

FIG. 36 illustrates a modification example of the cross-sectional configuration in the vertical direction of the imaging device illustrated in FIG. 1.

FIG. 37 illustrates a modification example of the cross-sectional configuration in the vertical direction of the imaging device illustrated in FIG. 1.

FIG. 38 illustrates a modification example of the cross-sectional configuration in the vertical direction of the imaging device illustrated in FIG. 1.

FIG. 39 illustrates a modification example of the cross-sectional configuration in the vertical direction of the imaging device illustrated in FIG. 1.

FIG. 40 illustrates a modification example of the cross-sectional configuration in the vertical direction of the imaging device illustrated in FIG. 1.

FIG. 41 illustrates a modification example of the sensor pixels and the readout circuit of the imaging device having the cross-sectional configuration illustrated in FIG. 27.

FIG. 42 illustrates a modification example of the sensor pixels and the readout circuit of the imaging device having the cross-sectional configuration illustrated in FIG. 27.

FIG. 43 illustrates an example of sensor pixels and a readout circuit in a case where the wiring structure illustrated in FIG. 27 is applied at another position.

FIG. 44 illustrates a modification example of the cross-sectional configuration in the horizontal direction of the imaging device having the cross-sectional configuration illustrated in FIG. 27.

FIG. 45 illustrates a modification example of the cross-sectional configuration in the horizontal direction of the imaging device having the cross-sectional configuration illustrated in FIG. 27.

FIG. 46 illustrates a modification example of the cross-sectional configuration in the horizontal direction of the imaging device having the cross-sectional configuration illustrated in FIG. 27.

FIG. 47 illustrates a modification example of the cross-sectional configuration in the horizontal direction of the imaging device having the cross-sectional configuration illustrated in FIG. 27.

FIG. 48 illustrates a modification example of the cross-sectional configuration in the horizontal direction of the imaging device having the cross-sectional configuration illustrated in FIG. 27.

FIG. 49 illustrates a modification example of the cross-sectional configuration in the horizontal direction of the imaging device having the cross-sectional configuration illustrated in FIG. 27.

FIG. 50 illustrates a modification example of the cross-sectional configuration in the horizontal direction of the imaging device having the cross-sectional configuration illustrated in FIG. 27.

FIG. 51 illustrates an example of a schematic configuration of an imaging system provided with any of the imaging devices according to the above-described embodiment and modification examples thereof.

FIG. 52 illustrates an example of imaging steps in the imaging system illustrated in FIG. 51.

FIG. 53 is a block diagram depicting an example of schematic configuration of a vehicle control system.

FIG. 54 is a diagram of assistance in explaining an example of installation positions of an outside-vehicle information detecting section and an imaging section.

FIG. 55 is a view depicting an example of a schematic configuration of an endoscopic surgery system.

FIG. 56 is a block diagram depicting an example of a functional configuration of a camera head and a camera control unit (CCU).

DESCRIPTION OF EMBODIMENTS

Hereinafter, some embodiments of the present disclosure are described in detail with reference to the drawings. It is to be noted that descriptions are given in the following order.

1. Embodiment (Imaging Device) . . . FIG. 1 to FIG. 7
2. Modification Examples (Imaging Device) . . . FIG. 8 to FIG. 50
3. Application Example
An example where any of the imaging devices according to the above-described embodiment and modification examples thereof is applied to an imaging system . . . FIG. 51 and FIG. 52
4. Industrial Application Examples
Industrial Application Example 1 . . . An example where any of the imaging devices according to the above-described embodiment and modification examples thereof is applied to a moving vehicle . . . FIG. 53 and FIG. 54
Industrial Application Example 2 . . . An example where any of the imaging devices according to the above-described embodiment and modification examples thereof is applied to a surgical system . . . FIG. 55 and FIG. 56

1. EMBODIMENT

Configuration

FIG. 1 illustrates an example of a schematic configuration of an imaging device 1 according to an embodiment of the present disclosure. The imaging device 1 includes three substrates (a first substrate 10, a second substrate 20, and a third substrate 30). The imaging device 1 is an imaging device of a three-dimensional structure that is configured by bonding the three substrates (the first substrate 10, the second substrate 20, and the third substrate 30) with respect to one another. The first substrate 10, the second substrate 20, and the third substrate 30 are laminated in this order.

The first substrate 10 has, on a semiconductor substrate 11, a plurality of sensor pixels 12 that perform photoelectric conversion. The plurality of sensor pixels 12 are provided in a matrix pattern in a pixel region 13 on the first substrate 10. The first substrate 10 has, for example, a plurality of drive wiring lines 14 extending in a row direction. The plurality of drive wiring lines 14 are electrically coupled to a vertical drive circuit 32a (to be described later).

The second substrate 20 has, on a semiconductor substrate 21, a readout circuit 22 that outputs a pixel signal based on an electrical charge to be outputted from each of the sensor pixels 12 one by one for each of the single or the plurality of sensor pixels 12. The plurality of readout circuits 22 are provided in a matrix pattern in a readout circuit region 23 on the second substrate 20. The second substrate 20 has, for example, a plurality of drive wiring lines extending in a row direction, and a plurality of vertical signal lines VSL (to be described later) extending in a column direction. The plurality of drive wiring lines that are provided on the second substrate 20 are electrically coupled to the vertical drive circuit 32a to be described later. The plurality of vertical signal lines VSL are electrically coupled to a column signal processing circuit 32b to be described later.

The third substrate 30 has, on a semiconductor substrate 31, a logic circuit 32 and a booster circuit 33. The logic circuit 32 controls each of the sensor pixels 12 and the readout circuits 22, and processes a pixel signal obtained from each of the readout circuits 22. The logic circuit 32 has, for example, the vertical drive circuit 32a, the column signal processing circuit 32b, a horizontal drive circuit 32c, and a system control circuit 32d, as illustrated in FIG. 2. The logic circuit 32 outputs an output voltage Vout that is obtained for each of the sensor pixels 12 to the outside.

The vertical drive circuit 32a selects the plurality of sensor pixels 12 in sequence on each row basis, for example. The vertical drive circuit 32a is, for example, electrically coupled to the plurality of drive wring lines 14, and selects the plurality of sensor pixels 12 in sequence on each row basis by outputting selection signals sequentially to the plurality of drive wring lines 14.

The column signal processing circuit 32b performs correlated double sampling (Correlated Double Sampling: CDS) processing for a pixel signal to be outputted from each of the sensor pixels 12 of a row selected by the vertical drive circuit 32a, for example. The column signal processing circuit 32b extracts a signal level of the pixel signal by performing, for example, the CDS processing to hold pixel data corresponding to the amount of light received by each of the sensor pixels 12. The column signal processing circuit 32b is, for example, electrically coupled to the plurality of vertical signal lines VSL to be described later, and obtains the pixel signal from each of the sensor pixels 12 of a row selected by the vertical drive circuit 32a through the plurality of vertical signal lines VSL. The column signal processing circuit 32b has, for example, an ADC (Analog-to-Digital) for each of the vertical signal lines VSL to convert an analog pixel signal obtained through the plurality of vertical signal lines VSL into a digital pixel signal.

The horizontal drive circuit 32c outputs the pixel data held in the column signal processing circuit 32b sequentially to the outside as the output voltage Vout, for example. The system control circuit 32d controls, for example, driving of the respective blocks (the vertical drive circuit 32a, the column signal processing circuit 32b, and the horizontal drive circuit 32c) in the logic circuit 32. The booster circuit 33 generates, for example, a power supply potential VDD of a predetermined magnitude.

FIG. 3 illustrates an example of the sensor pixels 12 and the readout circuit 22. Hereinafter, description is given for a case where the four sensor pixels 12 share the single readout circuit 22 as illustrated in FIG. 3. Here, "sharing" indicates that outputs of the plurality of sensor pixels 12 are inputted into the common readout circuit 22.

The respective sensor pixels 12 have component parts in common with respect to one another. To distinguish component parts of the respective sensor pixels 12 with respect to one another, FIG. 3 assigns identification numbers (1, 2, 3, and 4) to ending of reference signs of the component parts of the respective sensor pixels 12. Hereinafter, in a case where it is necessary to distinguish the component parts of the respective sensor pixels 12 with respect to one another, the identification numbers are assigned to the ending of the reference signs of the component parts of the respective sensor pixels 12. However, in a case where it is not necessary to distinguish the component parts of the respective sensor pixels 12 with respect to one another, the identification numbers to be assigned to the ending of the reference signs of the component parts of the respective sensor pixels 12 are to be omitted.

Each of the sensor pixels 12 has, for example, a photodiode PD, a transfer transistor TR that is electrically coupled to the photodiode PD, and a floating diffusion FD that temporarily holds an electrical charge outputted from the photodiode PD through the transfer transistor TR. For example, the single floating diffusion FD is provided for the plurality of sensor pixels 12 sharing the readout circuit 22. It is to be noted that the single floating diffusion FD may be provided for the single sensor pixel 12. In such a case, in the plurality of sensor pixels 12 sharing the readout circuit 22, there are provided wiring lines serving to electrically couple the respective floating diffusions FD with respect to one another.

The photodiode PD generates the electrical charge corresponding to the amount of received light by performing photoelectric conversion. A cathode of the photodiode PD is electrically coupled to a source of the transfer transistor TR, and an anode of the photodiode PD is electrically coupled to a region (a p-well region 41 to be described later) that is held at a reference potential VSS in the semiconductor substrate 11. A drain of the transfer transistor TR is electrically coupled to the floating diffusion FD, and a gate of the transfer transistor TR is electrically coupled to the logic circuit 32 through the drive wiring line 14 and a through-wiring line 42 to be described later. The transfer transistor TR is, for example, a CMOS (Complementary Metal Oxide Semi-conductor) transistor.

The floating diffusion FD is a floating diffusion region that temporarily holds the electrical charge outputted from the photodiode PD through the transfer transistor TR. An input terminal of the readout circuit 22 is coupled to the floating diffusion FD. Specifically, a reset transistor RST to be described later is coupled to the floating diffusion FD, and the vertical signal line VSL is further coupled to the floating diffusion FD through an amplifying transistor AMP to be described later and a selecting transistor SEL to be described later. The floating diffusion FD generates a capacitance Cfd. For example, as illustrated in FIG. 3, the capacitance Cfd is generated between a wiring line serving to couple each of the sensor pixels 12 and an FD junction electrode (or bonding portion) 17 and the region (for example, the p-well region 41) that is held at the reference potential VSS in the semiconductor substrate 11.

The readout circuit 22 has, for example, the reset transistor RST, the selecting transistor SEL, and the amplifying transistor AMP. It is to be noted that the selecting transistor SEL may be omitted on an as-needed basis. A source of the reset transistor RST (the input terminal of the readout circuit 22) is electrically coupled to the floating diffusion FD, and a drain of the reset transistor RST is electrically coupled to a wiring line to which the power supply potential VDD is applied through a through-wiring line 43 to be described later, and to a drain of the amplifying transistor AMP. A gate of the reset transistor RST is electrically coupled to the logic circuit 32 through the through-wiring line 42. A source of the amplifying transistor AMP is electrically coupled to a drain of the selecting transistor SEL, and a gate of the amplifying transistor AMP is electrically coupled to a source of the selecting transistor SEL. The source of the selecting transistor SEL (an output terminal of the readout circuit 22) is electrically coupled to the logic circuit 32 through the vertical signal line VSL and the through-wiring line 42, and a gate of the selecting transistor SEL is electrically coupled to the logic circuit 32 through the through-wiring line 42.

At the time of turning on, the transfer transistor TR transfers the electrical charge of the photodiode PD to the floating diffusion FD. The reset transistor RST resets a potential of the floating diffusion FD to a predetermined potential. At the time of turning on, the reset transistor RST resets the potential of the floating diffusion FD to the power supply potential VDD. The selecting transistor SEL controls output timing of the pixel signal from the readout circuit 22. The amplifying transistor AMP generates a signal of a voltage corresponding to a level of the electrical charge held in the floating diffusion FD as the pixel signal. The amplifying transistor AMP configures a source-follower type amplifier to output the pixel signal of a voltage corresponding to a level of the electrical charge generated in the photodiode PD. When the selecting transistor SEL turns on, the amplifying transistor AMP amplifies the potential of the floating diffusion FD to output a voltage corresponding to the potential to the logic circuit 32 through the vertical signal line VSL. The reset transistor RST, the amplifying transistor AMP, and the selecting transistor SEL are, for example, CMOS transistors.

It is to be noted that the selecting transistor SEL may be provided between the power supply line VDD and the amplifying transistor AMP. In such a case, the drain of the reset transistor RST is electrically coupled to the wiring line to which the power supply potential VDD is applied, and to the drain of the selecting transistor SEL. The source of the selecting transistor SEL is electrically coupled to the drain of the amplifying transistor AMP, and the gate of the selecting transistor SEL is electrically coupled to the logic circuit 32 through the through-wiring line 42. The source of the amplifying transistor AMP (an output terminal of the readout circuit 22) is electrically coupled to the logic circuit 32 through the vertical signal line VSL and the through-wiring line 42, and the gate of the amplifying transistor AMP is electrically coupled to the source of the reset transistor RST.

FIG. 4 illustrates an example of a cross-sectional configuration in a vertical direction of the imaging device 1. FIG. 4 exemplifies a cross-sectional configuration of a location that is opposed to the pixel region 13 (the sensor pixels 12) and a cross-sectional configuration of a region surrounding the pixel region 13 in the imaging device 1. The imaging device 1 is configured to laminate the first substrate 10, the second substrate 20, and the third substrate 30 in this order, and further includes a color filter layer 40 and a light-receiving lens 50 on the back surface side (light-entering surface side) of the first substrate 10. The color filter layer 40 and the light-receiving lens 50 are provided, for example, one by one for each of the sensor pixels 12. In other words, the imaging device 1 is an imaging device of a backside illumination type.

The first substrate 10 is configured to laminate an insulating film (or insulating layer) 19 on the semiconductor substrate 11. The first substrate 10 has the insulating film 19 as an interlayer insulating film. The insulating film 19 is provided between the semi-conductor substrate 11 and the second substrate 20. The first substrate 10 has the plurality of drive wiring lines 14 in the insulating film 19. The plurality of drive wiring lines 14 are provided one by one on each row basis in the plurality of sensor pixels 12 disposed in a matrix pattern. The semiconductor substrate 11 includes a silicon substrate. The semiconductor substrate 11 has, for example, the p-well region 41 on a portion of a surface and in the vicinity of such a location, and has the photodiode PD of a conductivity type that is different from that of the p-well region 41 in a region other than the p-well region 41 (a region deeper than the p-well region 41). The p-well region 41 includes a p-type semiconductor region. The photodiode PD includes a semi-conductor region of a conductivity type (specifically, an n-type) that is different from that of the p-well region 41. The semiconductor substrate 11 has the floating diffusions FD in the p-well region 41 as a semiconductor region of a conductivity type (specifically, the n-type) that is different from that of the p-well region 41.

The first substrate 10 has the photodiode PD, the transfer transistor TR, and the floating diffusion FD for each of the sensor pixels 12. The first substrate 10 is configured in such a manner that the transfer transistor TR and the floating diffusion FD are provided at a part on the front surface side of the semiconductor substrate 11 (the opposite side of the light-entering surface side, the second substrate 20 side). The first substrate 10 has an element separating section that separates each of the sensor pixels 12. The element separating section is disposed to extend in a normal direction of the semiconductor substrate 11 (in a direction vertical to a surface of the semi-conductor substrate 11). The element separating section is provided between the two sensor pixels 12 adjacent to each other. The element separating section separates electrically the two sensor pixels 12 adjacent to each other. The element separating section includes, for example, a silicon oxide. The first substrate 10 further has, for example, a fixed charge film in contact with a back surface of the semiconductor substrate 11. The fixed charge film is negatively charged to suppress generation of a dark current caused by an interface state of the light-receiving surface side of the semiconductor substrate 11. The fixed charge film includes, for example, an insulating film having a negative fixed charge. Examples of a material of such an insulating film include a hafnium oxide, a zirconium oxide, an aluminum oxide, a titanium oxide, or a tantalum oxide. A hole storage layer is provided at an interface on the light-receiving surface side of the semiconductor substrate 11 by an electrical field induced by the fixed charge film. The hole storage layer serves to suppress generation of electrons from the interface. The color filter layer 40 is provided on the back surface side of the first substrate 10. The color filter layer 40 is provided, for example, in contact with the fixed charge film, and is provided at a position that is opposed to the sensor pixel 12 with the fixed charge film interposed therebetween. The light-receiving lens 50 is provided, for example, in contact with the color filter layer 40, and is provided at a position that is opposed to the sensor pixel 12 with the color filter layer 40 and the fixed charge film interposed therebetween.

The first substrate 10 has, in the insulating film 19, a plurality of FD through-wiring lines 15 and a plurality of VSS through-wiring lines 16. The plurality of FD through-wiring lines 15 and the plurality of VSS through-wiring lines 16 extend through the insulating film 19. The FD through-wiring line 15 corresponds to a specific example of a "third through-wiring line" of the present disclosure. The VSS through-wiring line 16 corresponds to a specific example of a "second through-wiring line" of the present disclosure. Each of the VSS through-wiring lines 16 is disposed at a spacing interval between the two FD through-wiring lines 15 adjacent to each other among the plurality of FD through-wiring lines 15. Further, the first substrate 10 has, in the insulating film 19, a plurality of FD junction electrodes 17 and a single VSS junction electrode (or bonding portion) 18. The plurality of FD junction electrodes 17 and the single VSS junction electrode 18 are both exposed on a surface of the insulating film 19. The FD junction electrode 17 corresponds to a specific example of a "first junction electrode" of the present disclosure. The VSS junction electrode 18 corresponds to a specific example of a "wiring electrode" of the present disclosure. The plurality of FD through-wiring lines 15 and the plurality of VSS through-wiring lines 16 are provided in a region that is opposed to the pixel region 13. Each of the VSS junction electrodes 18 is disposed in the same plane as each of the FD junction electrodes 17. The VSS junction electrode 18 is disposed at a spacing interval between the two FD junction electrodes 17 adjacent to each other among the plurality of FD junction electrodes 17.

In a case where the single floating diffusion FD is provided for the plurality of sensor pixels 12 sharing the readout circuit 22, the plurality of FD through-wiring lines 15 are provided one by one for each of the plurality of sensor pixels 12 sharing the readout circuit 22. In a case where the single floating diffusion FD is provided for the single sensor pixels 12, the plurality of FD through-wiring lines 15 are provided one by one for each of the sensor pixels 12.

Each of the FD through-wiring lines 15 is coupled to the floating diffusion FD and the FD junction electrode 17. In a case where the single floating diffusion FD is provided for the plurality of sensor pixels 12 sharing the readout circuit 22, the plurality of VSS through-wiring lines 16 are provided one by one for each of the plurality of sensor pixels 12 sharing the readout circuit 22. In a case where the single floating diffusion FD is provided for the single sensor pixels 12, the plurality of VSS through-wiring lines 16 are provided one by one for each of the sensor pixels 12. Each of the VSS through-wiring lines 16 is coupled to the p-well region 41 and the VSS junction electrode 18. In either case, the plurality of VSS through-wiring lines 16 are provided one by one for each of the readout circuits 22.

The second substrate 20 is configured to laminate an insulating layer 28 on the semi-conductor substrate 21. The second substrate 20 has the insulating layer 28 as an interlayer insulating film. The insulating layer 28 is provided between the semiconductor substrate 21 and the first substrate 10. The semiconductor substrate 21 includes a silicon substrate. The second substrate 20 has the single readout circuit 22 for each of the four sensor pixels 12. The second substrate 20 is configured in such a manner that the readout circuit 22 is provided at a part on the front surface side of the semi-conductor substrate 21 (the third substrate 30 side). The second substrate 20 is bonded to the first substrate 10 with the front surface of the semiconductor substrate 21 directed toward the front surface side of the semiconductor substrate 11.

The second substrate 20 has, in the insulating layer 28, a plurality of FD through-wiring lines 26 and a plurality of VSS through-wiring lines 27. The plurality of FD through-wiring lines 26 and the plurality of VSS through-wiring lines 27 extend through the insulating layer 28. The FD through-wiring line 26 corresponds to a specific example of the "third through-wiring line" of the present disclosure. The VSS through-wiring line 27 corresponds to a specific example of the "second through-wiring line" of the present disclosure. Each of the VSS through-wiring lines 27 is disposed at a spacing interval between the two FD through-wiring lines 26 adjacent to each other among the plurality of FD through-wiring lines 26. Further, the second substrate 20 has, in the insulating layer 28, a plurality of FD junction electrodes (or bonding portions) 24 and a single VSS junction electrode (or bonding portion) 25. The plurality of FD junction electrodes 24 and the single VSS junction electrode 25 are both exposed on a surface of the insulating layer 28. The FD junction electrode 24 corresponds to a specific example of the "first junction electrode" of the present disclosure. The VSS junction electrode 25 corresponds to a specific example of the "wiring electrode" of the present disclosure. The plurality of FD junction electrodes 24 are provided one by one for each of the FD junction electrodes 17 of the first substrate 10. The FD junction electrode 24 is electrically coupled to the FD junction electrode 17. The FD junction electrode 24 and the FD junction electrode 17 include, for example, a copper material, and are bonded to each other. The VSS junction electrode 25 is electrically coupled to the VSS junction electrode 18 of the first substrate 10. The VSS junction electrode 25 and the VSS junction electrode 18 include, for example, a copper material, and are bonded to each other. Each of the VSS junction electrodes 25 is, for example, disposed in the same plane as each of the FD junction electrodes 24. The VSS junction electrode 25 is disposed at a spacing interval between the two FD junction electrodes 24 adjacent to each other among the plurality of FD junction electrodes 24. The sensor pixels 12 and the readout circuits 22 are electrically coupled with respect to one another through junction of the FD junction electrodes 17 and 24.

For example, as illustrated in FIG. 5, each of the FD junction electrodes 17 and 24 is disposed at a position that is opposed to the floating diffusion FD. FIG. 5 illustrates a cross-sectional configuration example in the FD junction electrode 17 and the VSS junction electrode 18, or a cross-sectional configuration example in the FD junction electrode 24 and the VSS junction electrode 25. In a case where the floating diffusion FD is shared by the four sensor pixels 12, the floating diffusion FD is provided at a central part of a region including the four sensor pixels 12. Therefore, in a case where the floating diffusion FD is shared by the four sensor pixels 12, each of the FD junction electrodes 17 and 24 is disposed at a position that is opposed to the central part of the region including the four sensor pixels 12. Each of the FD junction electrodes 17 and 24 takes a square shape, for example.

For example, as illustrated in FIG. 5, the VSS junction electrodes 18 and 25 are each disposed in a lattice-shaped pattern surrounding each of the FD junction electrodes 17 and 24 in a laminated in-plane direction. As viewed from a laminated direction of the imaging device 1, each of the VSS junction electrodes 18 and 25 has an opening at each of locations that is opposed to the four sensor pixels 12. The VSS junction electrode 18 takes, for example, a lattice shape in which a plurality of junction wiring lines extending in a first array direction (for example, a row direction) and a plurality of junction wiring lines extending in a second array direction (for example, a column direction) are disposed in the same plane to intersect (to be made orthogonal) with respect to one another. Similarly, the VSS junction electrode 25 takes, for example, a lattice shape in which the plurality of junction wiring lines extending in the first array direction (for example, the row direction) and the plurality of junction wiring lines extending in the second array direction (for example, the column direction) are disposed in the same plane to intersect (to be made orthogonal) with respect to one another. Here, the first array direction is one array direction (for example, the row direction) of the plurality of floating diffusions FD (or the plurality of sensor pixels 12). Further, the second array direction is the other array direction (for example, the column direction) of the plurality of floating diffusions FD (or the plurality of sensor pixels 12).

The plurality of FD junction electrodes 24 and the plurality of FD through-wiring lines 26 are provided in a region that is opposed to the pixel region 13. The plurality of FD through-wiring lines 26 are provided one by one for each of the FD through-wiring lines 15. Each of the FD through-wiring lines 26 is coupled to the FD junction electrode 24 and the readout circuit 22 (specifically, a gate of the amplifying transistor AMP). The plurality of VSS junction electrodes 25 and the plurality of VSS through-wiring lines 27 are provided in a region that is opposed to the pixel region 13. The plurality of VSS through-wiring lines 27 are provided one by one for each of the VSS through-wiring lines 16. Each of the VSS through-wiring lines 27 is coupled to the VSS junction electrode 25 and a region to which the reference potential VSS is applied in the second substrate 20 (a reference potential region of the readout circuit 22).

A laminate including the first substrate 10 and the second substrate 20 has, in a region surrounding the pixel region 13, a plurality of through-wiring lines 42 that extend through the first substrate 10 and the second substrate 20. The through-wiring line 42 corresponds to a specific example of a "first through-wiring line" of the present disclosure. The plurality of through-wiring lines 42 are provided one by one for each of the drive wiring lines 14 of the first substrate 10. Each of the through-wiring lines 42 is coupled to the drive wiring line 14 and the vertical drive circuit 32a of the logic circuit 32. Therefore, the logic circuit 32 controls the sensor pixels 12 and the readout circuits 22 through the plurality of through-wiring lines 42. Each of the through-wiring lines 42 includes, for example, a TSV (Through Silicon Via). It is to be noted that, in place of each of the through-wiring lines 42, a through-wiring line extending through the insulating film 19 (hereinafter referred to as a "through-wiring line a"), a through-wiring line extending through the insulating layer 28 (hereinafter referred to as a "through-wiring line b"), a junction electrode coupled to the through-wiring line a (hereinafter referred to as "junction electrode c"), and a junction electrode coupled to the through-wiring line b (hereinafter referred to as a "junction electrode d") may be provided. In such a case, the junction electrodes c and d include, for example, copper, and the junction electrode c and the junction electrode d are bonded to each other.

The laminate including the first substrate 10 and the second substrate 20 further has, around the pixel region 13, a through-wiring line 43 and a through-wiring line 44 each of which extends through the first substrate 10 and the second substrate 20. Each of the through-wiring lines 43 and 44 includes, for example, the TSV. The through-wiring line 43 is coupled to the booster circuit 33 of the third substrate 30 to be held at the power supply potential VDD. The power supply potential VDD is a value within the range of 2.5 V to 2.8 V, for example. The through-wiring line 44 is electrically coupled to a region to which the reference potential VSS is applied in the third substrate 30 (a reference potential region of the third substrate 30) to be held at the reference potential VSS. The reference potential VSS is, for example, zero volt.

The third substrate 30 is, for example, configured to laminate an insulating layer 36 on the semiconductor substrate 31. The third substrate 30 has the insulating layer 36 as an interlayer insulating film. The insulating layer 36 is provided between the semi-conductor substrate 31 and the second substrate 20. The semiconductor substrate 31 includes a silicon substrate. The third substrate 30 is configured in such a manner that the logic circuit 32 is provided at a part on the front surface side of the semiconductor substrate 31 (the second substrate 20 side). The third substrate 30 is bonded to the second substrate 20 with the front surface of the semiconductor substrate 31 directed toward the back surface side of the semiconductor substrate 21.

FIG. 6A illustrates an example of a wiring structure serving to take out the output voltage Vout to be outputted from the logic circuit 32 from the imaging device 1. FIG. 6B illustrates an example of a wiring structure serving to provide a reference potential to the booster circuit 33. FIG. 6C illustrates an example of a wiring structure serving to provide the reference potential VSS to the third substrate 30. The laminate including the first substrate 10 and the second substrate 20 has, around the pixel region 13, openings 45a, 46a, and 47a each of which extends through the first substrate 10 and the second substrate 20. A connection pad 45b is provided on a bottom surface of the opening 45a, and the connection pad 45b is coupled to an output terminal of the logic circuit 32. For example, a bonding wire is coupled to the connection pad 45b. A connection pad 46b is provided on a bottom surface of the opening 46a, and the connection pad 46b is coupled to the booster circuit 33. For example, a bonding wire is coupled to the connection pad 46b. A connection pad 47b is provided on a bottom surface of the opening 47a, and the connection pad 47b is coupled to a region for which the reference potential VSS is applied in the third substrate 30. For example, a bonding wire is coupled to the connection pad 47b.

It is to be noted that a through-wiring line 45c may be provided inside the opening 45a, as illustrated in FIG. 7A. In such a case, for example, a connection pad 45d may be provided on a surface of the first substrate 10 on which the through-wiring line 45c is exposed, and a bonding wire may be coupled to the connection pad 45d. Further, a through-wiring line 46c may be provided inside the opening 46a, as illustrated in FIG. 7B. In such a case, for example, a connection pad 46d may be provided on a surface of the first substrate 10 on which the through-wiring line 46c is exposed, and a bonding wire may be coupled to the connection pad 46d. In addition, a through-wiring line 47c may be provided inside the opening 47a, as illustrated in FIG. 7C. In such a case, for example, a connection pad 47d may be provided on a surface of the first substrate 10 on which the through-wiring line 47c is exposed, and a bonding wire may be coupled to the connection pad 47d.

Advantageous Effects

Next, description is given for advantageous effects of the imaging device 1 according to the present embodiment.

Heretofore, miniaturization of area per pixel in an imaging device of a two-dimensional structure has been achieved through adoption of microfabrication processes and improvement of the mounting density. In recent years, to achieve further miniaturization of an imaging device and high-density pixel mounting, the imaging device of a three-dimensional structure has been developed. In the imaging device of such a three-dimensional structure, for example, a photodiode, a circuit serving to read out an electrical charge obtained by the photodiode (a readout circuit), a circuit serving to control readout of the electrical charge from the photodiode (a control circuit), etc. are disposed on two laminated semiconductor substrates.

In the present embodiment, the plurality of sensor pixels 12 are disposed on the first substrate 10; the plurality of readout circuits 22 are disposed on the second substrate 20; and the logic circuit 32 is disposed on the third substrate 30. This allows each of the sensor pixels 12 to be configured in a sufficiently large size, ensuring that reproduced images of a wide dynamic range are obtained. Further, this makes it possible to take the sufficiently large size for the readout circuit 22, which avoids an increase in a dark-time noise such as RTS noise, for example. Additionally, this makes it possible to take the sufficiently large size for the logic circuit 32, which allows for sufficiently increased output data rate, for example, thereby obtaining moving images at high frame rate. Further, in the present embodiment, the sensor pixels 12 and the readout circuits 22 are electrically coupled with respect to one another through junction of the FD junction electrodes 17 and 24 that are provided in a region that is opposed to the pixel region 13. This makes it possible to reduce a unit pixel size as compared with a case where electrical coupling of the sensor pixels 12 and the readout circuits 22 is performed in a single pixel on a common substrate.

Further, in the present embodiment, in the laminate including the first substrate 10 and the second substrate 20, the plurality of through-wiring lines 42 are disposed in a region surrounding the pixel region 13. The sensor pixels 12 and the readout circuits 22 are controlled by the logic circuit 32 through the plurality of through-wiring lines 42. This ensures that each of the through-wiring lines 42 is disposed away from the FD through-wiring lines 15 and 26 that are electrically coupled to the floating diffusion FD, as compared with a case where each of the through-wiring lines 42 is disposed in a region that is opposed to the pixel region 13. As a result, it is possible to reduce signal interference between each of the through-wiring lines 42 and each of the FD through-wiring lines 15 and 26. This allows for achievement of further noise reduction.

Additionally, in the present embodiment, the plurality of VSS through-wiring lines 16 are provided one by one for each of the readout circuits 22 in a region that is located in the insulating film 19 and is opposed to the pixel region 13, and the plurality of VSS through-wiring lines 27 are provided one by one for each of the readout circuits 22 in a region that is located in the insulating layer 28 and is opposed to the pixel region 13. Further, in the present embodiment, each of the VSS through-wiring lines 16 is electrically coupled to a region held at the reference potential VSS in the first substrate 10 (the p-well region 41), and each of the VSS through-wiring lines 27 is electrically coupled to a region held at the reference potential VSS in the second substrate 20. This makes it possible to cause each of the VSS through-wiring lines 16 to function as a shield that reduces the signal interference between the FD through-wiring lines 15 adjacent to each other, and further to cause each of the VSS through-wiring lines 27 to function as a shield that reduces the signal interference between the FD through-wiring lines 26 adjacent to each other. This allows for achievement of further noise reduction.

Moreover, in the present embodiment, the plurality of FD through-wiring lines 15 that are electrically coupled to the plurality of FD junction electrodes 17 respectively are provided in the region that is located in the insulating film 19 and is opposed to the pixel region 13, and the plurality of FD through-wiring lines 26 that are electrically coupled to the plurality of FD junction electrodes 24 respectively are provided in the region that is located in the insulating layer 28 and is opposed to the pixel region 13. Further, in the present embodiment, each of the VSS through-wiring lines 16 is disposed at a spacing interval between the two FD through-wiring lines 15 adjacent to each other in the plurality of FD through-wiring lines 15, and each of the VSS through-wiring lines 27 is disposed at a spacing interval between the two FD through-wiring lines 26 adjacent to each other in the plurality of FD through-wiring lines 26. This makes it possible to cause each of the VSS through-wiring lines 16 to function as a shield that reduces the signal interference between the FD through-wiring lines 15 adjacent to each other, and further to cause each of the VSS through-wiring lines 27 to function as a shield that reduces the signal interference between the FD through-wiring lines 26 adjacent to each other. This allows for achievement of further noise reduction.

Further, in the present embodiment, the VSS junction electrodes 18 (wiring electrodes) coupled electrically to each of the VSS through-wiring lines 16 are provided in the insulating film 19, and the VSS junction electrodes 18 are each disposed in a lattice-shaped pattern surrounding each of the FD junction electrodes 17. Additionally, in the present embodiment, the VSS junction electrodes 25 (wiring electrodes) coupled electrically to each of the VSS through-wiring lines 27 are provided in the insulating layer 28, and the VSS junction electrodes 25 are each disposed in a lattice-shaped pattern surrounding each of the FD junction electrodes 24. This makes it possible to cause the VSS junction electrode 18 to function as a shield that reduces the signal interference between the FD junction electrodes 17 adjacent to each other, and further to cause each of the VSS junction electrodes 25 to function as a shield that reduces the signal interference between the FD junction electrodes 24 adjacent to each other. This allows for achievement of further noise reduction.

2. MODIFICATION EXAMPLES

Hereinafter, description is given for modification examples of the imaging device 1 according to the above-described embodiment. It is to be noted that, in the following modification examples, configurations in common to those of the above-described embodiment are denoted with the same reference numerals.

Modification Example A

FIG. 8 illustrates a modification example of a cross-sectional configuration in the FD junction electrode 17 and the VSS junction electrode 18, or a modification example of a cross-sectional configuration in the FD junction electrode 24 and the VSS junction electrode 25. In the imaging device 1 according to the above-described embodiment, for example, as illustrated in FIG. 8, each of the VSS junction electrodes 18 may include a plurality of junction electrodes 18a, and a wiring line 18b that couples electrically the plurality of junction electrodes 18a with respect to one another. Further, in the imaging device 1 according to the above-described embodiment, for example, as illustrated in FIG. 8, each of the VSS junction electrodes 25 may include a plurality of junction electrodes 25a, and a wiring line 25b that couples electrically the plurality of junction electrodes 25a with respect to one another.

In such a case, the plurality of junction electrodes 18a are provided one by one for each of the VSS through-wiring lines 16, and the plurality of junction electrodes 25a are provided one by one for each of the VSS through-wiring lines 27. In other words, the first substrate 10 has, in the insulating film 19, the plurality of junction electrodes 18a that are respectively coupled electrically to the plurality of VSS through-wiring lines 16, and the second substrate 20 has, in the insulating layer 28, the plurality of junction electrodes 25a that are respectively coupled electrically to the plurality of VSS through-wiring lines 27. Each of the junction electrode 18a and the junction electrode 25a corresponds to a specific example of a "second junction electrode" of the present disclosure. Further, each of the plurality of junction electrodes 18a is disposed at a spacing interval between the two FD junction electrodes 17 adjacent to each other in the plurality of FD junction electrodes 17, and each of the plurality of junction electrodes 25a is disposed at a spacing interval between the two FD junction electrodes 24 adjacent to each other in the plurality of FD junction electrodes 24.

Even in such a case, it is possible to cause the VSS junction electrode 18 to function as a shield that reduces the signal interference between the FD junction electrodes 17 adjacent to each other, and further to cause each of the VSS junction electrodes 25 to function as a shield that reduces the signal interference between the FD junction electrodes 24 adjacent to each other. This allows for achievement of further noise reduction.

Modification Example B

FIG. 9 illustrates a modification example of the sensor pixels 12 and the readout circuit 22. FIG. 10 illustrates a modification example of a cross-sectional configuration in the FD junction electrode 17 and the VSS junction electrode 18, or a modification example of a cross-sectional configuration in the FD junction electrode 24 and the VSS junction electrode 25.

In the imaging device 1 according to the above-described embodiment and the modification example thereof, for example, the single readout circuit 22 may share the eight sensor pixels 12 (the 2×4 sensor pixels 12), as illustrated in FIG. 9. At this time, for example, as illustrated in FIG. 10, the VSS junction electrodes 18 and 25 are each disposed in a lattice-shaped pattern surrounding the FD junction electrodes 17 and 24 in a laminated in-plane direction, respectively. The VSS junction electrode 18 takes, for example, a lattice shape formed in the same plane such that a plurality of junction wiring lines extending in the first direction and a plurality of junction wiring lines extending in the second direction intersect (are made orthogonal) with respect to one another. Similarly, the VSS junction electrode 25 takes, for example, a lattice shape formed in the same plane such that a plurality of junction wiring lines extending in the first direction and a plurality of junction wiring lines extending in the second direction intersect (are made orthogonal) with respect to one another. Here, the first direction is a direction intersecting with the array direction (for example, a row direction or a column direction) of the plurality of floating diffusions FD (or the plurality of sensor pixels 12). Further, the second direction is a direction intersecting with the array direction (for example, the row direction or the column direction) of the plurality of floating diffusions FD (or the plurality of sensor pixels 12), and a direction intersecting (being made orthogonal) with the first direction as well. Such a layout allows for an increase in a spacing interval between the two FD junction electrodes 17 adjacent to each other, and an increase in a spacing interval between the two FD junction electrodes 24 adjacent to each other, as compared with a layout illustrated in FIG. 5, which makes it possible to also increase a distance between the FD junction electrode 17 and the VSS junction electrode 18, or a distance between the FD junction electrode 24 and the VSS junction electrode 25. As a result, even in a case of a more microscopic unit pixel size, it is possible to dispose the VSS junction electrode 18 between the two FD junction electrodes 17 adjacent to each other, and to dispose the VSS junction electrode 25 between the two FD junction electrodes 24 adjacent to each other. Therefore, even in a case of a more microscopic unit pixel size, it is possible to cause the VSS junction electrode 18 to function as a shield that reduces the signal interference between the FD junction electrodes 17 adjacent to each other, and further to cause each of the VSS junction electrodes 25 to function as a shield that reduces the signal interference between the FD junction electrodes 24 adjacent to each other. This allows for achievement of further noise reduction.

Modification Example C

FIG. 11 illustrates a modification example of a cross-sectional configuration in the vertical direction of the imaging device 1. In the imaging device 1 according to the above-described embodiment and the modification example thereof, an insulating layer 71 provided on the same layer as the FD junction electrode 17 and the VSS junction electrode 18 in the insulating film 19 provided on the first substrate 10 may be disposed using an insulating material having a dielectric constant lower than that of any location other than the insulating layer 71 in the insulating film 19 provided on the first substrate 10. Further, in the imaging device 1 according to the above-described embodiment and the modification example thereof, an insulating layer 72 provided on the same layer as the FD junction electrode 24 and the VSS junction electrode 25 in the insulating layer 28 provided on the second substrate 20 may be disposed using an insulating material having a dielectric constant lower than that of any location other than the insulating layer 72 in the insulating layer 28 provided on the second substrate 20. In such a case, it is possible to reduce the capacitance Cfd, which allows for suppression of deterioration in the conversion efficiency.

Further, in the imaging device 1 according to the above-described embodiment and the modification example thereof, for example, as illustrated in FIG. 12, an insulating layer 73 provided on the same layer as a connection wiring line 47 (for example, a via) coupled to the FD junction electrode 17 and the VSS junction electrode 18 in the insulating film 19 provided on the first substrate 10 may be disposed using an insulating material having a dielectric constant lower than that of any location other than the insulating layers 71 and 73 in the insulating film 19 provided on the first substrate 10. Further, an insulating layer 74 provided on the same layer as a connection wiring line 48 (for example, a via) coupled to the FD junction electrode 24 and the VSS junction electrode 25 in the insulating layer 28 provided on the second substrate 20 may be disposed using an insulating material having a dielectric constant lower than that of any location other than the insulating layers 72 and 74 in the insulating layer 28 provided on the second substrate 20. In such a case, it is possible to further reduce the capacitance Cfd, which allows for suppression of deterioration in the conversion efficiency.

Modification Example D

FIG. 13 illustrates a modification example of a cross-sectional configuration in the vertical direction of the imaging device 1. In the imaging device 1 according to the above-described embodiment and the modification example thereof, for example, as illustrated in FIG. 13, the connection wiring line 48 to be coupled to the VSS junction electrode 25 may be omitted, and a wiring line serving to couple the VSS junction electrode 25 and a region to which the reference potential VSS is applied in the second substrate 20 may not be provided in a region that is opposed to the pixel region 13. At this time, each of the VSS through-wiring lines 16 is electrically coupled to the p-well region 41, and each of the VSS through-wiring lines 27 is electrically coupled to the region to which the reference potential VSS is applied in the second substrate 20. Even in such a case, it is possible to cause each of the VSS through-wiring lines 16 to function as a shield that reduces the signal interference between the FD through-wiring lines 15 adjacent to each other, and further to cause each of the VSS through-wiring lines 27 to function as a shield that reduces the signal interference between the FD through-wiring lines 26 adjacent to each other. This allows for achievement of further noise reduction.

Modification Example E

FIG. 14 illustrates a modification example of a cross-sectional configuration in the vertical direction of the imaging device 1. In the imaging device 1 according to the above-described embodiment and the modification example thereof, for example, as illustrated in FIG. 14, the VSS junction electrodes 18 and 25 may be omitted, and a wiring line serving to couple the p-well region 41 of the first substrate 10 and the region to which the reference potential VSS is applied in the second substrate 20 may not be provided in a region that is opposed to the pixel region 13. At this time, each of the VSS through-wiring lines 16 is electrically coupled to the p-well region 41, and each of the VSS through-wiring lines 27 is electrically coupled to the region to which the reference potential VSS is applied in the second substrate 20. Even in such a case, it is possible to cause each of the VSS through-wiring lines 16 to function as a shield that reduces the signal interference between the FD through-wiring lines 15 adjacent to each other, and further to cause each of the VSS through-wiring lines 27 to function as a shield that reduces the signal interference between the FD through-wiring lines 26 adjacent to each other. This allows for achievement of further noise reduction.

Modification Example F

FIG. 15 illustrates a modification example of a cross-sectional configuration in the vertical direction of the imaging device 1. In the imaging device 1 according to the above-described embodiment and the modification example thereof, for example, as illustrated in FIG. 15, the VSS junction electrodes 18 and 25, as well as the connection wiring lines 47 and 48 to be respectively coupled to the VSS junction electrodes 18 and 25 may be omitted, and the wiring line serving to couple the p-well region 41 of the first substrate 10 and the region to which the reference potential VSS is applied in the second substrate 20 may not be provided in a region that is opposed to the pixel region 13. At this time, each of the VSS through-wiring lines 16 is electrically coupled to the p-well region 41, and each of the VSS through-wiring lines 27 is electrically coupled to the region to which the reference potential VSS is applied in the second substrate 20. Even in such a case, it is possible to cause each of the VSS through-wiring lines 16 to function as a shield that reduces the signal interference between the FD through-wiring lines 15 adjacent to each other, and further to cause each of the VSS through-wiring lines 27 to function as a shield that reduces the signal interference between the FD through-wiring lines 26 adjacent to each other. This allows for achievement of further noise reduction.

Modification Example G

FIG. 16 illustrates a modification example of the sensor pixels 12 and the readout circuit 22. As the wiring line serving to couple the p-well region 41 of the first substrate 10 and the region to which the reference potential VSS is applied in the second substrate 20 in the above-described modification example D, E, and F, a through-wiring line 44 may be used. In such a case, it is possible to set a potential of the p-well region 41 of the first substrate 10 and a potential of the region to which the reference potential VSS is applied in the second substrate 20 at a value (the reference potential VSS) that is equal to each other.

Modification Example H

FIG. 17 illustrates a modification example of the readout circuit 22. In the imaging device 1 according to the above-described embodiment and the modification example thereof, for example, as illustrated in FIG. 17, the readout circuit 22 may have a negative feedback circuit including an operational amplifier OP and a feedback capacitor Cf in place of the amplifying transistor AMP and the selecting transistor SEL. The feedback capacitor Cf is coupled to a first input terminal of the operational amplifier OP and an output terminal of the operational amplifier OP. The reset transistor RST is coupled to a wiring line to which the power supply potential VDD is applied, the first input terminal of the operational amplifier OP, and a first terminal of the feedback capacitor Cf. The wiring line to which the power supply potential VDD is applied is coupled to a second input terminal of the operational amplifier OP. For example, the power supply potential VDD and the reference potential VSS are applied to the operational amplifier OP as a supply voltage.

In the present modification example, the readout circuit 22 is provided with the negative feedback circuit including the operational amplifier OP and the feedback capacitor Cf. Because this ensures that a charge detection capacitance corresponds to the feedback capacitor Cf, the high conversion efficiency is achieved even if the capacitance Cfd of the floating diffusion FD is great.

FIG. 18 illustrates a modification example of the sensor pixels 12 and the readout circuit 22. In a case where the readout circuit 22 illustrated in FIG. 17 is provided in the imaging device 1 according to any of the above-described modification examples D to G, a reference potential VSS1 of the first substrate 10 may be lower than a reference potential VSS2 of the second substrate 20. The reference potential VSS1 is lower than the reference potential VSS2, and is, for example, within the range of −0.5 to −1 V. The reference potential VSS2 is, for example, a potential equal to the above-described reference potential VSS, and is, for example, zero volt. It is to be noted that a region to which the reference potential VSS2 is applied in the second substrate 20 is equivalent to the region to which the reference potential VSS is applied in the second substrate 20 according to the above-described embodiment and the modification example thereof.

In such a case, in the imaging device 1, a laminate including the first substrate 10 and the second substrate 20 may have a through-wiring line 45 in a region surrounding the pixel region 13, as illustrated in an example of FIG. 19. The through-wiring line 45 corresponds to a specific example of a "fourth through-wiring line" of the present disclosure. The through-wiring line 45 is a through-wiring line to which the reference potential VSS1 is applied, and includes, for example, the TSV. The through-wiring line 45 is electrically coupled to a negative booster circuit 34 to be described later, and to the p-well region 41 of the first substrate 10.

Further, in the imaging device 1, a laminate including the second substrate 20 and the third substrate 30 may have a through-wiring line 46 in a region surrounding the pixel region 13, as illustrated in the example of FIG. 19. The through-wiring line 46 is a through-wiring line to which the reference potential VSS2 is applied, and includes, for example, the TSV. The through-wiring line 46 is electrically coupled to a region to which the reference potential VSS2 is applied in the third substrate 30, and a region to which the reference potential VSS2 is applied in the second substrate 20.

Additionally, in the imaging device 1, the third substrate 30 has the negative booster circuit 34 that generates the reference potential VSS1 of a predetermined magnitude. The negative booster circuit 34 makes a reference potential of the first substrate 10 lower than a reference potential of the second substrate 20 by controlling the reference potential of the first substrate 10 through the through-wiring line 45.

In the present modification example, the reference potential VSS1 of the first substrate 10 is lower than the reference potential VSS2 of the second substrate 20. This makes it possible to expand a dynamic range of the floating diffusion FD, as compared with a case where the reference potentials of the first substrate 10 and the second substrate 20 are equal to each other. As a result, it is possible to suppress faulty transfer of electrical charges, or occurrence of black sinking at the time of image display.

Modification Example I

FIG. 20 illustrates an example of a cross-sectional configuration of a transistor in the first substrate 10. FIG. 21 illustrates an example of a cross-sectional configuration of a transistor in the second substrate 20. In the imaging device 1 according to the above-described embodiment and the modification example thereof, the transistor in the first substrate 10 and the transistor in the second substrate 20 may be different from each other in a design condition.

For example, as illustrated in FIG. 20, the transistor in the first substrate 10 has a gate insulating film 51 disposed on the semiconductor substrate 11; a gate electrode 52 disposed in contact with the gate insulating film 51; a sidewall layer 53 disposed in contact with a side surface of the gate electrode 52; as well as a source region and a drain region that are disposed on a surface of the semiconductor substrate 11. Around the transistor in the first substrate 10, a silicon oxide film 54 disposed to cover the gate insulating film 51, the gate electrode 52, and the sidewall layer 53; a silicon nitride film 55 disposed in contact with the silicon oxide film 54; an insulating layer 56 disposed in contact with the silicon nitride film 55; a through-wiring line 58 coupled electrically to the gate electrode 52; and a through-wiring line 57 coupled electrically to the floating diffusion FD are disposed, as illustrated in an example of FIG. 20. The silicon oxide film 54 is provided to protect a front surface portion of the semiconductor substrate 11, or uniformize a thickness of a silicon oxide film at the front surface portion of the semiconductor substrate 11 at the time of ion implantation. The silicon nitride film 55 has a role as an etching stopper in forming through holes to dispose the through-wiring lines 57 and 58 on the insulating layer 56.

For example, as illustrated in FIG. 21, the transistor in the second substrate 20 has a gate insulating film 61 disposed on the semiconductor substrate 21; a gate electrode 62 disposed in contact with the gate insulating film 61; a sidewall layer 63 disposed in contact with a side surface of the gate electrode 62; as well as a source region and a drain region (an impurity diffused region 69) that are disposed on a surface of the semiconductor substrate 21. Around the transistor in the second substrate 20, a silicon oxide film 64 disposed to cover the gate insulating film 61, the gate electrode 62, and the sidewall layer 63; a silicon nitride film 65 disposed in contact with the silicon oxide film 64; an insulating layer 66 disposed in contact with the silicon nitride film 65; a through-wiring line 68 coupled electrically to the gate electrode 62; and a through-wiring line 67 coupled electrically to the impurity diffused region 69 are disposed, as illustrated in an example of FIG. 21. The silicon oxide film 64 is provided to protect a front surface portion of the semiconductor substrate 21, or uniformize a thickness of a silicon oxide film at the front surface portion of the semiconductor substrate 21 at the time of ion implantation. The silicon nitride film 65 has a role as the etching stopper in forming through holes to dispose the through-wiring lines 67 and 68 on the insulating layer 66.

In the present modification example, the gate insulating film 51 may be disposed in thickness greater than that of the gate insulating film 61. Further, in the present modification example, the sidewall layer 53 may be disposed in width greater than that of the sidewall layer 63. Additionally, in the present modification example, the impurity concentration of the source region and the drain region that are disposed on the semi-conductor substrate 11 may be lower than that of the impurity diffused region 69 disposed on the semiconductor substrate 21. Further, in the present modification example, the silicon oxide film 54 may be disposed in thickness greater than that of the silicon oxide film 64, and the silicon nitride film 55 may be disposed in thickness smaller than that of the silicon nitride film 65.

As described above, in the present modification example, the transistor in the first substrate 10 and the transistor in the second substrate 20 are different from each other in the design condition. This makes it possible to apply the design condition suitable for the transistor in the first substrate 10 to the transistor in the first substrate 10, and to apply the design condition suitable for the transistor in the second substrate 20 to the transistor in the second substrate 20. As a result, it is possible to achieve noise reduction, enhancement in the efficiency, etc.

Modification Example J

Each of FIG. 22 and FIG. 23 illustrates a modification example of sharing of the sensor pixels 12 by the readout circuit 22. In the imaging device 1 according to the above-described embodiment and the modification example thereof, for example, as illustrated in FIG. 22, the number of the sensor pixels 12 shared by the single readout circuit 22 may be two. Further, in the imaging device 1 according to the above-described embodiment and the modification example thereof, for example, as illustrated in FIG. 23, the single sensor pixel 12 may be provided for each one of the readout circuits 22.

Modification Example K

Each of FIG. 24 and FIG. 25 illustrates a configuration of an imaging device 2 according to an embodiment of the present disclosure. The imaging device 2 is configured such that, in the imaging device 1 according to the above-described embodiment and the modification example thereof, a second substrate 80 is provided in place of the second substrate 20 and the third substrate 30, and the circuits provided on the second substrate 20 and the third substrate 30 (specifically, the plurality of readout circuits 22, the logic circuit 32, the booster circuit 33, and the negative booster circuit 34) are provided on the second substrate 80. Even in such a case, as with the imaging device 1 according to the above-described embodiment and the modification example thereof, it is possible to configure each of the sensor pixels 12 in a sufficiently large size, ensuring that reproduced images of a wide dynamic range are obtained. Further, this makes it possible to take the sufficiently large size for the readout circuit 22, which avoids an increase in a dark-time noise such as RTS noise, for example.

Modification Example L

FIG. 26 illustrates an example of a circuit configuration of the imaging device 1 according to the above-described embodiment and the modification example thereof. The imaging device 1 according to the present modification example is a CMOS image sensor that incorporates a line-parallel ADC.

As illustrated in FIG. 26, the solid-state imaging device 1 according to the present modification example is configured to have a vertical drive circuit 32a, a column signal processing circuit 32b, a reference voltage supply section 38, a horizontal drive circuit 32c, a horizontal output line 37, and a system control circuit 32d, in addition to the pixel region 13 in which the plurality of sensor pixels 12 including photoelectric conversion elements are disposed two-dimensionally in rows and columns (in a matrix pattern).

In such a system configuration, the system control circuit 32d generates, on the basis of a master clock MCK, clock signals, control signals, etc. that serve as reference signals for operation of the vertical drive circuit 32a, the column signal processing circuit 32b, the reference voltage supply section 38, the horizontal drive circuit 32c, etc., and provides such signals to the vertical drive circuit 32a, the column signal processing circuit 32b, the reference voltage supply section 38, the horizontal drive circuit 32c, etc.

Further, the vertical drive circuit 32a is disposed on the first substrate 10 along with each of the sensor pixels 12 in the pixel region 13, and is also disposed on the second substrate 20 in which the readout circuit 22 is disposed. The column signal processing circuit 32b, the reference voltage supply section 38, the horizontal drive circuit 32c, the horizontal output line 37, and the system control circuit 32d are disposed on the third substrate 30.

For the sensor pixel 12, it is possible to use a configuration (unillustrated here) having, for example, the transfer transistor TR that transfers electrical charges obtained from photoelectric conversion performed by the photodiode PD to the floating diffusion FD, in addition to the photodiode PD. Further, for the readout circuit 22, it is possible to use, for example, a three-transistor configuration (unillustrated here) having the reset transistor RST that controls a potential of the floating diffusion FD, the amplifying transistor AMP that outputs a signal corresponding to the potential of the floating diffusion FD, and the selecting transistor SEL that serves to perform pixel selection.

In the pixel region 13, the sensor pixels 12 are disposed two-dimensionally, and the drive wiring line 14 is disposed on each row basis, while the vertical signal line VSL is disposed on each column basis for such an m-row/n-column pixel array. Each end of the plurality of drive wiring lines 14 is coupled to each output end corresponding to each row of the vertical drive circuit 32a. The vertical drive circuit 32a includes a shift register, etc. to control row addressing and row scanning of the pixel region 13 through the plurality of drive wiring lines 14.

The column signal processing circuit 32b has, for example, ADC (analog-to-digital conversion circuit) 35-1 to 35-m that are provided on each pixel column basis of the pixel region 13, that is, for each of the vertical signal lines VSL. Each of these ADCs converts an analog signal to be outputted on each column basis from each of the sensor pixels 12 in the pixel region 13 into a digital signal as an output.

The reference voltage supply section 38 has, for example, a DAC (digital-to-analog conversion circuit) 38A as a means of generating a reference voltage Vref of a so-called ramp (RAMP) waveform whose level varies with a slope over time. It is to be noted that the means of generating the reference voltage Vref of the ramp waveform is not limited to the DAC 38A.

The DAC 38A generates the reference voltage Vref of the ramp waveform on the basis of a clock CK given from the system control circuit 32d under control by the use of a control signal CS1 given from the system control circuit 32d to provide the resulting voltage to the ADC 35-1 to 35-m in the column signal processing circuit 32b.

It is to be noted that each of the ADC 35-1 to 35-m is configured to selectively enable A/D conversion operation corresponding to each operation mode including a normal frame rate mode in a progressive scanning method of reading out information of all the sensor pixels 12, and a high-speed frame rate mode that sets exposure time of the sensor pixels 12 at 1/N to raise a frame rate N times, for example, twice as compared with the normal frame rate mode. Switching of the operation modes is executed under control by the use of control signals CS2 and CS3 given from the system control circuit 32d. Further, instruction information for switching between each operation mode of the normal frame rate mode and the high-speed frame rate mode is given from an external system controller (unillustrated) to the system control circuit 32d.

All the ADC 35-1 to 35-m adopt the same configuration, and description is given here by citing the ADC 35-m as an example. The ADC 35-m is configured to have a comparator 35A, an up/down counter (denoted as U/DCNT in the drawing) 35B as an example of a counting means, a transfer switch 35C, and a memory device 35D.

The comparator 35A compares a signal voltage Vx on the vertical signal line VSL corresponding to a signal to be outputted from each of the sensor pixels 12 of an n-column in the pixel region 13 with the reference voltage Vref of the ramp waveform that is supplied from the reference voltage supply section 38. For example, an output Vco turns into "H" level when the reference voltage Vref is greater than the signal voltage Vx, and the Vco turns into "L" level when the reference voltage Vref is the signal voltage Vx or less.

The up/down counter 35B is an asynchronous counter, and the clock CK is given from the system control circuit 32d to the up/down counter 35B at the same time as the DAC 38A under control by the use of the control signal CS2 given from the system control circuit 32d. In synchronization with the clock CK, the up/down counter 35B performs down (DOWN) count or up (UP) count, thereby measuring a comparison period of time from starting of comparative operation until ending of comparative operation of the comparator 35A.

Specifically, in the normal frame rate mode, the up/down counter 35B, in readout operation of a signal from the single sensor pixel 12, measures a comparison time at the time of a first readout operation by performing down count during the first readout operation, and then measures a comparison time at the time of a second readout operation by performing up count during the second readout operation.

In contrast, in the high-speed frame rate mode, the up/down counter 35B holds a count result of the sensor pixels 12 of a certain row as it is, and continues to measure a comparison time at the time of the first readout operation by performing down count during the first readout operation from the previous count result for the sensor pixels 12 of the next row, and then measures a comparison time at the time of the second readout operation by performing up count during the second readout operation.

In the normal frame rate mode, under control by the use of the control signal CS3 given from the system control circuit 32d, the transfer switch 35C is put in ON (closed) state at the time of completion of count operation of the up/down counter 35B for the sensor pixels 12 of a certain row to transfer a count result of the up/down counter 35B to the memory device 35D.

In contrast, in the high-speed frame rate mode of, for example, N =2, the transfer switch 35C remains in OFF (open) state at the time of completion of count operation of the up/down counter 35B for the sensor pixels 12 of a certain row, and then continues to be put in ON state at the time of completion of count operation of the up/down counter 35B for the sensor pixels 12 of the next row to transfer a count result of two vertical pixels from the up/down counter 35B to the memory device 35D.

In such a manner, analog signals to be supplied on each column basis from each of the sensor pixels 12 in the pixel region 13 through the vertical signal line VSL are converted into N-bit digital signals by each operation of the comparator 35A and the up/down counter 35B in each of the ADC 35-1 to 35-m to be stored in the memory device 35D.

The horizontal drive circuit 32c includes a shift register, etc. to control column addressing and column scanning of the ADC 35-1 to 35-m in the column signal processing circuit 32b. Under control by the horizontal drive circuit 32c, the N-bit digital signals that are subjected to A/D conversion by each of the ADC 35-1 to 35-m are read out onto the horizontal output line 37 in sequence to be outputted as imaging data through the horizontal output line 37.

It is to be noted that a circuit, etc. that perform a variety of signal processing for the imaging data to be outputted through the horizontal output line 37 are not specifically illustrated because they are not directly related to the present disclosure; however, it is possible to provide such a circuit, etc. apart from the above-described component parts.

The imaging device 1 incorporating the line-parallel ADC according to the present modification example of the above-described configuration allows the count result of the up/down counter 35B to be selectively transferred to the memory device 35D through the transfer switch 35C, which makes it possible to independently control count operation of the up/down counter 35B and readout operation of the count result of the up/down counter 35B onto the horizontal output line 37.

Modification Example M

FIG. 27 illustrates a modification example of the cross-sectional configuration in the vertical direction of the imaging device 1, and in particular, illustrates a modification example of a modification example of a wiring structure on a junction surface, of the first substrate 10 and the second substrate 20, that is opposed to the pixel region 13, and in the vicinity of the junction surface. FIG. 28 illustrates an example of a cross-sectional configuration in the horizontal direction of the FD junction electrodes 17 and 24 and the VSS junction electrodes 18 and 25 on the junction surface of the first substrate 10 and the second substrate 20 illustrated in FIG. 27. FIG. 29 illustrates an example of sensor pixels and a readout circuit of the imaging device 1 having the wiring structure on the junction surface of the first substrate 10 and the second substrate 20 and in the vicinity of the junction surface illustrated in FIG. 27. The present modification example is different from the embodiments and the modification examples described above in that the FD junction electrodes 17 and 24 are directly coupled to the FD through-wiring lines 15 and 26 with no via (the connection wiring lines 47 and 48 described above) interposed therebetween, and the VSS junction electrodes 18 and 25 are directly coupled to the VSS through-wiring lines 16 and 27 with no via (the connection wiring lines 47 and 48 described above) interposed therebetween. The FD junction electrodes 17 and 24 electrically couple the sensor pixels 12 and the readout circuit 22 to each other in the region opposed to the pixel region 13, and the VSS junction electrodes 18 and 25 electrically couple the sensor pixels 12 and the readout circuit 22 to each other in the region opposed to the pixel region 13. The present modification is different from the embodiments and the modification examples described above also in that the FD junction electrodes 17 and 24 and the VSS junction electrodes 18 and 25 have two or more types of shapes.

For example, as illustrated in FIG. 27, the FD junction electrode 17, the FD junction electrode 24, and the VSS junction electrodes 18 and 25 may be different from each other in width. In one example, the width of each of the VSS junction electrodes 18 and 25 may be smaller than the width of each of the FD junction electrodes 17 and 24. In another example, the FD junction electrodes 17 and 24 and the VSS junction electrodes 18 and 25 may be different from each other in length in the lamination direction. Alternatively, for example, as illustrated in FIG. 27, the VSS junction electrode 18 on the first substrate 10 side and the VSS junction electrode 25 on the second substrate 20 side may be different from each other in length in an optical axis direction. In this case, each of the VSS junction electrodes 18 on the first substrate 10 side is formed inside the insulating film 19, and is not exposed on the junction surface of the first substrate 10 and the second substrate 20, for example. In other words, the VSS junction electrode 18 and the VSS junction electrode 25 that are opposed to each other is separated from each other with the insulating film 19 in between. It is also possible in this case to cause each of the VSS through-wiring lines 16 to function as a shield that reduces the signal interference between the FD through-wiring lines 15 adjacent to each other, and further to cause each of the VSS through-wiring lines 27 to function as a shield that reduces the signal interference between the FD through-wiring lines 26 adjacent to each other.

It is possible to manufacture the wiring structure as described as follows, for example.

FIGS. 30A to 30I illustrate an example of a method of manufacturing the FD junction electrode 17 and the VSS junction electrode 18 on the first substrate 10 side in order of steps. First, as illustrated in FIG. 30A, the FD through-wiring line 15 and the SVV through-wiring line 16 are formed, for example, by a damascene technique. Thereafter, as illustrated in FIG. 30B, an insulating film 19B is deposited with a predetermined thickness on an insulating film 19A including the FD through-wiring line 15 and the VSS through-wiring line 16. Thereafter, as illustrated in FIG. 30C, the insulating film 19B on the FD through-wiring line 15 and the VSS through-wiring line 16 is selectively etched to provide an opening H1. Thereafter, as illustrated in FIG. 30D, for example, a metal film M1 of cupper (Cu) or the like is provided to fill the opening H1 and to be deposited on the insulating film 19B. Thereafter, as illustrated in FIG. 30E, the metal film M1 on the insulating film 19B is removed, for example, by etching. A portion (an FD junction electrode 17A) of the FD junction electrode 17 and the VSS junction electrode 18 are thereby formed. Thereafter, as illustrated in FIG. 30F, an insulating film 19C is deposited with a predetermined thickness on the insulating film 19B including the FD junction electrode 17A and the VSS junction electrode 18. Thereafter, as illustrated in FIG. 30G, the insulating film 19 on the FD junction electrode 17A is selectively etched to provide an opening H2. Thereafter, as illustrated in FIG. 30H, for example, a metal film M2 of cupper (Cu) or the like is provided to fill the opening H2 and to be deposited on the insulating film 19. Lastly, as illustrated in FIG. 30I, the metal film M2 on the insulating film 19 is removed, for example, by etching. In such a manner, the first substrate 10 including the FD junction electrode 17 and the VSS junction electrode 18 that are different from each other in length in the lamination direction is completed.

It is to be noted that, although FIG. 27 illustrates an example where the FD junction electrode 17 and the FD junction electrode 24 are different from each other in width, the FD junction electrode 17 and the FD junction electrode 24 may have the same width as illustrated in FIG. 31. Further, although FIG. 27 illustrates an example where the VSS junction electrode 18 and the VSS junction electrode 25 have the same width, the VSS junction electrode 18 and the VSS junction electrode 25 may be different from each other in width, which is not illustrated, as with the FD junction electrodes 17 and 24 illustrated in FIG. 27.

In the imaging device 1 having a laminate of the first substrate 10 including the plurality of sensor pixels 12 and the floating diffusion FD and the second substrate 20 including the readout circuit 22 that outputs a pixel signal based on an electric charge outputted from the sensor pixels 12 as illustrated in FIG. 1, it is desired to dispose a shield wiring line (for example, the VSS through-wiring line 16 or 27) between each signal terminal (for example, the FD through-wiring line 15 or 26) and each of at least four signal terminals adjacent to the relevant signal terminal in row and column directions. In a case of providing the shield wiring lines, a junction electrode (for example, the VSS junction electrode 18 or 25) of the shield wiring line is disposed for each shield wiring line on the junction surface of the first substrate 10 and the second substrate 20, in addition to the FD junction electrodes 17 and 24 electrically coupling the sensor pixel 12 and the readout circuit 22. In an imaging device required with high resolution, however, the pixel size is reduced in accordance with an increase in the number of pixels. This reduces a distance between signal terminals and reduces a space to dispose the junction electrode of the shield wiring line between the signal terminals. It is also possible in this case to cause each of the VSS through-wiring lines 16 to function as a shield that reduces the signal interference between the FD through-wiring lines 15 adjacent to each other, and further to cause each of the VSS through-wiring lines 27 to function as a shield that reduces the signal interference between the FD through-wiring lines 26 adjacent to each other. This allows for achievement of noise reduction.

In particular, when the first substrate 10 and the second substrate 20 are joined with each other, a wiring pitch of the plurality of FD junction electrodes 17 and 24 and the plurality of VSS junction electrodes 18 and 25 becomes closer to a coupling misalignment alignment amount on each conjunction surface. It is therefore difficult to dispose the shield wiring line between the signal terminals adjacent to each other. For example, when the coupling misalignment amount is great, as illustrated in FIGS. 32 and 33, for example, electric conduction is established between the VSS junction electrode 18 on the first substrate 10 side and the FD junction electrode 24 on the second substrate 20 side. Electrical conduction is also established between the FD junction electrode 17 on the first substrate 10 side and the VSS junction electrode 25 on the second substrate 20 side. This prevents signal transmission between the first substrate 10 and the second substrate 20, which may lead to a great image defect on a reproduced image. This happens irrespective of whether the junction electrodes 17, 18, 24, and 25 on the through-wiring lines 15, 16, 26, and 27 have a single layer structure (FIG. 32) or a laminated structure (FIG. 33).

In contrast, according to the present modification example, for example, the length in the optical axis direction of the VSS junction electrode 18 on the first substrate 10 side is smaller than the length of the VSS junction electrode 25 on the second substrate 20 side, thereby preventing the VSS junction electrode 18 from being exposed on the junction surface of the first substrate 10 and the second substrate 20. This makes it possible to prevent (or alternatively, mitigate) contact between the VSS junction electrode 18 on the first substrate 10 side and the FD junction electrode 24 on the second substrate 20 side as illustrated in FIGS. 34 and 35 even in a case where the coupling misalignment occurs between the first substrate 10 and the second substrate 20.

Further, according to the present modification example, the VSS junction electrodes 18 and 25 are provided at the ends of the VSS through-wiring lines 16 and 27. This reduces a separation distance with the VSS junction electrode 25 on the second substrate side 20, compared with the wiring structure of the imaging device 1 illustrated in FIG. 15, for example. Accordingly, it is possible to improve a function as a shield that reduces the signal interference between the FD through-wiring lines 15 and 26 adjacent to each other. This allows for achievement of further noise reduction, compared with a case of employing the wiring structure illustrated in FIG. 15.

Modification Example N

FIG. 36 illustrates a modification example of the cross-sectional configuration in the vertical direction of the imaging device 1, and in particular, illustrates a modification example of the wiring structure on the junction surface of the first substrate 10 and the second substrate 20 that is opposed to the pixel region 13 and in the vicinity of the junction surface. Although Modification example M described above refers to an example where the VSS junction electrode 18 on the first substrate 10 side has a smaller length, the VSS junction electrode 25 on the second substrate 20 side may have a smaller length as illustrated in FIG. 36. It is possible to improve the function as the shield that reduces the signal interference between the FD through-wiring lines 15 and 26 adjacent to each other also in this case as with Modification example M described above. This also allows for achievement of noise reduction.

Modification Example O

FIG. 37 illustrates a modification example of the cross-sectional configuration in the vertical direction of the imaging device 1, and in particular, illustrates a modification example of the wiring structure on the junction surface of the first substrate 10 and the second substrate 20 that is opposed to the pixel region 13 and in the vicinity of the junction surface. Although Modification example M described above refers to an example where the VSS junction electrodes 18 and 25 are provided at the ends of the VSS through-wiring lines 16 and 27, the ends of the VSS through-wiring lines 16 and 27 may be provided with wiring layers 78 and 85 with vias v78 and v85 interposed in between, respectively, as illustrated in FIG. 37. In this case, each wiring layer 78 is electrically coupled to the p-well region 41 with the corresponding via v78 and the corresponding VSS through-wiring line 16 in between. Further, each wiring layer 85 is electrically coupled to a region to which the reference potential VSS is to be applied via the corresponding via v85 and the corresponding VSS through-wiring line 27. It is also possible in this case to cause each of the VSS through-wiring lines 16 and each of the wiring layers 78 to function as a shield that reduces the signal interference between the FD through-wiring lines 15 and 26 adjacent to each other, and further to cause each of the VSS through-wiring lines 27 and each of the wiring layers 85 to function as a shield that reduces the signal interference between the FD through-wiring lines 26 adjacent to each other. Further, forming each of the wiring layers 78 and 85 with a width wider than that of the VSS junction electrode 18 described in Modification example M or the like further improves the function as the shield. This allows for achievement of further noise reduction, compared with a case of employing the wiring structure illustrated in FIG. 15, for example.

Modification Example P

FIG. 38 illustrates a modification example of the cross-sectional configuration in the vertical direction of the imaging device 1, and in particular, illustrates a modification example of the wiring structure on the junction surface of the first substrate 10 and the second substrate 20 that is opposed to the pixel region 13 and in the vicinity of the junction surface. Although Modification example O described above refers to an example where the wiring layers 78 and 85 are provided at the ends of the VSS through-wiring lines 16 and 27, one of the ends of the VSS through-wiring lines 16 and 27 may be provided with a wiring layer, and the other of the ends of the VSS through-wiring lines 16 and 27 may be provided with a via, as illustrated in FIG. 38. For example, the wiring layer 78 may be provided on the first substrate 10 side and the via v85 may be provided on the second substrate 20 side as illustrated in FIG. 38. It is also possible in this case to cause each of the VSS through-wiring lines 16 to function as a shield that reduces the signal interference between the FD through-wiring lines 15 adjacent to each other, and further to cause each of the VSS through-wiring lines 27 to function as a shield that reduces the signal interference between the FD through-wiring lines 26 adjacent to each other. This allows for achievement of noise reduction.

Modification Example Q

FIG. 39 illustrates a modification example of the cross-sectional configuration in the vertical direction of the imaging device 1, and in particular, illustrates a modification example of the wiring structure on the junction surface of the first substrate 10 and the second substrate 20 that is opposed to the pixel region 13 and in the vicinity of the junction surface. Ends of the VSS through-wiring lines 16 and 27 may be provided with vias v78 and v85, respectively. It is also possible in this case to cause each of the VSS through-wiring lines 16 to function as a shield that reduces the signal interference between the FD through-wiring lines 15 adjacent to each other, and further to cause each of the VSS through-wiring lines 27 to function as a shield that reduces the signal interference between the FD through-wiring lines 26 adjacent to each other. This allows for achievement of noise reduction.

Modification Example R

FIG. 40 illustrates a modification example of the cross-sectional configuration in the vertical direction of the imaging device 1, and in particular, illustrates a modification example of the wiring structure on the junction surface of the first substrate 10 and the second substrate 20 that is opposed to the pixel region 13 and in the vicinity of the junction surface. One of the end of the VSS through-wiring line 16 and the end of the VSS through-wiring line 27 may be provided with the VSS junction electrode and the other may be provided with a via. For example, the end on the first substrate 10 side may be provided with the VSS junction electrode 18 and the end on the second substrate 20 side may be provided with the via v85. It is also possible in this case to cause each of the VSS through-wiring lines 16 to function as a shield that reduces the signal interference between the FD through-wiring lines 15 adjacent to each other, and further to cause each of the VSS through-wiring lines 27 to function as a shield that reduces the signal interference between the FD through-wiring lines 26 adjacent to each other. This allows for achievement of noise reduction.

Modification Example S

FIG. 41 illustrates a modification example of the sensor pixels 12 and the readout circuit 22. In the modification examples M to R described above, a reference potential of VSS, GND, or the like may be applied to the VSS through-wiring line 16 in the first substrate 10 and any other voltage may be applied to the VSS through-wiring line 27 in the second substrate 20, for example.

Modification Example T

FIG. 42 illustrates a modification example of the sensor pixels 12 and the readout circuit 22. In the modification examples M to R described above, a reference potential of VSS, GND, or the like may be applied to the VSS through-wiring line 27 in the second substrate 20 and any other voltage may be applied to the VSS through-wiring line 16 in the first substrate 10, for example.

Modification Example U

FIG. 43 illustrates an example of sensor pixels and readout circuits in a case where the wiring structure on the junction surface and its vicinity illustrated in FIG. 27 is applied to another position. Modification examples M to T described above refer to a case where the pixel signal is on the terminal of the floating diffusion FD. The pixel signal may be, however, on the output terminal (for example, Vsig) of the readout circuit 22 as illustrated in FIG. 43.

In a case of a structure in which the floating diffusion FD is coupled between two silicon substrates (between the semiconductor substrate 11 and the semiconductor substrate 21) as in Modification examples M to T described above, a capacitance between the terminal of the floating diffusion FD and another terminal may increase, leading to a decrease in conversion efficiency of the pixel. In contrast, in a case where the output terminal of the amplifying transistor AMP is coupled between the two silicon substrates as in the present modification example, the capacitance of the terminal of the floating diffusion FD is equivalent to that in a typical imaging device. It is therefore possible to prevent (or alternatively, mitigate) the decrease in conversion efficiency.

Modification Example V

FIGS. 44 to 50 illustrate a modification example of a cross-sectional configuration in the horizontal direction of the FD junction electrode 17 and the VSS junction electrode 18 of the imaging device 1 having the wiring structure illustrated in FIG. 27 and the like and a modification example of a cross-sectional configuration in the horizontal direction of the FD junction electrode 24 and the VSS junction electrode 25 of the imaging device 1 having the wiring structure illustrated in FIG. 27 and the like. It is to be noted that FIGS. 44 to 50 illustrate, as an example, a case where the floating diffusion FD is shared by four sensor pixels 12 as with the case illustrated in FIG. 5.

For example, as illustrated in FIG. 44, the plurality of VSS junction electrodes 18 and 25 may be so disposed between the FD junction electrodes 17 and 24 arranged in rows and columns that each space between the FD junction electrodes 17 and 24 is provided with one of the VSS junction electrodes 18 and 25. In one example, as illustrated in FIG. 45, each space between the FD junction electrodes 17 and 24 that are adjacent to each other in an oblique direction may be provided with one of the VSS junction electrodes 18 and 25, in addition to the configuration illustrated in FIG. 44. In another example, as illustrated in FIG. 46, each space between the FD junction electrodes 17 and 24 that are adjacent to each other in the row direction may be provided with one of the VSS junction electrodes 18 and 25, and each space between the FD junction electrodes 17 and 24 that are adjacent in the column direction may be provided with the VSS junction electrodes 18 and 25 continuously provided in the row direction. In another example, as illustrated in FIG. 47, each space between the FD junction electrodes 17 and 24 that are adjacent to each other in the column direction may be provided with one of the VSS junction electrodes 18 and 25, and each space between the FD junction electrodes 17 and 24 that are adjacent to each other in the row direction may be provided with the VSS junction electrodes 18 and 25 continuously provided in the column direction. In another example, as illustrated in FIG. 48, with respect to the FD junction electrodes 17 and 24 arranged in rows and columns, for example, each space between the FD junction electrodes 17 and 24 on the first substrate 10 side may be provided with one of the VSS junction electrodes 18, and the VSS junction electrodes 25 continuously provided in a lattice shape may be provided on the second substrate 20 side. In another example, as illustrated in FIG. 49, in the case where each space between the FD junction electrodes 17 and 24 that are arranged in rows and columns is provided with one of the VSS junction electrodes 18 and 25, a length of the VSS junction electrode 25 may be greater than a length of the VSS junction electrode 18. In another example, as illustrated in FIG. 50, in the case where each space between the FD junction electrodes 17 and 24 that are arranged in rows and columns is provided with one of the VSS junction electrodes 18 and 25, the length of the VSS junction electrode 25 may be smaller than the length of the VSS junction electrode 18.

It is also possible in any of the structures described above and illustrated in FIGS. 44 to 50 to cause each of the VSS through-wiring lines 16 and 27 and the VSS junction electrodes 18 and 25 to function as a shield that reduces the signal interference between the FD through-wiring lines 15 and 26 adjacent to each other. This allows for achievement of noise reduction.

3. APPLICATION EXAMPLE

FIG. 51 illustrates an example of a schematic configuration of an imaging system 3 provided with the imaging device 1 according to the above-described embodiment and any of the modification examples thereof.

The imaging system 3 is, for example, an electronic apparatus including an imaging apparatus such as a digital still camera, a video camera, or a mobile terminal apparatus such as a smartphone, a tablet terminal. The imaging system 3 includes, for example, the imaging device 1 according to the above-described embodiment and any of the modification examples thereof, an optical system 141, a shutter device 142, a control circuit 143, a DSP circuit 144, a frame memory 145, a display section 146, a storage section 147, an operational section 148, and a power supply section 149. In the imaging system 3, the imaging device 1 according to the above-described embodiment and any of the modification examples thereof, the DSP circuit 144, the frame memory 145, the display section 146, the storage section 147, the operational section 148, and the power supply section 149 are coupled with respect to one another through a bus line 150.

The optical system 141 is configured to have a single lens or a plurality of lenses, and guides light (incoming light) from a photographic subject to the imaging device 1 to image such light on a light-receiving surface of the imaging device 1. The shutter device 142 is disposed between the optical system 141 and the imaging device 1 to control a period of irradiating the imaging device 1 with light and a light-shielding period in accordance with control of the control circuit 143. The imaging device 1 accumulates signal charges during a fixed period of time depending on light to be imaged on the light-receiving surface through the optical system 141 and the shutter device 142. The signal charges accumulated in the imaging device 1 are transferred as image data in accordance with a drive signal (a timing signal) to be supplied from the control circuit 143. The control circuit 143 outputs the drive signal that controls transfer operation of the imaging device 1 and shutter operation of the shutter device 142 to drive the imaging device 1 and the shutter device 142.

The DSP circuit 144 is a signal processing circuit that processes the image data to be outputted from the imaging device 1. The frame memory 145 temporarily holds the image data processed by the DSP circuit 144 on each frame basis. The display section 146 includes, for example, a panel display unit such as a liquid crystal panel and an organic EL (Electro Luminescence) panel to display moving images or still images that are imaged by the imaging device 1. The storage section 147 records the image data of the moving images or still images that are imaged by the imaging device 1 on a recording medium such as a semiconductor memory, a hard disk. The operational section 148 issues operating instructions on various functions that the imaging system 3 has in accordance with operation by a user. The power supply section 149 provides various power supplies serving as operating power supplies for the imaging device 1, the DSP circuit 144, the frame memory 145, the display section 146, the storage section 147, and the operational section 148 to these supply objects as appropriate.

Next, description is given for imaging steps in the imaging system 3.

FIG. 52 illustrates an example of a flowchart of imaging operation in the imaging system 3. A user instructs the start of imaging by operating the operational section 148 (Step S101). Thereafter, the operational section 148 transmits the imaging instruction to the control circuit 143 (Step S102). Upon reception of the imaging instruction, the control circuit 143 starts control of the shutter device 142 and the imaging device 1. The imaging device 1 (specifically, the system control circuit 32d) executes imaging in a predetermined imaging method under control by the control circuit 143 (Step S103). The shutter device 142 controls a period of irradiating the imaging device 1 with light and a light-shielding period under control by the control circuit 143.

The imaging device 1 outputs image data obtained by imaging to the DSP circuit 144. Here, the image data refers to data corresponding to the whole pixels of a pixel signal generated based on electrical charges held temporarily in the floating diffusion FD. The DSP circuit 144 performs predetermined signal processing (for example, noise reduction processing, etc.) on the basis of the image data incoming from the imaging device 1 (Step S104). The DSP circuit 144 causes the frame memory 145 to hold the image data that has been subjected to the predetermined signal processing, and the frame memory 145 causes the storage section 147 to store the image data (Step S105). In such a manner, imaging in the imaging system 3 is performed.

In the present application example, the imaging device 1 according to the above-described embodiment and any of the modification examples thereof is applied to the imaging system 3. This allows for achievement of a reduced size, an enhanced dynamic range, and a reduced noise, which makes it possible to provide the small-sized, wide dynamic range, and high-definition imaging system 3.

4. INDUSTRIAL APPLICATION EXAMPLES

Industrial Application Example 1

The technology according to the present disclosure is applicable to various products.

For example, the technology according to the present disclosure may be realized as an apparatus mounted to any kind of moving bodies such as a vehicle, an electric vehicle, a hybrid electric vehicle, a motorcycle, a bicycle, a personal mobility, an aircraft, a drone, a watercraft, and a robot.

FIG. 53 is a block diagram depicting an example of schematic configuration of a vehicle control system as an example of a mobile body control system to which the technology according to an embodiment of the present disclosure can be applied.

The vehicle control system 12000 includes a plurality of electronic control units connected to each other via a communication network 12001. In the example depicted in FIG. 53, the vehicle control system 12000 includes a driving system control unit 12010, a body system control unit 12020, an outside-vehicle information detecting unit 12030, an in-vehicle information detecting unit 12040, and an integrated control unit 12050. In addition, a microcomputer 12051, a sound/image output section 12052, and a vehicle-mounted network interface (I/F) 12053 are illustrated as a functional configuration of the integrated control unit 12050.

The driving system control unit 12010 controls the operation of devices related to the driving system of the vehicle in accordance with various kinds of programs. For example, the driving system control unit 12010 functions as a control device for a driving force generating device for generating the driving force of the vehicle, such as an internal combustion engine, a driving motor, or the like, a driving force transmitting mechanism for transmitting the driving force to wheels, a steering mechanism for adjusting the steering angle of the vehicle, a braking device for generating the braking force of the vehicle, and the like.

The body system control unit 12020 controls the operation of various kinds of devices provided to a vehicle body in accordance with various kinds of programs. For example, the body system control unit 12020 functions as a control device for a keyless entry system, a smart key system, a power window device, or various kinds of lamps such as a headlamp, a backup lamp, a brake lamp, a turn signal, a fog lamp, or the like. In this case, radio waves transmitted from a mobile device as an alternative to a key or signals of various kinds of switches can be input to the body system control unit 12020. The body system control unit 12020 receives these input radio waves or signals, and controls a door lock device, the power window device, the lamps, or the like of the vehicle.

The outside-vehicle information detecting unit 12030 detects information about the outside of the vehicle including the vehicle control system 12000. For example, the outside-vehicle information detecting unit 12030 is connected with an imaging section 12031. The outside-vehicle information detecting unit 12030 makes the imaging section 12031 image an image of the outside of the vehicle, and receives the imaged image. On the basis of the received image, the outside-vehicle information detecting unit 12030 may perform processing of detecting an object such as a human, a vehicle, an obstacle, a sign, a character on a road surface, or the like, or processing of detecting a distance thereto.

The imaging section 12031 is an optical sensor that receives light, and which outputs an electric signal corresponding to a received light amount of the light. The imaging section 12031 can output the electric signal as an image, or can output the electric signal as information about a measured distance. In addition, the light received by the imaging section 12031 may be visible light, or may be invisible light such as infrared rays or the like.

The in-vehicle information detecting unit 12040 detects information about the inside of the vehicle. The in-vehicle information detecting unit 12040 is, for example, connected with a driver state detecting section 12041 that detects the state of a driver. The driver state detecting section 12041, for example, includes a camera that images the driver. On the basis of detection information input from the driver state detecting section 12041, the in-vehicle information detecting unit 12040 may calculate a degree of fatigue of the driver or a degree of concentration of the driver, or may determine whether the driver is dozing.

The microcomputer 12051 can calculate a control target value for the driving force generating device, the steering mechanism, or the braking device on the basis of the information about the inside or outside of the vehicle which information is obtained by the outside-vehicle information detecting unit 12030 or the in-vehicle information detecting unit 12040, and output a control command to the driving system control unit 12010. For example, the microcomputer 12051 can perform cooperative control intended to implement functions of an advanced driver assistance system (ADAS) which functions include collision avoidance or shock mitigation for the vehicle, following driving based on a following distance, vehicle speed maintaining driving, a warning of collision of the vehicle, a warning of deviation of the vehicle from a lane, or the like.

In addition, the microcomputer 12051 can perform cooperative control intended for automatic driving, which makes the vehicle to travel autonomously without depending on the operation of the driver, or the like, by controlling the driving force generating device, the steering mechanism, the braking device, or the like on the basis of the information about the outside or inside of the vehicle which information is obtained by the outside-vehicle information detecting unit 12030 or the in-vehicle information detecting unit 12040.

In addition, the microcomputer 12051 can output a control command to the body system control unit 12020 on the basis of the information about the outside of the vehicle which information is obtained by the outside-vehicle information detecting unit 12030. For example, the microcomputer 12051 can perform cooperative control intended to prevent (or alternatively, reduce) a glare by controlling the headlamp so as to change from a high beam to a low beam, for example, in accordance with the position of a preceding vehicle or an oncoming vehicle detected by the outside-vehicle information detecting unit 12030.

The sound/image output section 12052 transmits an output signal of at least one of a sound and an image to an output device capable of visually or auditorily notifying information to an occupant of the vehicle or the outside of the vehicle. In the example of FIG. 53, an audio speaker 12061, a display section 12062, and an instrument panel 12063 are illustrated as the output device. The display section 12062 may, for example, include at least one of an on-board display and a head-up display.

FIG. 54 is a diagram depicting an example of the installation position of the imaging section 12031.

In FIG. 54, the imaging section 12031 includes imaging sections 12101, 12102, 12103, 12104, and 12105.

The imaging sections 12101, 12102, 12103, 12104, and 12105 are, for example, disposed at positions on a front nose, sideview mirrors, a rear bumper, and a back door of the vehicle 12100 as well as a position on an upper portion of a windshield within the interior of the vehicle. The imaging section 12101 provided to the front nose and the imaging section 12105 provided to the upper portion of the windshield within the interior of the vehicle obtain mainly an image of the front of the vehicle 12100. The imaging sections 12102 and 12103 provided to the sideview mirrors obtain mainly an image of the sides of the vehicle 12100. The imaging section 12104 provided to the rear bumper or the back door obtains mainly an image of the rear of the vehicle 12100. The imaging section 12105 provided to the upper portion of the windshield within the interior of the vehicle is used mainly to detect a preceding vehicle, a pedestrian, an obstacle, a signal, a traffic sign, a lane, or the like.

Incidentally, FIG. 54 depicts an example of photographing ranges of the imaging sections 12101 to 12104. An imaging range 12111 represents the imaging range of the imaging section 12101 provided to the front nose. Imaging ranges 12112 and 12113 respectively represent the imaging ranges of the imaging sections 12102 and 12103 provided to the sideview mirrors. An imaging range 12114 represents the imaging range of the imaging section 12104 provided to the rear bumper or the back door. A bird's-eye image of the vehicle 12100 as viewed from above is obtained by superimposing image data imaged by the imaging sections 12101 to 12104, for example.

At least one of the imaging sections 12101 to 12104 may have a function of obtaining distance information. For example, at least one of the imaging sections 12101 to 12104 may be a stereo camera constituted of a plurality of imaging elements, or may be an imaging element having pixels for phase difference detection.

For example, the microcomputer 12051 can determine a distance to each three-dimensional object within the imaging ranges 12111 to 12114 and a temporal change in the distance (relative speed with respect to the vehicle 12100) on the basis of the distance information obtained from the imaging sections 12101 to 12104, and thereby extract, as a preceding vehicle, a nearest three-dimensional object in particular that is present on a traveling path of the vehicle 12100 and which travels in substantially the same direction as the vehicle 12100 at a predetermined speed (for example, equal to or more than 0 km/hour). Further, the microcomputer 12051 can set a following distance to be maintained in front of a preceding vehicle in advance, and perform automatic brake control (including following stop control), automatic acceleration control (including following start control), or the like. It is thus possible to perform cooperative control intended for automatic driving that makes the vehicle travel autonomously without depending on the operation of the driver or the like.

For example, the microcomputer 12051 can classify three-dimensional object data on three-dimensional objects into three-dimensional object data of a two-wheeled vehicle, a standard-sized vehicle, a large-sized vehicle, a pedestrian, a utility pole, and other three-dimensional objects on the basis of the distance information obtained from the imaging sections 12101 to 12104, extract the classified three-dimensional object data, and use the extracted three-dimensional object data for automatic avoidance of an obstacle. For example, the microcomputer 12051 identifies obstacles around the vehicle 12100 as obstacles that the driver of the vehicle 12100 can recognize visually and obstacles that are difficult for the driver of the vehicle 12100 to recognize visually. Then, the microcomputer 12051 determines a collision risk indicating a risk of collision with each obstacle. In a situation in which the collision risk is equal to or higher than a set value and there is thus a possibility of collision, the microcomputer 12051 outputs a warning to the driver via the audio speaker 12061 or the display section 12062, and performs forced deceleration or avoidance steering via the driving system control unit 12010. The microcomputer 12051 can thereby assist in driving to avoid collision.

At least one of the imaging sections 12101 to 12104 may be an infrared camera that detects infrared rays. The microcomputer 12051 can, for example, recognize a pedestrian by determining whether or not there is a pedestrian in imaged images of the imaging sections 12101 to 12104. Such recognition of a pedestrian is, for example, performed by a procedure of extracting characteristic points in the imaged images of the imaging sections 12101 to 12104 as infrared cameras and a procedure of determining whether or not it is the pedestrian by performing pattern matching processing on a series of characteristic points representing the contour of the object. When the microcomputer 12051 determines that there is a pedestrian in the imaged images of the imaging sections 12101 to 12104, and thus recognizes the pedestrian, the sound/image output section 12052 controls the display section 12062 so that a square contour line for emphasis is displayed so as to be superimposed on the recognized pedestrian. The sound/image output section 12052 may also control the display section 12062 so that an icon or the like representing the pedestrian is displayed at a desired position.

As described above, description of an example of the mobile body control system to which the technology according to an embodiment of the present disclosure can be applied is given. Of the configurations described above, the technology according to the present disclosure can be applied to the imaging section 12301. Specifically, the imaging device 1 according to the above-described embodiment and any of the modification examples can be applied to the imaging section 12301. By applying the technology according to the present disclosure to the imaging section 12301, it is possible to obtain captured image with high precision and reduced noise, which makes it possible to perform a high-precision control by using a captured image in the mobile body control system.

Industrial Application Example 2

FIG. 55 is a view depicting an example of a schematic configuration of an endoscopic surgery system to which the technology according to an embodiment of the present disclosure (present technology) can be applied.

In FIG. 55, a state is illustrated in which a surgeon (medical doctor) 11131 is using an endoscopic surgery system 11000 to perform surgery for a patient 11132 on a patient bed 11133. As depicted, the endoscopic surgery system 11000 includes an endoscope 11100, other surgical tools 11110 such as a pneumoperitoneum tube 11111 and an energy treatment tool 11112, a supporting arm apparatus 11120 which supports the endoscope 11100 thereon, and a cart 11200 on which various apparatus for endoscopic surgery are mounted.

The endoscope 11100 includes a lens barrel 11101 having a region of a predetermined length from a distal end thereof to be inserted into a body lumen of the patient 11132, and a camera head 11102 connected to a proximal end of the lens barrel 11101. In the example depicted, the endoscope 11100 is depicted which includes as a hard mirror having the lens barrel 11101 of the hard type. However, the endoscope 11100 may otherwise be included as a soft minor having the lens barrel 11101 of the soft type.

The lens barrel 11101 has, at a distal end thereof, an opening in which an objective lens is fitted. A light source apparatus 11203 is connected to the endoscope 11100 such that light generated by the light source apparatus 11203 is introduced to a distal end of the lens barrel 11101 by a light guide extending in the inside of the lens barrel 11101 and is irradiated toward an observation target in a body lumen of the patient 11132 through the objective lens. It is to be noted that the endoscope 11100 may be a direct view minor or may be a perspective view minor or a side view mirror.

An optical system and an image pickup element are provided in the inside of the camera head 11102 such that reflected light (observation light) from the observation target is condensed on the image pickup element by the optical system. The observation light is photo-electrically converted by the image pickup element to generate an electric signal corresponding to the observation light, namely, an image signal corresponding to an observation image. The image signal is transmitted as RAW data to a CCU 11201.

The CCU 11201 includes a central processing unit (CPU), a graphics processing unit (GPU) or the like and integrally controls operation of the endoscope 11100 and a display apparatus 11202. Further, the CCU 11201 receives an image signal from the camera head 11102 and performs, for the image signal, various image processes for displaying an image based on the image signal such as, for example, a development process (demosaic process).

The display apparatus 11202 displays thereon an image based on an image signal, for which the image processes have been performed by the CCU 11201, under the control of the CCU 11201.

The light source apparatus 11203 includes a light source such as, for example, a light emitting diode (LED) and supplies irradiation light upon imaging of a surgical region to the endoscope 11100.

An inputting apparatus 11204 is an input interface for the endoscopic surgery system 11000. A user can perform inputting of various kinds of information or instruction inputting to the endoscopic surgery system 11000 through the inputting apparatus 11204. For example, the user would input an instruction or a like to change an image pickup condition (type of irradiation light, magnification, focal distance or the like) by the endoscope 11100.

A treatment tool controlling apparatus 11205 controls driving of the energy treatment tool 11112 for cautery or incision of a tissue, sealing of a blood vessel or the like. A pneumoperitoneum apparatus 11206 feeds gas into a body lumen of the patient 11132 through the pneumoperitoneum tube 11111 to inflate the body lumen in order to secure the field of view of the endoscope 11100 and secure the working space for the surgeon. A recorder 11207 is an apparatus capable of recording various kinds of information relating to surgery. A printer 11208 is an apparatus capable of printing various kinds of information relating to surgery in various forms such as a text, an image or a graph.

It is to be noted that the light source apparatus 11203 which supplies irradiation light when a surgical region is to be imaged to the endoscope 11100 may include a white light source which includes, for example, an LED, a laser light source or a combination of them. Where a white light source includes a combination of red, green, and blue (RGB) laser light sources, since the output intensity and the output timing can be controlled with a high degree of accuracy for each color (each wavelength), adjustment of the white balance of a picked up image can be performed by the light source apparatus 11203. Further, in this case, if laser beams from the respective RGB laser light sources are irradiated time-divisionally on an observation target and driving of the image pickup elements of the camera head 11102 are controlled in synchronism with the irradiation timings. Then images individually corresponding to the R, G and B colors can be also picked up time-divisionally. According to this method, a color image can be obtained even if color filters are not provided for the image pickup element.

Further, the light source apparatus 11203 may be controlled such that the intensity of light to be outputted is changed for each predetermined time. By controlling driving of the image pickup element of the camera head 11102 in synchronism with the timing of the change of the intensity of light to acquire images time-divisionally and synthesizing the images, an image of a high dynamic range free from underexposed blocked up shadows and overexposed highlights can be created.

Further, the light source apparatus 11203 may be configured to supply light of a predetermined wavelength band ready for special light observation. In special light observation, for example, by utilizing the wavelength dependency of absorption of light in a body tissue to irradiate light of a narrow band in comparison with irradiation light upon ordinary observation (namely, white light), narrow band observation (narrow band imaging) of imaging a predetermined tissue such as a blood vessel of a superficial portion of the mucous membrane or the like in a high contrast is performed. Alternatively, in special light observation, fluorescent observation for obtaining an image from fluorescent light generated by irradiation of excitation light may be performed. In fluorescent observation, it is possible to perform observation of fluorescent light from a body tissue by irradiating excitation light on the body tissue (autofluorescence observation) or to obtain a fluorescent light image by locally injecting a reagent such as indocyanine green (ICG) into a body tissue and irradiating excitation light corresponding to a fluorescent light wavelength of the reagent upon the body tissue. The light source apparatus 11203 can be configured to supply such narrow-band light and/or excitation light suitable for special light observation as described above.

FIG. 56 is a block diagram depicting an example of a functional configuration of the camera head 11102 and the CCU 11201 depicted in FIG. 55.

The camera head 11102 includes a lens unit 11401, an image pickup unit 11402, a driving unit 11403, a communication unit 11404 and a camera head controlling unit 11405. The CCU 11201 includes a communication unit 11411, an image processing unit 11412 and a control unit 11413. The camera head 11102 and the CCU 11201 are connected for communication to each other by a transmission cable 11400.

The lens unit 11401 is an optical system, provided at a connecting location to the lens barrel 11101. Observation light taken in from a distal end of the lens barrel 11101 is guided to the camera head 11102 and introduced into the lens unit 11401. The lens unit 11401 includes a combination of a plurality of lenses including a zoom lens and a focusing lens.

The number of image pickup elements which is included by the image pickup unit 11402 may be one (single-plate type) or a plural number (multi-plate type). Where the image pickup unit 11402 is configured as that of the multi-plate type, for example, image signals corresponding to respective R, G and B are generated by the image pickup elements, and the image signals may be synthesized to obtain a color image. The image pickup unit 11402 may also be configured so as to have a pair of image pickup elements for acquiring respective image signals for the right eye and the left eye ready for three dimensional (3D) display. If 3D display is performed, then the depth of a living body tissue in a surgical region can be comprehended more accurately by the surgeon 11131. It is to be noted that, where the image pickup unit 11402 is configured as that of stereoscopic type, a plurality of systems of lens units 11401 are provided corresponding to the individual image pickup elements.

Further, the image pickup unit 11402 may not necessarily be provided on the camera head 11102. For example, the image pickup unit 11402 may be provided immediately behind the objective lens in the inside of the lens barrel 11101.

The driving unit 11403 includes an actuator and moves the zoom lens and the focusing lens of the lens unit 11401 by a predetermined distance along an optical axis under the control of the camera head controlling unit 11405. Consequently, the magnification and the focal point of a picked up image by the image pickup unit 11402 can be adjusted suitably.

The communication unit 11404 includes a communication apparatus for transmitting and receiving various kinds of information to and from the CCU 11201. The communication unit 11404 transmits an image signal acquired from the image pickup unit 11402 as RAW data to the CCU 11201 through the transmission cable 11400.

In addition, the communication unit 11404 receives a control signal for controlling driving of the camera head 11102 from the CCU 11201 and supplies the control signal to the camera head controlling unit 11405. The control signal includes information relating to image pickup conditions such as, for example, information that a frame rate of a picked up image is designated, information that an exposure value upon image picking up is designated and/or information that a magnification and a focal point of a picked up image are designated.

It is to be noted that the image pickup conditions such as the frame rate, exposure value, magnification or focal point may be designated by the user or may be set automatically by the control unit 11413 of the CCU 11201 on the basis of an acquired image signal. In the latter case, an auto exposure (AE) function, an auto focus (AF) function and an auto white balance (AWB) function are incorporated in the endoscope 11100.

The camera head controlling unit 11405 controls driving of the camera head 11102 on the basis of a control signal from the CCU 11201 received through the communication unit 11404.

The communication unit 11411 includes a communication apparatus for transmitting and receiving various kinds of information to and from the camera head 11102. The communication unit 11411 receives an image signal transmitted thereto from the camera head 11102 through the transmission cable 11400.

Further, the communication unit 11411 transmits a control signal for controlling driving of the camera head 11102 to the camera head 11102. The image signal and the control signal can be transmitted by electrical communication, optical communication or the like.

The image processing unit 11412 performs various image processes for an image signal in the form of RAW data transmitted thereto from the camera head 11102.

The control unit 11413 performs various kinds of control relating to image picking up of a surgical region or the like by the endoscope 11100 and display of a picked up image obtained by image picking up of the surgical region or the like. For example, the control unit 11413 creates a control signal for controlling driving of the camera head 11102.

Further, the control unit 11413 controls, on the basis of an image signal for which image processes have been performed by the image processing unit 11412, the display apparatus 11202 to display a picked up image in which the surgical region or the like is imaged. Thereupon, the control unit 11413 may recognize various objects in the picked up image using various image recognition technologies. For example, the control unit 11413 can recognize a surgical tool such as forceps, a particular living body region, bleeding, mist when the energy treatment tool 11112 is used and so forth by detecting the shape, color and so forth of edges of objects included in a picked up image. The control unit 11413 may cause, when it controls the display apparatus 11202 to display a picked up image, various kinds of surgery supporting information to be displayed in an overlapping manner with an image of the surgical region using a result of the recognition. Where surgery supporting information is displayed in an overlapping manner and presented to the surgeon 11131, the burden on the surgeon 11131 can be reduced and the surgeon 11131 can proceed with the surgery with certainty.

The transmission cable 11400 which connects the camera head 11102 and the CCU 11201 to each other is an electric signal cable ready for communication of an electric signal, an optical fiber ready for optical communication or a composite cable ready for both of electrical and optical communications.

Here, while, in the example depicted, communication is performed by wired communication using the transmission cable 11400, the communication between the camera head 11102 and the CCU 11201 may be performed by wireless communication.

As described above, description of an example of the endoscopic surgery system to which the technology according to an embodiment of the present disclosure can be applied is given. Of the configurations described above, the technology according to the present disclosure can be preferably applied to the image pickup unit 11402 provided on the camera head 11102 of the endoscope 11100. By applying the technology according to the present disclosure to the image pickup unit 11402, it is possible to reduce the image pickup unit 11402 in size or make it with high precision, which makes it possible to provide the endoscope 11100 that is reduced in size or the endoscope 11100 with high precision.

The present disclosure is described thus far with reference to the embodiment and modification examples thereof, as well as the application example and the industrial application examples; however, the present disclosure is not limited to the above-described embodiment, etc., but various modifications may be made. It is to be noted that the effects described herein are merely exemplified. The effects of the present disclosure are not limited to the effects described herein. The present disclosure may have any effects other than the effects described herein.

Further, for example, the present disclosure may be configured as follows.

(1)

An imaging device including:

a first substrate having a pixel region including a plurality of sensor pixels that perform photoelectric conversion;

a second substrate having a plurality of readout circuits that are provided one by one for each of the single sensor pixel or the plurality of sensor pixels to output a pixel signal based on an electrical charge outputted from the sensor pixels; and a third substrate having a control circuit that controls the sensor pixels and the readout circuits, in which the first substrate, the second substrate, and the third substrate are laminated in this order, a laminate including the first substrate and the second substrate has an interlayer insulating film, and a plurality of first junction electrodes provided in a region that is located in the interlayer insulating film and is opposed to the pixel region, and the sensor pixels and the readout circuits are coupled electrically with respect to one another through junction of the first junction electrodes.

(2)

The imaging device according to (1), in which the laminate has a plurality of first through-wiring lines in a region surrounding the pixel region, and the control circuit controls the sensor pixels and the readout circuits through the plurality of first through-wiring lines.

(3)

The imaging device according to one or more of (1) to (2), in which the laminate has a plurality of second through-wiring lines provided one by one for each of the readout circuits in a region that is located in the interlayer insulating film and is opposed to the pixel region, and each of the second through-wiring lines is electrically coupled to a region held at a reference potential in at least one of the first substrate or the second substrate.

(4)

The imaging device according to one or more of (1) to (3), in which the laminate has a plurality of third through-wiring lines that are electrically coupled to corresponding one of the first junction electrodes in a region that is located in the interlayer insulating film and is opposed to the pixel region, and each of the second through-wiring lines is disposed at a spacing interval between the two third through-wiring lines adjacent to each other in the plurality of third through-wiring lines.

(5)

The imaging device according to one or more of (1) to (4), in which the laminate has, in the interlayer insulating film, a wiring electrode coupled electrically to each of the second through-wiring lines, and the wiring electrode is disposed in a lattice shape surrounding each of the first junction electrodes.

(6)

The imaging device according to one or more of (1) to (5), in which the wiring electrode takes a lattice shape disposed in a same plane in such a manner that a plurality of first junction wiring lines extending in a first array direction of the plurality of sensor pixels and a plurality of second junction wiring lines extending in a second array direction of the plurality of sensor pixels intersect with respect to one another.

(7)

The imaging device according to one or more of (1) to (6), in which the wiring electrode takes a lattice shape disposed in a same plane in such a manner that a plurality of first junction wiring lines extending in a first direction intersecting with an array direction of the plurality of sensor pixels, and a plurality of second junction wiring lines extending in a second direction intersecting with an array direction of the plurality of sensor pixels and also intersecting with the first direction intersect with respect to one another.

(8)

The imaging device according to one or more of (1) to (7), in which the laminate has, in the interlayer insulating film, a plurality of second junction electrodes coupled electrically to each of the plurality of second through-wiring lines, and each of the plurality of second junction electrodes is disposed at a spacing interval between the two first junction electrodes adjacent to each other in the plurality of first junction electrodes.

(9)

The imaging device according to one or more of (1) to (8), in which each of the readout circuits has a negative feedback circuit having an operational amplifier.

(10)

The imaging device according to one or more of (1) to (9), in which a reference potential of the first substrate is lower than a reference potential of the second substrate.

(11)

The imaging device according to one or more of (1) to (10), in which the laminate has a plurality of fourth through-wiring lines in a region surrounding the pixel region, the third substrate has a negative booster circuit, and the negative booster circuit makes a reference potential of the first substrate lower than a reference potential of the second substrate by controlling a reference potential of the first substrate through the plurality of fourth through-wiring lines.

(12)

The imaging device according to one or more of (1) to (11), in which the laminate has, in the interlayer insulating film, a plurality of wiring electrodes, the wiring electrodes being coupled electrically to the respective second through-wiring lines and being disposed at a spacing interval between the two first junction electrodes adjacent to each other in the plurality of first junction electrodes, and the first junction electrodes and the wiring electrodes have two or more types of shapes.

(13)

The imaging device according to one or more of (1) to (12), in which a portion or all of the first junction electrodes and wiring electrodes have two types of shapes different from each other.

(14)

The imaging device according to one or more of (1) to (13), in which a portion or all of the wiring electrodes are smaller in length than the first junction electrodes, and the wiring electrode provided on side of the first substrate and the wiring electrode provided on side of the second substrate are opposed to each other with the interlayer insulating film disposed in between.

(15)

The imaging device according to one or more of (1) to (14), in which the wiring electrode provided on side of the first substrate and the wiring electrode provided on side of the second substrate are different from each other in length, width, or both, and the wiring electrode provided on the side of the first substrate and the wiring electrode provided on the side of the second substrate are opposed to each other with the interlayer insulating film disposed in between.

(16)

The imaging device according to one or more of (1) to (15), in which the wiring electrodes on one of the side of the first substrate and the side of the second substrate are exposed to a junction surface of the first substrate and the second substrate, and the wiring electrodes on another of the side of the first substrate and the side of the second substrate are formed in the interlayer insulating film.

(17)

An imaging device including:

a first substrate having a pixel region including a plurality of sensor pixels that perform photoelectric conversion; and a second substrate having a plurality of readout circuits that are provided one by one for each of the single sensor pixel or the plurality of sensor pixels to output a pixel signal based on an electrical charge outputted from the sensor pixels, and a control circuit that controls the sensor pixels and the readout circuits, in which the first substrate and the second substrate are laminated with each other, a laminate including the first substrate and the second substrate has an interlayer insulating film, and a plurality of first junction electrodes provided in a region that is located in the interlayer insulating film and is opposed to the pixel region, and the sensor pixels and the readout circuits are coupled electrically with respect to one another through junction of the first junction electrodes.

(18)

The imaging device according to (17), in which the laminate has a plurality of first through-wiring lines in a region surrounding the pixel region, and the control circuit controls the sensor pixels through the plurality of first through-wiring lines.

(19)

The imaging device according to one or more of (17) to (18), in which the laminate has a plurality of second through-wiring lines provided one by one for each of the readout circuits in a region that is located in the interlayer insulating film and is opposed to the pixel region, and each of the second through-wiring lines is electrically coupled to a region held at a reference potential in at least one of the first substrate or the second substrate.

(20)

The imaging device according to one or more of (17) to (19), in which the laminate has a plurality of third through-wiring lines that are electrically coupled to corresponding one of the first junction electrodes in a region that is located in the interlayer insulating film and is opposed to the pixel region, and each of the second through-wiring lines is disposed at a spacing interval between the two third through-wiring lines adjacent to each other in the plurality of third through-wiring lines.

(21)

The imaging device according to one or more of (17) to (20), in which the laminate has, in the interlayer insulating film, a wiring electrode coupled electrically to each of the second through-wiring lines, and the wiring electrode is disposed in a lattice shape surrounding each of the first junction electrodes.

(22)

The imaging device according to one or more of (17) to (21), in which the wiring electrode takes a lattice shape disposed in a same plane in such a manner that a plurality of first junction wiring lines extending in a first array direction of the plurality of sensor pixels and a plurality of second junction wiring lines extending in a second array direction of the plurality of sensor pixels intersect with respect to one another.

(23)

The imaging device according to one or more of (17) to (22), in which the wiring electrode takes a lattice shape disposed in a same plane in such a manner that a plurality of first junction wiring lines extending in a first direction intersecting with an array direction of the plurality of sensor pixels, and a plurality of second junction wiring lines extending in a second direction intersecting with an array direction of the plurality of sensor pixels and also intersecting with the first direction intersect with respect to one another.

(24)

The imaging device according to one or more of (17) to (23), in which the laminate has, in the interlayer insulating film, a plurality of second junction electrodes coupled electrically to each of the plurality of second through-wiring lines, and each of the plurality of second junction electrodes is disposed at a spacing interval between the two first junction electrodes adjacent to each other in the plurality of first junction electrodes.

(25)

An imaging device, comprising:

a first section including:

a first semiconductor substrate;

at least one first photoelectric conversion region disposed in the first semiconductor substrate;

a first floating diffusion coupled to the at least one first photoelectric conversion region;

a first bonding portion;

a first wiring electrically connected between the first floating diffusion and the first bonding portion;

at least one second photoelectric conversion region disposed in the first semiconductor substrate;

a second floating diffusion coupled to the at least one second photoelectric conversion region;

a second bonding portion;

a second wiring electrically connected between the second floating diffusion and the second bonding portion;

a first region coupled to a node that receives a reference voltage; and a third wiring coupled to the first region and that extends in a same direction as the first and second wirings at a location that is between the first wiring and the second wiring; and a second section bonded to the first section via the first and second bonding portions and including readout circuitry coupled to the first bonding portion and the second bonding portion.

(26)

The imaging device of (25), wherein the first section further comprises:

a first transfer transistor to transfer charge from the first photoelectric conversion region to the first floating diffusion; and a second transfer transistor to transfer charge from the second photoelectric conversion region to the second floating diffusion.

(27)

The imaging device of one or more of (25) to (26), wherein the readout circuitry includes:

a first reset transistor, a first amplification transistor, and a first selection transistor electrically connected to the first bonding portion; and a second reset transistor, a second amplification transistor, and a second selection transistor electrically connected to the second bonding portion.

(28)

The imaging device of one or more of (25) to (27), wherein the readout circuitry includes:

a first reset transistor and a first negative feedback circuit electrically connected to the first bonding portion; and a second reset transistor and a second negative feedback circuit electrically connected to the second bonding portion.

(29)

The imaging device of one or more of (25) to (28), wherein the first and second negative feedback circuits each include an operational amplifier and a feedback capacitance.

(30)

The imaging device of one or more of (25) to (29), wherein the first section further comprises:

at least one insulating layer on the first semiconductor substrate, wherein the at least one insulating layer includes the first, second, and third wirings.

(31)

The imaging device of one or more of (25) to (30), wherein the at least one insulating layer includes a first insulating layer and a second insulating layer, the second insulating layer being closer to the second section than the first insulating layer and having a lower dielectric constant than the first insulating layer.

(32)

The imaging device of one or more of (25) to (31), wherein the first section further comprises:

a third bonding portion, wherein the third wiring electrically connects the first region to the third bonding portion, and wherein the first section and the second section are bonded via the first, second, and third bonding portions.

(33)

The imaging device of one or more of (25) to (32), wherein the at least one insulating layer includes a third insulating layer on the second insulating layer and having a lower dielectric constant than the first insulating layer.

(34)

The imaging device of one or more of (25) to (33), wherein the second section further comprises:

a third bonding portion bonded to the first bonding portion; and a fourth bonding portion bonded to the second bonding portion.

(35)

The imaging device of one or more of (25) to (34), wherein the second section further comprises:

a fourth wiring that electrically connects the third bonding portion to the readout circuitry; and a fifth wiring that electrically connects the fourth bonding portion to the readout circuitry.

(36)

The imaging device of one or more of (25) to (35), wherein the second section further comprises:

a sixth wiring electrically connected to the readout circuitry located between the fourth wiring and the fifth wiring.

(37)

The imaging device of one or more of (25) to (37), wherein the sixth wiring is aligned with the first wiring.

(38)

The imaging device of one or more of (25) to (37), wherein the first section further comprises a fifth bonding portion and wherein the second section further comprises a sixth bonding portion bonded to the fifth bonding portion.

(39)

The imaging device of one or more of (25) to (38), wherein the second section further comprises:

a second semiconductor substrate that includes the readout circuitry; and an insulating layer on the second semiconductor substrate that includes the fourth, fifth, and sixth wirings.

(40)

The imaging device one or more of (25) to (39), further comprising:

a third section bonded to the second section and including processing circuitry that processes signals from the readout circuitry.

(41)

An imaging device, comprising:

a first section including:

a first semiconductor substrate including:

at least one first photoelectric conversion region;

a first floating diffusion coupled to the at least one first photoelectric conversion region; and a first transfer transistor to transfer charges from the at least one first photoelectric conversion region to the first floating diffusion;

at least one second photoelectric conversion region disposed in the first semiconductor substrate;

a second floating diffusion coupled to the at least one second photoelectric conversion region; and a second transfer transistor to transfer charges from the at least one second photoelectric conversion region to the second floating diffusion; and a well region; and at least one first insulating layer on the first semiconductor substrate and including:

a first bonding portion;

a first wiring electrically connected between the first floating diffusion and the first bonding portion;

a second bonding portion;

a second wiring electrically connected between the second floating diffusion and the second bonding portion; and a third wiring electrically connected to the well region and that provides a shield between the first wiring and the second wiring.

(42)

The imaging device of one or more of (41), further comprising:

a second section bonded to the first section via the first and second bonding portions and including readout circuitry coupled to the first bonding portion and the second bonding portion; and a third section bonded to the second section and including processing circuitry that processes signals from the readout circuitry.

(43)

An imaging device, comprising:
a first section including:
first photoelectric conversion regions that share a first floating diffusion;
a first bonding portion;
first wiring that electrically connects the first floating diffusion to the first bonding portion;
second photoelectric conversion regions that share a second floating diffusion;
a second bonding portion;
second wiring that electrically connects the second floating diffusion to the second bonding portion;
a well region of a desired conductivity type;
third wiring electrically connected to the well region and that provides a signal shield between the first wiring and the second wiring; and
a second section bonded to the first section via the first and second bonding portions and including readout circuitry electrically connected to the first bonding portion and the second bonding portion.

(44)

The imaging device of (43), further comprising:
a third section bonded to the second section and including processing circuitry to process signals from the readout circuitry.

According to an imaging device of an embodiment of the present disclosure, a plurality of sensor pixels are disposed on a first substrate; a plurality readout circuits are disposed on a second substrate; and a control circuit is disposed on a third substrate, which allows for achievement of further enhancement of a dynamic range and further noise reduction.

It should be understood by those skilled in the art that various modifications, combinations, sub-combinations and alterations may occur depending on design requirements and other factors insofar as they are within the scope of the appended claims or the equivalents thereof.

REFERENCE SIGNS LIST 1, 2 imaging device
3 imaging system
10 first substrate
11 semiconductor substrate
12 sensor pixel
13 pixel region
14 drive wiring line
15 FD through-wiring line
16 VSS through-wiring line
17 FD junction electrode
18, 18a VSS junction electrode
18b wiring line
19 insulating film
20 second substrate
21 semiconductor substrate
22 readout circuit
23 readout circuit region
24 FD junction electrode
25, 25a VSS junction electrode
25b wiring line
26 FD through-wiring line
27 VSS through-wiring line
28 insulating layer
30 third substrate
31 semiconductor substrate
32 logic circuit
32a vertical drive circuit
32b column signal processing circuit
32c horizontal drive circuit
32d system control circuit
33 booster circuit
34 negative booster circuit
36 insulating layer
40 color filter layer
41 p-well region
42 through-wiring line
43 through-wiring line
44 through-wiring line
45, 46 through-wiring line
45a, 46a, 47a opening
45b, 46b, 47b connection pad
45c, 46c, 47c through-wiring line
45d, 46d, 47d connection pad
50 light-receiving lens
51, 61 gate insulating film
52, 62 gate electrode
53, 63 sidewall layer
54, 64 silicon oxide film
55, 65 silicon nitride film
56, 66 insulating film
57, 58, 67, 68 through-wiring line
69 impurity diffused region
71, 72, 73, 74 insulating layer
80 second substrate
AMP amplifying transistor
Cf feedback capacitor
Cfd capacitance
FD floating diffusion
PD, PD1, PD2, PD3, PD4, PD5, PD6, PD7, PD8 photodiode
RST reset transistor
SEL selecting transistor
TR, TR1, TR2, TR3, TR4, TR5, TR6, TR7, TR8 transfer transistor
VDD power supply potential
VSS, VSS1, VSS2 reference potential
VSL vertical signal line

What is claimed is:
1. An imaging device, comprising:
a first section including:
a first semiconductor substrate;
a first photoelectric conversion region disposed in the first semiconductor substrate;
a first floating diffusion coupled to the first photoelectric conversion region;
a first bonding portion;
a first wiring electrically connected between the first floating diffusion and the first bonding portion;
a second photoelectric conversion region disposed in the first semiconductor substrate;
a second floating diffusion coupled to the second photoelectric conversion region;
a second bonding portion;
a second wiring electrically connected between the second floating diffusion and the second bonding portion;
a third wiring electrically connected to a fixed voltage and that extends in a same direction as the first and second wirings at a location that is between the first wiring and the second wiring;
a first transfer transistor that transfers charge from the first photoelectric conversion region to the first floating diffusion; and one or more drive wiring lines electrically connected to the first transfer transistor;
a second section bonded to the first section via the first and second bonding portions and including readout circuitry coupled to the first bonding portion and the second bonding portion;
a third section bonded to the second section and including processing circuitry that processes signals from the readout circuitry; and
a wiring structure that electrically connects the processing circuitry to the one or more drive wiring lines,
wherein, in a cross-sectional view, the one or more drive wiring lines are within a pixel region that includes a plurality of pixels,
wherein the wiring structure comprises:
a first electrode in the first section bonded to a second electrode in the second section; and
wiring that electrically connects the second electrode to the processing circuitry,
wherein the first electrode and the second electrode are outside the pixel region, and
wherein the readout circuitry comprises a first amplification transistor and a first selection transistor.

2. The imaging device of claim 1, wherein the first section further comprises:
a first insulating layer, wherein the first wiring, the second wiring, and the third wiring are disposed in the first insulating layer, wherein the location is between the first wiring and the second wiring within the first insulating layer, wherein the third wiring penetrates a surface of the first insulating layer that is closest to the first semiconductor substrate; and
a second transfer transistor to transfer charge from the second photoelectric conversion region to the second floating diffusion.

3. The imaging device of claim 2, wherein the readout circuitry includes:
a first reset transistor, wherein the first reset transistor, the first amplification transistor, and the first selection transistor are electrically connected to the first bonding portion; and
a second reset transistor, a second amplification transistor, and a second selection transistor electrically connected to the second bonding portion.

4. The imaging device of claim 2, wherein the readout circuitry includes:
a first reset transistor and a first negative feedback circuit electrically connected to the first bonding portion; and
a second reset transistor and a second negative feedback circuit electrically connected to the second bonding portion.

5. The imaging device of claim 4, wherein the first and second negative feedback circuits each include an operational amplifier and a feedback capacitance.

6. The imaging device of claim 1, wherein the third wiring comprises a first opening in which the first wiring is disposed, and wherein the third wiring comprises a second opening in which the second wiring is disposed, and wherein the first section further comprises:
at least one insulating layer on the first semiconductor substrate, wherein the at least one insulating layer includes the first, second, and third wirings.

7. The imaging device of claim 6, wherein the at least one insulating layer includes a first insulating layer and a second insulating layer, the second insulating layer being closer to the second section than the first insulating layer and having a lower dielectric constant than the first insulating layer.

8. The imaging device of claim 7, wherein the first section further comprises:
a third bonding portion, wherein the third wiring electrically connects to the third bonding portion, and wherein the first section and the second section are bonded via the first, second, and third bonding portions.

9. The imaging device of claim 7, wherein the at least one insulating layer includes a third insulating layer on the second insulating layer and having a lower dielectric constant than the first insulating layer.

10. The imaging device of claim 1,
wherein the first section further comprises:
a first insulating layer, wherein the first wiring, the second wiring, and the third wiring are disposed in the first insulating layer, wherein the location is between the first wiring and the second wiring within the first insulating layer, and wherein the third wiring is coupled to a surface of the first insulating layer that is closest to the first semiconductor substrate, and
wherein the second section further comprises:
a third bonding portion bonded to the first bonding portion; and
a fourth bonding portion bonded to the second bonding portion.

11. The imaging device of claim 10, wherein the second section further comprises:
a fourth wiring that electrically connects the third bonding portion to the readout circuitry; and
a fifth wiring that electrically connects the fourth bonding portion to the readout circuitry.

12. The imaging device of claim 11, wherein the second section further comprises:
a sixth wiring electrically connected to the readout circuitry located between the fourth wiring and the fifth wiring.

13. The imaging device of claim 12, wherein the sixth wiring is aligned with the first wiring.

14. The imaging device of claim 12, wherein the first section further comprises a fifth bonding portion, and wherein the second section further comprises a sixth bonding portion bonded to the fifth bonding portion.

15. The imaging device of claim 12, wherein the second section further comprises:
a second semiconductor substrate that includes the readout circuitry; and
an insulating layer on the second semiconductor substrate that includes the fourth, fifth, and sixth wirings.

16. The imaging device of claim 1, wherein the processing circuitry is configured to provide a drive signal to the first transfer transistor, and wherein the drive signal travels from the processing circuitry through the second electrode, the first electrode, and the one or more drive wiring lines, in that order, to the first transfer transistor.

17. An imaging device, comprising:
a first section including:
a first semiconductor substrate including:
at least one first photoelectric conversion region;
a first floating diffusion coupled to the at least one first photoelectric conversion region;
a first transfer transistor to transfer charges from the at least one first photoelectric conversion region to the first floating diffusion;
at least one second photoelectric conversion region disposed in the first semiconductor substrate;
a second floating diffusion coupled to the at least one second photoelectric conversion region; and a second transfer transistor to transfer charges from the at least one second photoelectric conversion region to the second floating diffusion; and at least one insulating layer on the first semiconductor substrate and including:
  a drive wiring line electrically connected to the first transfer transistor;
  a first bonding portion;
  a first wiring electrically connected between the first floating diffusion and the first bonding portion;
  a second bonding portion;
  a second wiring electrically connected between the second floating diffusion and the second bonding portion; and
  a third wiring electrically connected to the a fixed voltage and that provides a shield between the first wiring and the second wiring, wherein the third wiring comprises a first opening in which the first wiring is disposed, and wherein the third wiring comprises a second opening in which the second wiring is disposed;

a second section bonded to the first section via the first and second bonding portions and including readout circuitry coupled to the first bonding portion and the second bonding portion;

a third section bonded to the second section and including processing circuitry that processes signals from the readout circuitry; and a wiring structure that electrically connects the processing circuitry to the drive wiring line, wherein, in a cross-sectional view, the drive wiring line is within a pixel region that includes a plurality of pixels, wherein the wiring structure comprises:
  a first electrode in the first section bonded to a second electrode in the second section; and
  wiring that electrically connects the second electrode to the processing circuitry, wherein the first electrode and the second electrode are outside the pixel region, and wherein the readout circuitry comprises a first amplification transistor and a first selection transistor.

18. The imaging device of claim 17, further comprising:
one or more power supply lines that electrically connect a booster circuit within the third section to the readout circuitry, wherein, in the cross-sectional view, the one or more power supply lines are outside the pixel region.

19. An imaging device, comprising:
a first section including:
  a first semiconductor substrate;
  first photoelectric conversion regions disposed in the first semiconductor substrate and that share a first floating diffusion;
  first transfer transistors to transfer charges from the first photoelectric conversion regions to the first floating diffusion;
  one or more drive wiring lines electrically connected to the first transfer transistors;
  a first bonding portion;
  a first insulating layer;
  a first wiring disposed in the first insulating layer and that electrically connects the first floating diffusion to the first bonding portion;
  second photoelectric conversion regions disposed in the first semiconductor substrate and that share a second floating diffusion;
  a second bonding portion;
  a second wiring disposed in the first insulating layer and that electrically connects the second floating diffusion to the second bonding portion;
  a third wiring disposed in the first insulating layer and electrically connected to a semiconductor region and that provides a signal shield between the first wiring and the second wiring, wherein the third wiring penetrates a surface of the first insulating layer that is closest to the first semiconductor substrate, wherein the third wiring comprises a first opening in which the first wiring is disposed, and wherein the third wiring comprises a second opening in which the second wiring is disposed;

a second section bonded to the first section via the first and second bonding portions and including readout circuitry electrically connected to the first bonding portion and the second bonding portion;

a third section bonded to the second section and including processing circuitry that processes signals from the readout circuitry; and a wiring structure that electrically connects the processing circuitry to the one or more drive wiring lines, wherein, in a cross-sectional view, the one or more drive wiring lines are within a pixel region that includes a plurality of pixels, wherein the wiring structure comprises:
  a first electrode in the first section bonded to a second electrode in the second section; and
  wiring that electrically connects the second electrode to the processing circuitry, wherein the first electrode and the second electrode are outside the pixel region, and wherein the readout circuitry comprises a first amplification transistor and a first selection transistor.

20. The imaging device of claim 19, further comprising:
one or more power supply lines that electrically connect a booster circuit within the third section to the readout circuitry, wherein, in the cross-sectional view, the one or more power supply lines are outside the pixel region.

* * * * *